US012560872B2

(12) United States Patent
Alikhan et al.

(10) Patent No.: US 12,560,872 B2
(45) Date of Patent: Feb. 24, 2026

(54) VACUUM SHEET BOND FIXTURING AND FLEXIBLE BURL APPLICATIONS FOR SUBSTRATE TABLES

(71) Applicants: ASML Holding N.V., Veldhoven (NL); ASML Netherlands B.V., Veldhoven (NL)

(72) Inventors: Abdullah Alikhan, Stratford, CT (US); Tammo Uitterdijk, Wilton, CT (US); Johannes Bernardus Charles Engelen, 'S-Hertogenbosch (NL); Daniel Kamieniecki, Stamford, CT (US); Bastiaan Lambertus Wilhelmus Marinus Van De Ven, Rosmalen (NL); Thomas Poiesz, Veldhoven (NL); Leon Martin Levasier, Hedel (NL); Jim Vincent Overkamp, Eindhoven (NL); Johannes Adrianus Cornelis Maria Pijnenburg, Moergestel (NL); Koos Van Berkel, Waalre (NL); Gregory James Diguido, Norwalk, CT (US); Anthony C. Socci, Jr., Greenwich, CT (US); Iliya Sigal, Stamford, CT (US); Bram Antonius Gerardus Lomans, Eindhoven (NL); Michel Ben Isel Habets, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 193 days.

(21) Appl. No.: 18/269,387

(22) PCT Filed: Dec. 2, 2021

(86) PCT No.: PCT/EP2021/084066
§ 371 (c)(1),
(2) Date: Jun. 23, 2023

(87) PCT Pub. No.: WO2022/144144
PCT Pub. Date: Jul. 7, 2022

(65) Prior Publication Data
US 2023/0384694 A1 Nov. 30, 2023
Related U.S. Application Data

(60) Provisional application No. 63/272,504, filed on Oct. 27, 2021, provisional application No. 63/131,527, filed on Dec. 29, 2020.

(51) Int. Cl.
| | |
|---|---|
| *G03F 7/00* | (2006.01) |
| *H01L 21/683* | (2006.01) |
| *H01L 21/687* | (2006.01) |

(52) U.S. Cl.
CPC ...... *G03F 7/70708* (2013.01); *G03F 7/70783* (2013.01); *G03F 7/7095* (2013.01); *H01L 21/6838* (2013.01); *H01L 21/68757* (2013.01)

(58) Field of Classification Search
CPC ............ G03F 7/70708; G03F 7/70783; G03F 7/7095; G03F 7/707; G03F 7/70;
(Continued)

(56) References Cited

U.S. PATENT DOCUMENTS

| | | | |
|---|---|---|---|
| 4,185,814 A | 1/1980 | Buchmann et al. | |
| 6,474,987 B1 | 11/2002 | Nakai et al. | |

(Continued)

FOREIGN PATENT DOCUMENTS

| | | | |
|---|---|---|---|
| EP | 3 882 700 A1 | 9/2021 | |
| EP | 3 923 077 A1 | 12/2021 | |

(Continued)

OTHER PUBLICATIONS

English translation of WO2012/147343, published Nov. 1, 2012. (Year: 2012).*

(Continued)

*Primary Examiner* — Christina A Riddle
(74) *Attorney, Agent, or Firm* — Finnegan, Henderson, Farabow, Garrett & Dunner LLP

(57) ABSTRACT
Systems, apparatuses, and methods are provided for manufacturing a substrate table. An example method can include
(Continued)

1300 forming a vacuum sheet including a plurality of vacuum connections and a plurality of recesses configured to receive a plurality of burls disposed on a core body for supporting an object such as a wafer. Optionally, at least one burl can be surrounded, partially or wholly, by a trench. The example method can further include using the vacuum sheet to mount the core body to an electrostatic sheet including a plurality of apertures configured to receive the plurality of burls. Optionally, the example method can include using the vacuum sheet to mount the core body to the electrostatic sheet such that the plurality of recesses of the vacuum sheet line up with the plurality of burls of the core body and the plurality of apertures of the electrostatic sheet.

17 Claims, 31 Drawing Sheets

(58) Field of Classification Search
  CPC ... G03F 7/70691–7075; G03F 7/70758; G03F 7/70775; G03F 7/70791; G03F 7/708; G03F 7/70808; G03F 7/70816; G03F 7/70825; G03F 7/70841; G03F 7/7085; G03F 7/70858; G03F 7/70866; G03F 7/709; G03F 7/70908; G03F 7/70916; H01L 21/6838; H01L 21/68757; H01L 21/67225; H01L 21/6833; H01L 21/6875; H01L 21/683; H01L 21/68714–68792
  USPC .............................. 355/18, 30, 52–55, 67–77
  See application file for complete search history.

(56) References Cited

U.S. PATENT DOCUMENTS

| | | | |
|---|---|---|---|
| 6,952,253 B2 | 10/2005 | Lof et al. | |
| 7,511,799 B2 | 3/2009 | Tel et al. | |
| 2002/0130276 A1* | 9/2002 | Sogard | G03F 7/70708 |
| | | | 257/E23.099 |
| 2004/0178362 A1* | 9/2004 | Gilissen | G03F 7/707 |
| | | | 250/492.1 |
| 2004/0188321 A1 | 9/2004 | Natsuhara et al. | |
| 2009/0079525 A1* | 3/2009 | Sijben | G03F 7/70708 |
| | | | 335/75 |
| 2010/0096262 A1 | 4/2010 | Aruga et al. | |
| 2011/0183108 A1 | 7/2011 | Tachibana | |
| 2012/0162621 A1 | 6/2012 | Beerens et al. | |
| 2013/0094005 A1* | 4/2013 | Kunnen | G03F 7/70716 |
| | | | 355/30 |
| 2013/0321788 A1 | 12/2013 | Ockwell et al. | |
| 2014/0218711 A1 | 8/2014 | Brinkhof et al. | |
| 2015/0029485 A1* | 1/2015 | Lafarre | G03F 7/70416 |
| | | | 355/72 |
| 2015/0190930 A1 | 7/2015 | Regan et al. | |
| 2016/0111318 A1* | 4/2016 | Ichinose | G03F 7/70733 |
| | | | 269/21 |
| 2017/0260624 A1 | 9/2017 | Sufan et al. | |
| 2018/0148835 A1 | 5/2018 | Erickson et al. | |
| 2018/0188660 A1* | 7/2018 | Poiesz | G03F 7/707 |
| 2018/0286738 A1* | 10/2018 | Valefi | H01L 21/6838 |
| 2020/0326635 A1* | 10/2020 | Soethoudt | G03F 7/70783 |

FOREIGN PATENT DOCUMENTS

| | | | | |
|---|---|---|---|---|
| TW | I264080 B | 10/2006 | | |
| TW | 201627777 A | 8/2016 | | |
| WO | WO-2012147343 A1 * | 11/2012 | ......... | B32B 38/1833 |
| WO | WO 2020/177971 A1 | 9/2020 | | |
| WO | WO-2021185552 A1 * | 9/2021 | ......... | G03F 7/70708 |

OTHER PUBLICATIONS

International Search Report and Written Opinion of the International Searching Authority directed to International Patent Application No. PCT/EP2021/084066, mailed May 31, 2022; 16 pages.
International Preliminary Report on Patentability directed to International Patent Application No. PCT/EP2021/084066, issued Jul. 4, 2023; 11 pages.
"Vacuum Sheet Bond Fixturing and Flexible Burl Application for Substrate Tables," Research Disclosure No. 683044, Feb. 5, 2021; 58 pages.

* cited by examiner

500

600

900

920

940

960

970

980

990

1000

1020

1100

1500

1520

1540

VACUUM SHEET BOND FIXTURING AND FLEXIBLE BURL APPLICATIONS FOR SUBSTRATE TABLES

CROSS-REFERENCE TO RELATED APPLICATIONS

This application claims priority of (1) U.S. Provisional Patent Application No. 63/131,527, which was filed on Dec. 29, 2020, and (2) U.S. Provisional Patent Application No. 63/272,504, which was filed on Oct. 27, 2021, both of which are incorporated herein in their entirety by reference.

FIELD

The present disclosure relates to substrate tables and methods for forming burls and nanostructures on substrate table surfaces.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is interchangeably referred to as a mask or a reticle, can be used to generate a circuit pattern to be formed on an individual layer of the IC being formed. This pattern can be transferred onto a target portion (e.g., including part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Traditional lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel (e.g., opposite) to this scanning direction. It is also possible to transfer the pattern from the patterning device to the substrate by imprinting the pattern onto the substrate.

As semiconductor manufacturing processes continue to advance, the dimensions of circuit elements have continually been reduced while the amount of functional elements, such as transistors, per device has been steadily increasing over decades, following a trend commonly referred to as Moore's law. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are: 365 nm (i-line), 248 nm, and 193 nm in deep ultra violet (DUV) radiation systems; and 13.5 nm in extreme ultraviolet (EUV) radiation systems. EUV radiation, for example, electromagnetic radiation having wavelengths of around 50 nanometers (nm) or less (also sometimes referred to as soft x-rays), and including light at a wavelength of about 13.5 nm, can be used in or with a lithographic apparatus to produce extremely small features in or on substrates, for example, silicon wafers. A lithographic apparatus which uses EUV radiation having a wavelength within a range of 4 nm to 20 nm, for example 6.7 nm or 13.5 nm, can be used to form smaller features on a substrate than a lithographic apparatus which uses, for example, radiation with a wavelength of 193 nm.

It can be desirable to dictate and maintain tribological properties (e.g., friction, hardness, wear) on a surface of a substrate table. In some instances, a wafer clamp may be disposed on the surface of the substrate table. The wafer clamp may be, for example, a vacuum clamp for use in DUV radiation systems or an electrostatic clamp for use in EUV radiation systems. A substrate table, or a wafer clamp attached thereto, has a surface level tolerance that can be difficult to meet because of precision requirements of lithographic and metrology processes. Wafers (e.g., semiconductor substrates), being relatively thin (e.g., <1.0 millimeter (mm) thick) compared to a width of its surface area (e.g., >100.0 mm wide), are particularly sensitive to unevenness of the substrate table. Additionally, ultra-smooth surfaces in contact may become stuck together, which may present a problem when a substrate must be disengaged from the substrate table. To reduce the smoothness of the surface that interfaces with the wafer, the surface of the substrate table or wafer clamp may include burls formed by patterning and etching of a substrate. However, existing technology cannot control bond locations to sub-micrometer (micron) tolerances over a 300 mm diameter substrate area and beyond.

SUMMARY

The present disclosure describes various aspects of systems, apparatuses, and methods for manufacturing and using a substrate table having burls configured to support a substrate in either a DUV or EUV radiation system. For example, the substrate table can include a core body and an electrostatic sheet for use in an EUV radiation system.

In some aspects, the present disclosure provides for using a vacuum sheet bond fixturing to mount the core body to the electrostatic sheet. In some aspects, the vacuum sheet can include mounting structures such as "donuts" around each hole of an electrostatic sheet. For example, the vacuum sheet can be configured such that it can hold an electrostatic sheet with holes, and the vacuum sheet can contain holes that align with the e-sheet holes. The vacuum sheet can be further configured to accept a core body with burls on it that fit in the holes, such that the depth of the holes define the distance between the electrostatic sheet top and the burl tops.

In some aspects, the present disclosure further provides for "flexburl" application on substrate tables (e.g., a DUV wafer table that includes a core body having flexburls; an EUV wafer table that includes an electrostatic sheet mounted to a core body having flexburls) with lateral stiffness and vacuum build-up tuning. In some aspects, the term "flexburl" used herein refers to a burl surrounded, partially or wholly, by a trench.

In some aspects, the present disclosure describes a substrate table. The substrate table can include a core body including a plurality of burls for supporting an object, such as a wafer (e.g., the burls can be disposed on the top side of the core body facing the wafer). The core body can further include a plurality of trenches. Each burl of the plurality of burls can be surrounded by a respective trench of the plurality of trenches. In some aspects, at least a portion of the core body can be formed of siliconized silicon carbide (SiSiC) or silicon carbide (SiC). In some aspects, at least a portion of the plurality of burls can be formed of SiSiC, SiC, diamond-like carbon (DLC), aluminum nitride (AlN), silicon nitride (SiN), or chromium nitride (CrN).

In some aspects, at least one burl of the plurality of burls can have a stiffness of less than about 10 meganewtons per meter ($10^7$ Nm$^{-1}$; or 1e7 N/m in scientific notation). In some aspects, the plurality of burls can include at least one burl having a first taper angle towards the top of the burl and a second taper angle towards the bottom of the burl. In some aspects, the plurality of burls can include (i) a first burl surrounded by a first trench and disposed in a first region (e.g., a central region) of the core body and (ii) a second burl surrounded by a second trench and disposed in a second region (e.g., a peripheral region) of the core body. In such aspects, a depth of the first trench can be less than a depth of the second trench, a length of the second burl can be greater than a length of the first burl, a stiffness of the second burl can be less than a stiffness of the first burl, or a combination thereof.

In some aspects, the core body can be further configured to connect (e.g., using a vacuum sheet) to an electrostatic sheet that includes a plurality of apertures configured to receive the plurality of burls of the core body such that the plurality of burls of the core body line up with the plurality of apertures of the electrostatic sheet.

In some aspects, the present disclosure describes an apparatus. The apparatus can include a vacuum sheet including a plurality of vacuum connections and a plurality of recesses configured to receive a plurality of burls of a core body. In some aspects, at least a portion of the vacuum sheet can be formed of fused silica. In some aspects, a stiffness of the vacuum sheet can be less than a stiffness of the core body.

In some aspects, the vacuum sheet can be configured to mount the core body to an electrostatic sheet comprising a plurality of apertures configured to receive the plurality of burls of the core body. In some aspects, the plurality of recesses of the vacuum sheet can be configured to line up with the plurality of apertures of the electrostatic sheet. In some aspects, a stiffness of the vacuum sheet can be less than a stiffness of the core body and, optionally, greater than a stiffness of the electrostatic sheet.

In some aspects, the vacuum sheet can be configured to vacuum clamp the electrostatic sheet to the vacuum sheet in response to an application of a vacuum to the plurality of vacuum connections of the vacuum sheet. In some aspects, the vacuum sheet can include an electrode layer having one or more electrodes. In some aspects, the vacuum sheet can be configured to electrostatically clamp the electrostatic sheet to the vacuum sheet in response to an application of one or more voltages to one or more of the one or more electrodes in the electrode layer of the vacuum sheet. In some aspects, at least a portion of the electrode layer of the vacuum sheet can be formed of copper (Cu) or CrN.

In some aspects, the vacuum sheet can include a coating on at least a portion of the side of the vacuum sheet facing the electrostatic sheet (e.g., at least in the areas where the vacuum sheet and the electrostatic sheet touch when the electrostatic sheet is clamped to the vacuum sheet). In some aspects, the characteristics of this coating can be configured such that strong or substantially permanent adhesion, for example optical contacting, between the vacuum sheet and electrostatic sheet is substantially prevented. In some aspects, at least a portion of this coating can be formed of CrN or DLC.

In some aspects, the present disclosure describes a method for manufacturing an apparatus. The method can include forming a vacuum sheet including a plurality of vacuum connections and a plurality of recesses configured to receive the plurality of burls of a core body. In some aspects, the method can further include mounting, using the vacuum sheet, an electrostatic sheet to the core body such that the plurality of recesses of the vacuum sheet line up with a plurality of apertures of the electrostatic sheet and the plurality of burls of the core body.

In some aspects, the method can further include forming a core body including a plurality of burls for supporting an object, such as a wafer (e.g., the burls can be disposed on the top side of the core body facing the wafer). In some aspects, the method can include forming a trench around at least one burl of the plurality of burls. In some aspects, the method can further include forming an electrostatic sheet including a plurality of apertures configured to receive the plurality of burls.

Further features, as well as the structure and operation of various aspects, are described in detail below with reference to the accompanying drawings. It is noted that the disclosure is not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the aspects of this disclosure and to enable a person skilled in the relevant art(s) to make and use the aspects of this disclosure.

5

Figure 12:

FIG. 12 is an example method for manufacturing an apparatus according to some aspects of the present disclosure or portion(s) thereof.

Figure 13A:
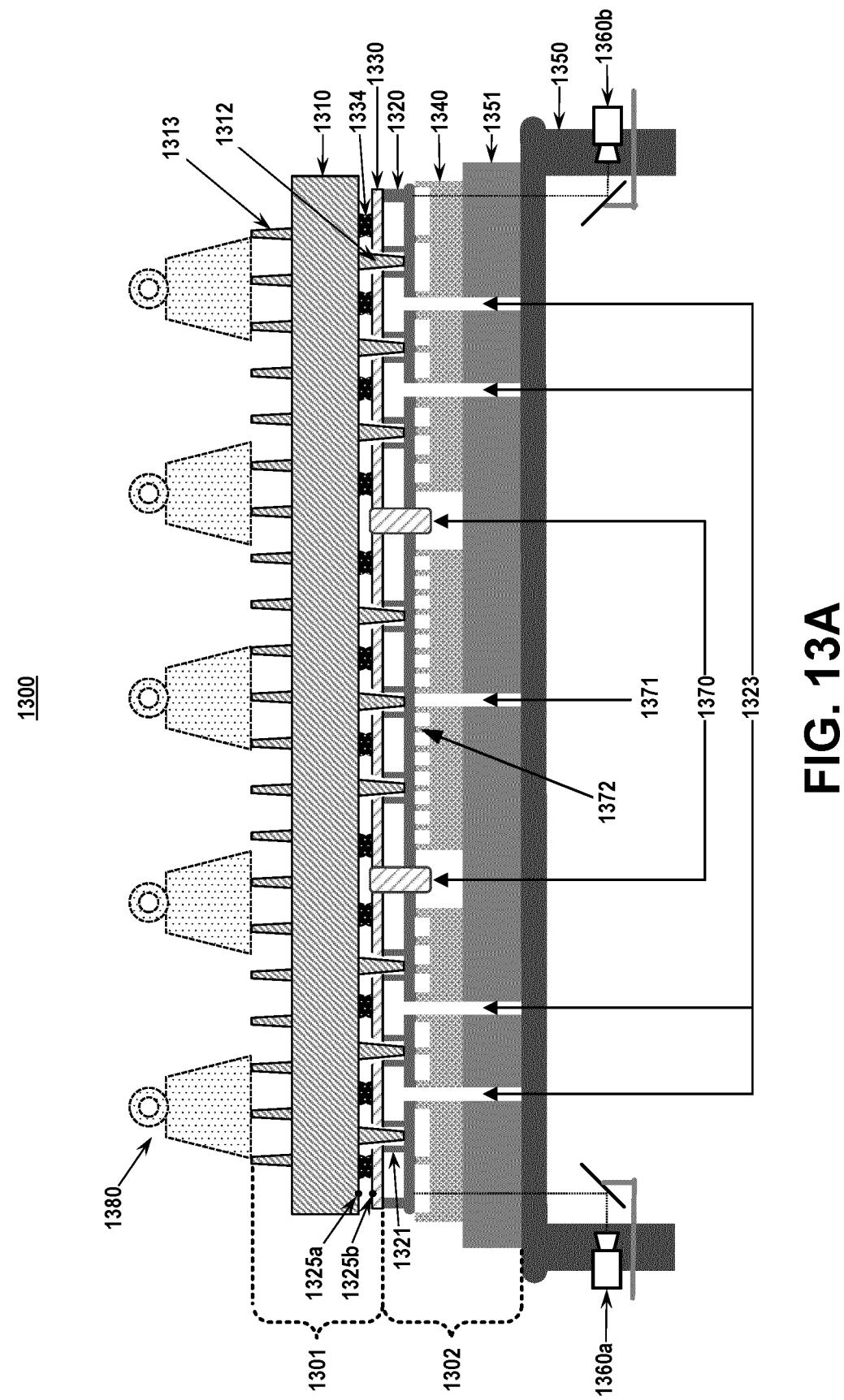
Figure 13B:
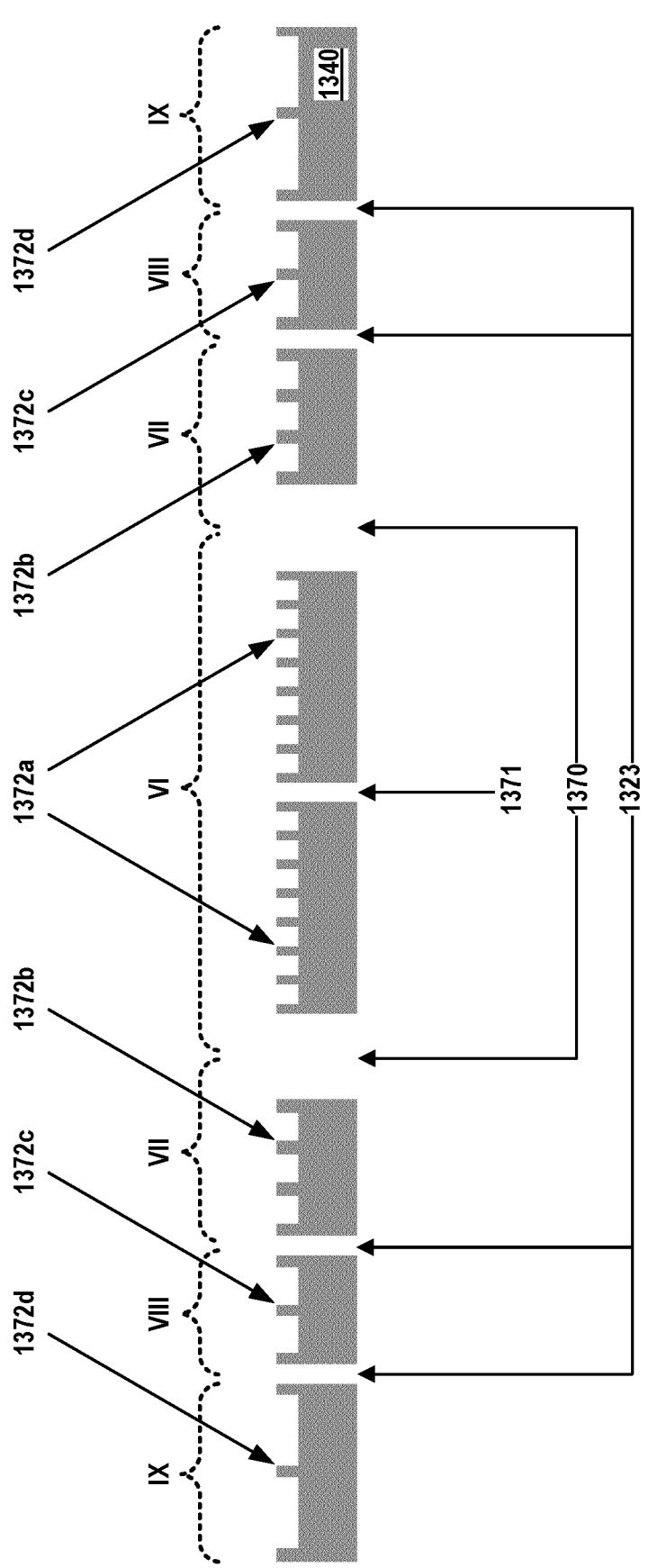

FIGS. 13A and 13B are cross-sectional illustrations of regions of an example EUV substrate table manufacturing system according to some aspects of the present disclosure.

Figure 14:
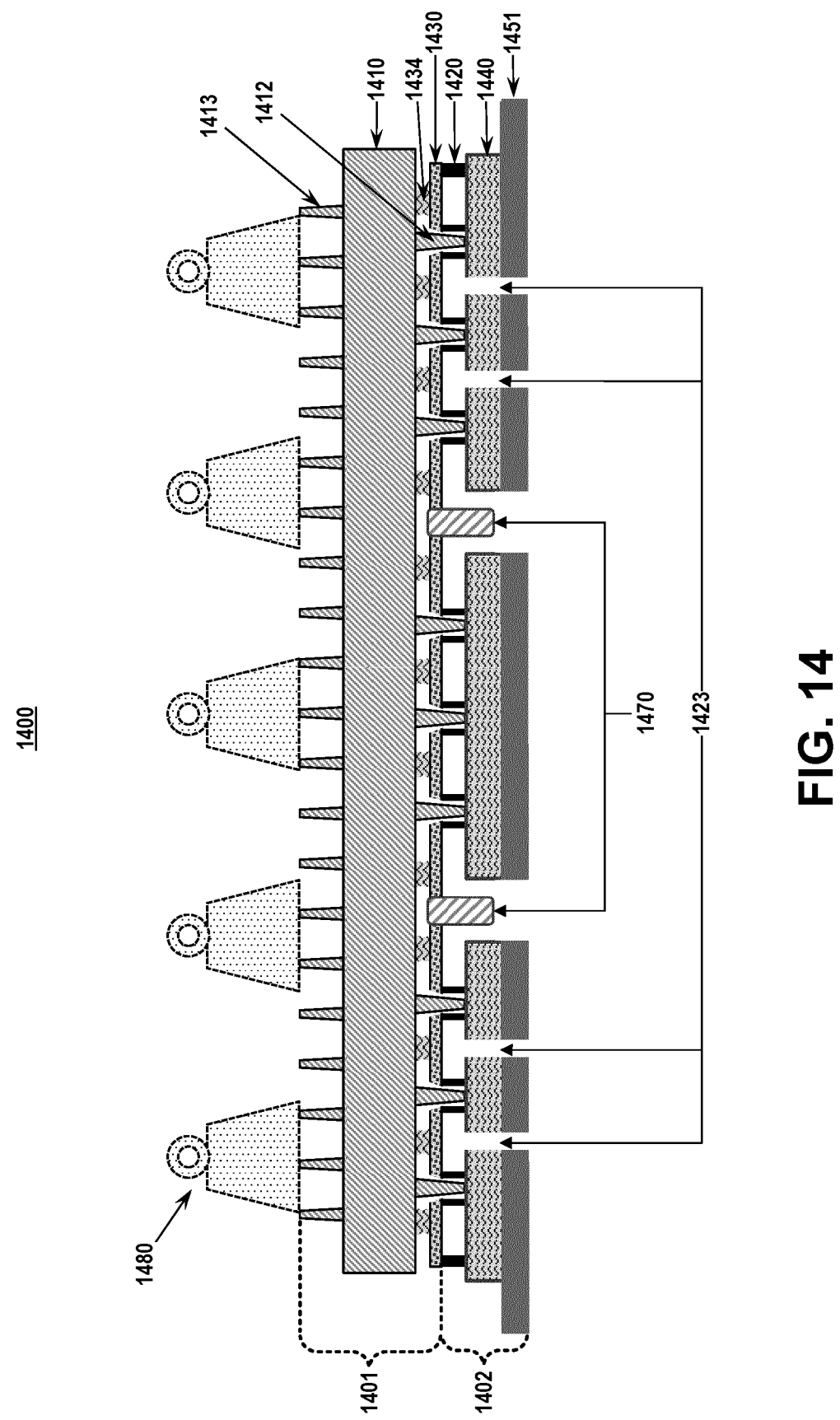

FIG. 14 is a cross-sectional illustration of a region of another example EUV substrate table manufacturing system according to some aspects of the present disclosure.

Figure 15A:
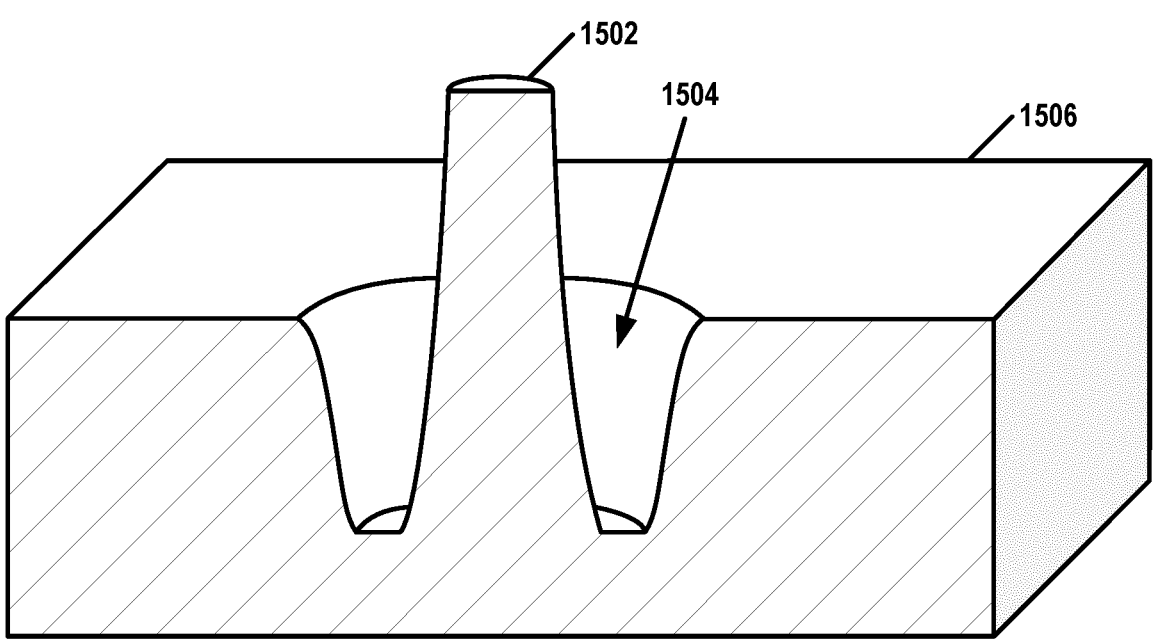
Figure 15B:
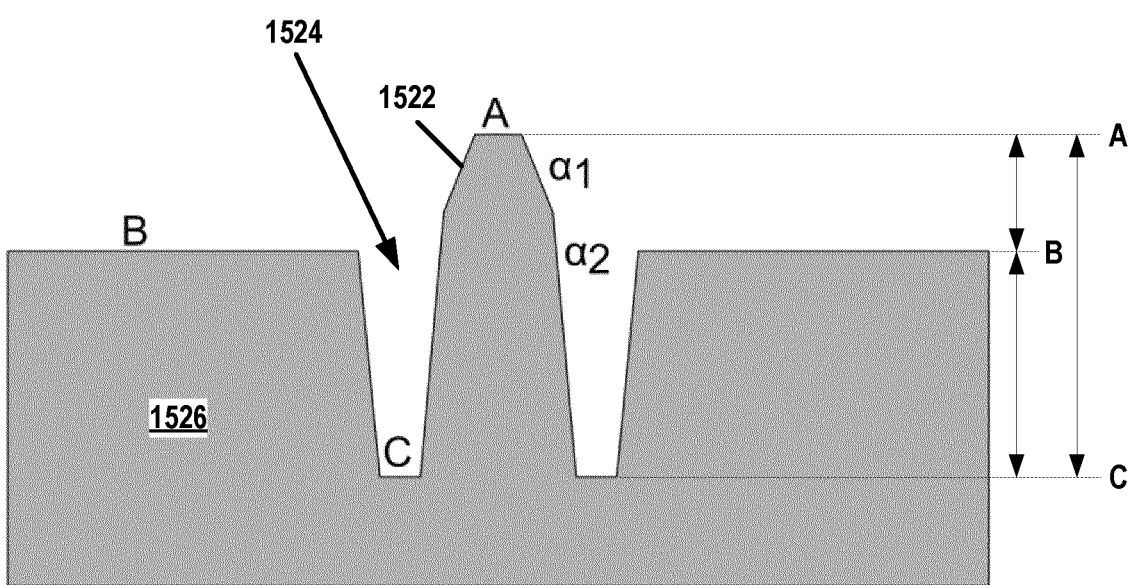
Figure 15C:
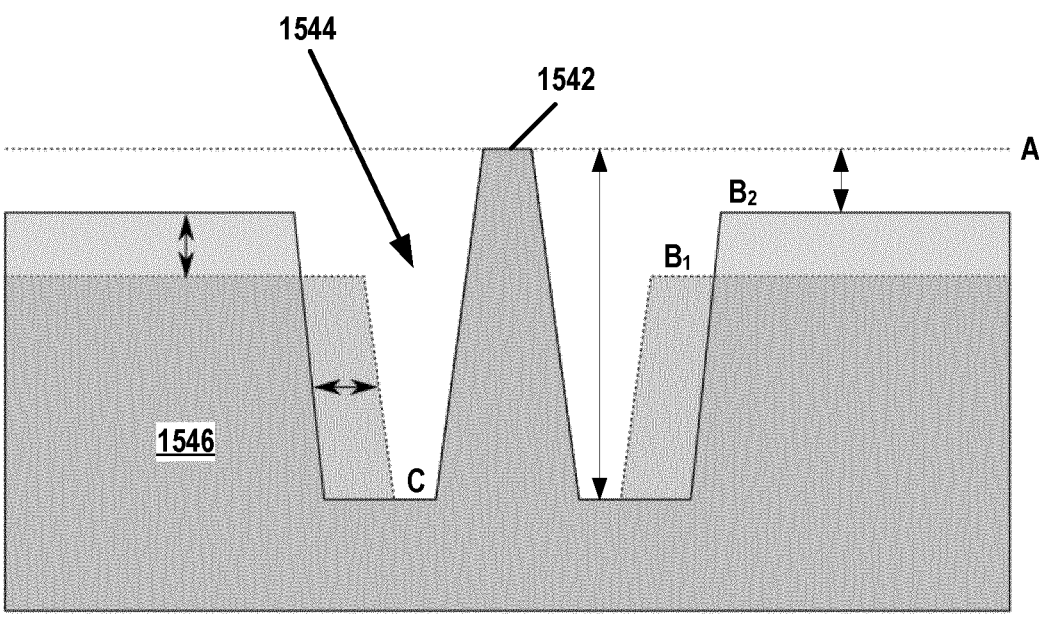

FIGS. 15A, 15B, and 15C are cross-sectional illustrations of example compliant layer surfaces including example burls surrounded by example trenches according to some aspects of the present disclosure.

Figure 16A:
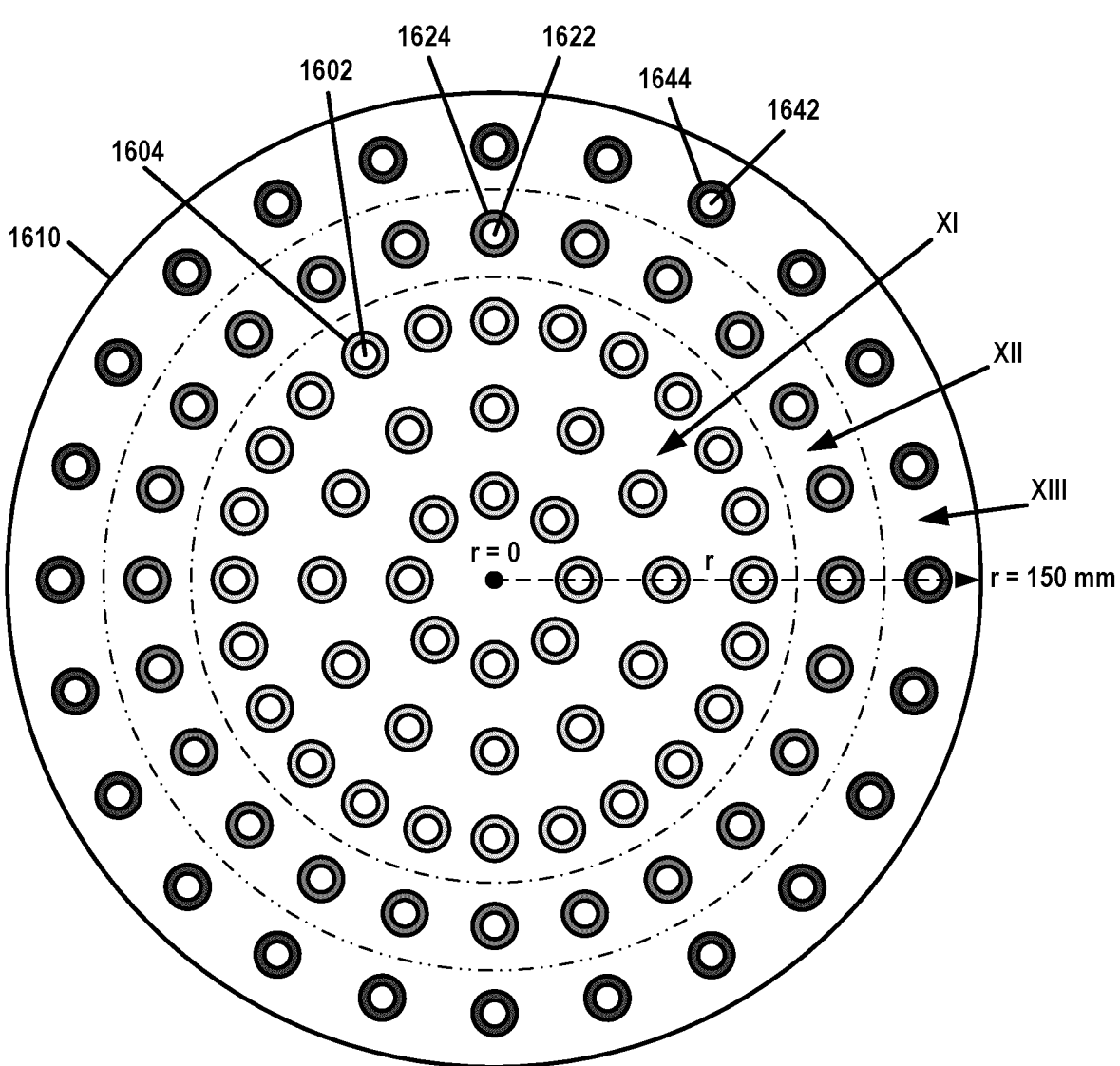
Figure 16B:
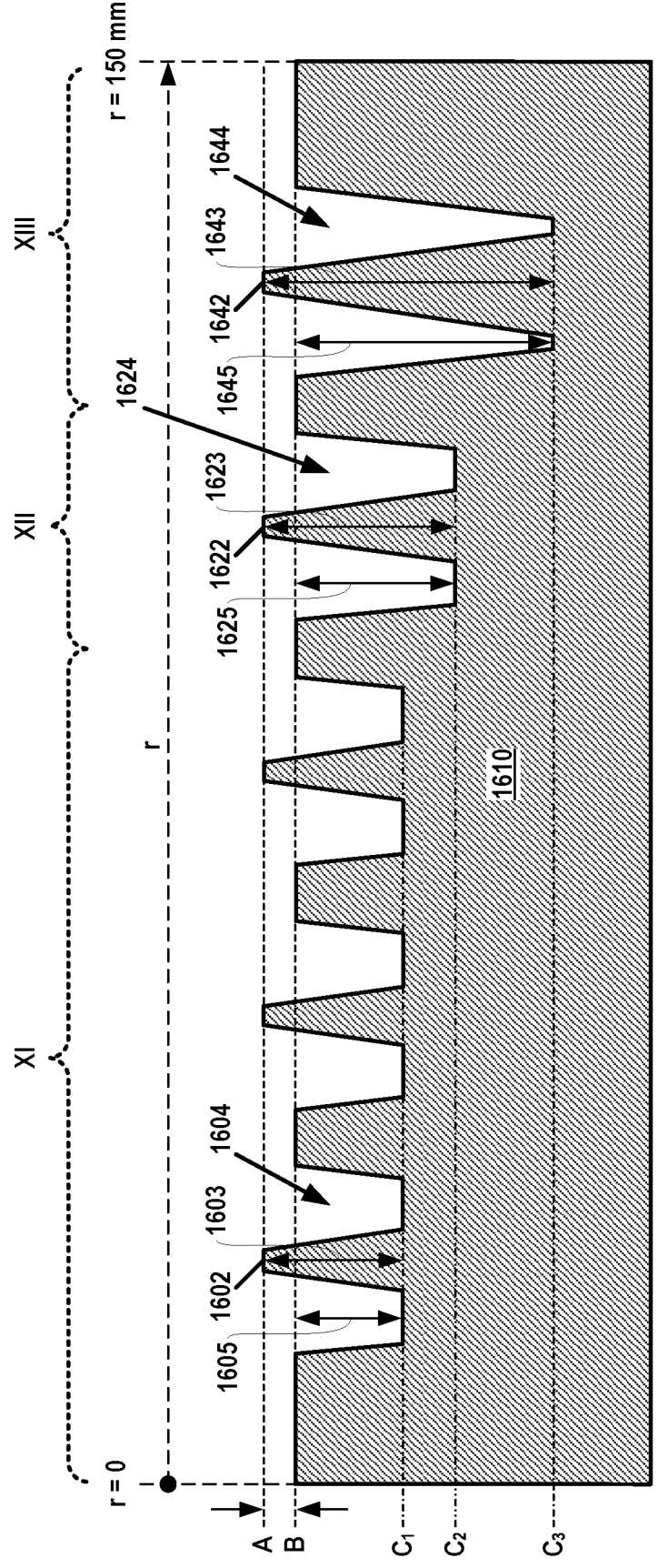

FIGS. 16A and 16B are planar and cross-sectional illustrations of an example compliant layer surface including example burls surrounded by example trenches according to some aspects of the present disclosure.

Figure 17:
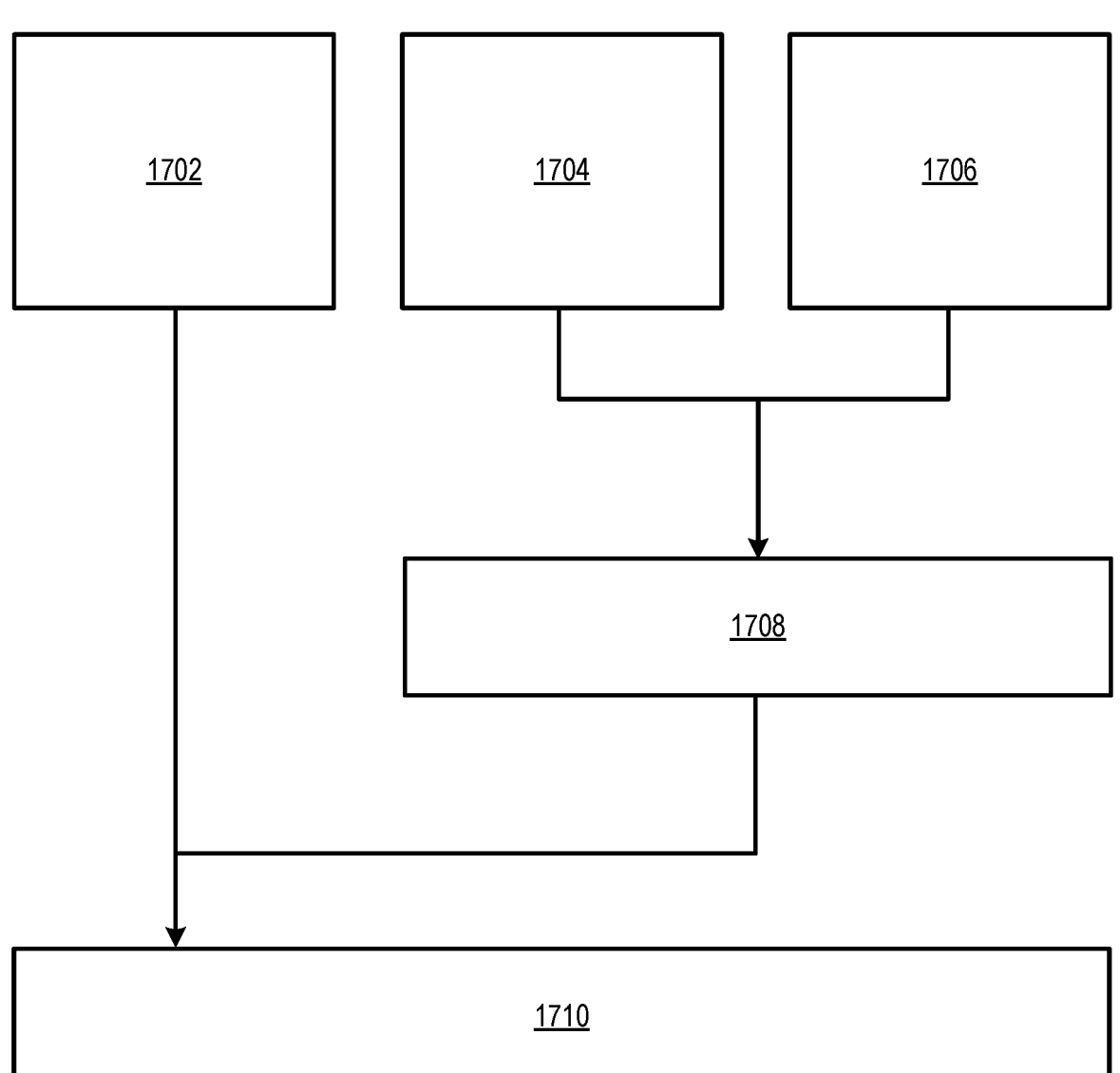

FIG. 17 is an example method for manufacturing an apparatus according to some aspects of the present disclosure or portion(s) thereof.

The features and advantages of the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) merely describe the present disclosure. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Overview

In one example, the substrate to be exposed by a lithography apparatus can be supported by a substrate holder (e.g., a structure that directly supports a substrate) which in turn can be supported by a substrate table (e.g., a structure such as a mirror block, stage, or table configured to support the substrate holder and provide the upper surface surrounding the substrate holder). In one example, the substrate holder can be a flat rigid disc corresponding in size and shape to the substrate, although it may have a different size or shape. In some aspects, the substrate holder can have an array of projections, referred to as burls or pimples, projecting from at least one surface (e.g., top surface, bottom surface, or both). The substrate holder may have an array of projections on two opposite sides. In this case, when the substrate holder is placed on the substrate table, the main body of the substrate holder can be held a small distance above the substrate table while the ends of the burls on one side of the substrate holder lie on the surface of the substrate table. Similarly, when the substrate rests on the top of the burls on the opposite side of the substrate holder, the substrate can be spaced apart from the main body of the substrate holder. One example purpose of this arrangement can be to help prevent a particle (e.g., a contaminating particle such as a dust particle), which might be present on either the substrate table or substrate holder, from distorting the substrate holder or substrate. Since the total surface area of the burls can be only a small fraction of the total area of the substrate or substrate holder, it can be probable that a particle may lie between the burls and, as a result, its presence can have substantially no effect. In some aspects, the substrate holder and substrate can be accommodated within a recess in the substrate table so that the upper surface of the substrate can be substantially coplanar with the upper surface of the substrate table.

Due to the high accelerations experienced by the substrate in a high-throughput lithographic apparatus, allowing the substrate simply to rest on the burls of the substrate holder may not be sufficient; rather, the substrate can be clamped in place. Two methods of clamping the substrate in place include, but are not limited to, vacuum clamping and electrostatic clamping. In vacuum clamping, the space between the substrate holder and substrate and optionally between the substrate table and substrate holder are partially evacuated so that the substrate is held in place by the higher pressure of gas or liquid above it. Vacuum clamping however may not be used where the beam path and/or the environment near the substrate or substrate holder is kept at a low or very low pressure, such as is the case in EUV radiation lithography. In this case, it may not be possible to develop a sufficiently large pressure difference across the substrate (or substrate holder) to clamp it. Electrostatic clamping may therefore be used. In electrostatic clamping, a potential difference is established between the substrate, or an electrode plated on its lower surface, and an electrode provided on, or in, the substrate table and/or substrate holder. The two electrodes behave as a large capacitor and substantial clamping force can be generated with a reasonable potential difference. An electrostatic arrangement can be such that a single pair of electrodes, one on the substrate table and one on the substrate, clamps together the complete stack of substrate table, substrate holder and substrate. In one arrangement, one or more electrodes may be provided on, or in, the substrate holder so that the substrate holder is clamped to the substrate table and the substrate is separately clamped to the substrate holder.

However, there is a need for DUV and EUV substrate holders that can include one or more vacuum or electrostatic clamps, respectively, for clamping the substrate holder (e.g., a patterning device (e.g., mask) holder or a wafer holder) to a substrate table (e.g., a patterning device table or a wafer table), a substrate (e.g., a mask or wafer) to the substrate holder, or both.

Vacuum Sheet Bond Fixturing

In one example, an example bond fixturing for an example substrate table can control epoxy bond locations to submicron tolerances over an area greater than or equal to 300 mm only when the components are substantially nanometers flat. As a result, the non-nanometers-flatness of the components and their stiffness can be an obstacle that, in some instances, cannot be overcome and ultimately determines the lower limit of tolerance of the location of the two bonded parts. Further, geometrically complex components can be extremely difficult to make flat and, in some cases, nanometer flatness may not be achievable. In other words, there is a need for a technique and design for bonding components together to a tolerance tighter than their shape flatness.

In contrast, some aspects of the present disclosure can provide a vacuum sheet fixture configured to utilize vacuum to conform to the non-flatness of another, stiffer component (e.g., a core body). Other aspects of the present disclosure can provide a vacuum sheet fixture configured to utilize vacuum to hold a more flexible component (e.g., an electrostatic sheet) in a quasi-flexible state, enabling that component to conform to the non-flatness of the stiffer component. In some aspects, the desired gap can be prefabricated into the disclosed vacuum sheet fixture. In some aspects, the vacuum sheet fixture can have specific offsets built into it to align the components during bonding. The tolerance achievable in bonding can be dependent on the vacuum sheet fixture fabrication tolerances. Accordingly, in some aspects, the achievement of tighter and tighter tolerances becomes a matter of time and effort. The vacuum sheet fixture can use a flexibility that is not as stiff as the stiffer component and, optionally, stiffer than the more flexible component. Additionally or alternatively, use of deformable tools where the load is applied can achieve the desired tolerance. For example, a compliant or deformable layer (e.g., polydimethylsiloxane (PDMS) or a soft, low-durometer polymer, such as durometer 20A silicone) can be added to the vacuum sheet fixturing and used to fine tune the gap by varying the clamping weight.

In some aspects, the present disclosure provides for manufacturing a substrate table that includes a vacuum sheet fixturing. In some aspects, the present disclosure provides for forming a core body (e.g., a SiSiC or SiC core body) including a plurality of burls for supporting an object. For example, the burls can be disposed on the top side of the core body facing the object, which can be a wafer or any other suitable object. In some aspects, such as where at least one burl is a flexburl, the present disclosure provides for forming a trench around at least one burl of the plurality of burls. In some aspects, the present disclosure provides for forming a vacuum sheet including a plurality of vacuum connections and a plurality of recesses configured to receive the plurality of burls. In some aspects, the present disclosure provides for mounting the vacuum sheet to the core body such that the plurality of recesses of the vacuum sheet line up with the plurality of burls of the core body. In some aspects, such as where the substrate table is to be used in an EUV radiation system, the present disclosure provides for forming an electrostatic sheet including a plurality of apertures (e.g., holes) configured to receive the plurality of burls. In some aspects, the present disclosure provides for mounting the vacuum sheet to the electrostatic sheet and the core body such that the plurality of recesses of the vacuum sheet line up with the plurality of apertures of the electrostatic sheet and the plurality of burls of the core body.

There are many exemplary aspects to the systems, apparatuses, methods, and computer program products disclosed herein. For example, aspects of the present disclosure provide for techniques to achieve submicron bonding tolerances. As a result of the techniques described in the present disclosure, bond location can be controlled to quarter micron tolerances over a 300 mm area and greater.

Flexburls for Use in DUV Radiation Systems

In one example, during exposure in a DUV radiation system, substrates can be held by a substrate table. The substrate can rest on burls protruding from the substrate table's surfaces. In one example, the burls can include about 30,000 burls, where each burl is between about 100 microns and about 200 microns tall and has a top diameter between about 100 microns and about 500 microns. A vacuum can be created in the volume between the burls, such that the substrate is forced towards the substrate table by the pressure difference above and below the substrate.

The loading of a substrate onto a substrate table can be a dynamic process with complex interactions between the substrate and the burls combined with a time-dependent air pressure between the substrate and the substrate table due to the locally-varying distance (e.g., volume change) between the substrate and the substrate table. The wafer can deform in plane (e.g., in the horizontal direction) during the loading process, which can result in "wafer load grid" (WLG) after loading. As used herein, WLG refers to the remaining in-plane deformation or stress which depends on the initial shape of the substrate (e.g., 200 micron umbrella warp, 200 micron bow warp) and the interactions with the burls during and after the loading (e.g., friction and stiffness). WLG can lead to overlay errors because at least a portion of WLG may not be reproducible and thus may not be fully correctable; the spatial frequency may be too high to be measured by a limited amount of marks per substrate, and the scanner may not have enough correction capability.

In one example, DUV systems can have WLG issues where the magnitude and spatial frequency of WLG fingerprints are difficult to correct for, or when experiencing WLG drift. In some situations, WLG can be dependent on the total burl stiffness. The total burl stiffness can be a series of stiffnesses: substrate shear plus substrate/burl contact stiffness plus burl geometry. For some substrate table burl geometries, the contact stiffness can be less than the other stiffnesses and thereby can dominate the total burl stiffness. Further, the total burl stiffness can be sensitive to variations on the contact stiffness (e.g., due to different wafer backsides, burl contamination, different burl roughness wear).

Some aspects of the present disclosure can provide for reducing WLG impact by disposing flexburls on substrate table surfaces, such as on core bodies (e.g., SiSiC or SiC core bodies) configured to connect to the vacuum sheet bond fixturings disclosed herein. For example, in DUV radiation systems, some aspects of the present disclosure can provide for tuning the SiSiC-plane height (or SiC-plane height) in between the flexburls to get better vacuum pressure build-up over time.

As used herein, the term "flexburl" refers to a burl surrounded, partially or wholly, by a trench. In some aspects, a flexburl can include a hard burl (e.g., a DLC burl with or without an electrically conductive burl top) surrounded, partially or wholly, by a trench. In some aspects, the depth of trench surrounding the flexburl can be modified (e.g., increased, decreased, widened, narrowed) to achieve a desired lateral burl stiffness and vacuum volume. In some aspects, the flexburls disclosed herein can include any combination of the features, structures, and techniques described in European Patent Application No. 20163373, filed Mar. 16, 2020, and titled "Object Holder, Tool and Method of Manufacturing an Object Holder," and European Patent Application No. 20179524, filed Jun. 11, 2020, and titled "Object Holder, Electrostatic Sheet and Method for Making an Electrostatic Sheet," both of which are incorporated by reference herein in their entireties.

In some aspects, the present disclosure provides a technique for manufacturing flexburls on one or more substrate table surfaces by forming (e.g., using deep reactive-ion etching DRIE), laser ablation, powder blasting, chemical etching, or another suitable technique) a trench around each burl, which lowers the burl lateral stiffness and adds vacuum volume to the volume between the substrate and the substrate table. In some aspects, the present disclosure provides a technique for optimizing burl geometry for better distribution of stress in the burl (e.g. by defining two or more different taper angles). In some aspects, the present disclosure provides a technique for varying trench depth and stiffness per burl across the core body surface (e.g., a gradient from center to edge (e.g., stiff in center, compliant at edge); local per-burl optimization).

In some aspects, the present disclosure provides for manufacturing a substrate table that includes flexburls for use in DUV radiation systems. In some aspects, the present disclosure provides for forming a core body including a plurality of burls for supporting an object, such as a wafer (e.g., the burls can be disposed on the top side of the core body facing the wafer). The core body can further include a plurality of trenches. Each burl of the plurality of burls can be surrounded by a respective trench of the plurality of trenches. In some aspects, such as where the substrate table is to be used in an EUV radiation system, the core body can be configured to connect to an electrostatic sheet that includes a plurality of apertures configured to receive the plurality of burls of the core body such that the plurality of burls of the core body line up with the plurality of apertures of the electrostatic sheet. In some aspects, the core body can be configured to connect to the electrostatic sheet using a vacuum sheet that includes a plurality of recesses configured to receive the plurality of burls of the core body such that the plurality of burls of the core body further line up with the plurality of recesses of the vacuum sheet.

There are many exemplary aspects to the systems, apparatuses, methods, and computer program products disclosed herein. For example, aspects of the present disclosure provide for reduction of lateral burl stiffness. As a result, aspects of the present disclosure provide for: spreading out the in-plane wafer deformations and makes them more correctable, reducing the impact of contact stiffness variations on total stiffness and thereby decreasing sensitivity to burl wear and wafer backside differences, and reducing thermal slip and thereby enabling higher thermal dose, lower coefficient of static friction, or both.

In another example, aspects of the present disclosure provide for optimizing the behavior of vacuum pressure transients during wafer load (e.g., when the distance between the substrate and the substrate table is changing locally), also referred to as "vacuum volume tailoring," by decoupling, or partially decoupling, the distance between the burl tops and the lowered plane height (e.g., the surface on which the burls are disposed) from the total volume between the substrate and the substrate table without changing the general above-surface geometry of the flexburls (e.g., the height, pattern, and contact area of the burl tops). By increasing the volume beneath the substrate table, the time for vacuum to build is increased, resulting in a slower ramp of clamping forces and less WLG. Without flexburls, increases in volume can increase the distance between the burl tops and the lowered plane height, making it harder to clamp warped substrates (e.g., larger initial distance to start forming vacuum). As a result of the techniques described in the present disclosure (e.g., by using flexburls to decouple the volume from the distance between the burl tops and the lowered plane height), the tradeoff between clamping warped substrates and reducing WLG can be balanced more easily.

Before describing such aspects in more detail, however, it is instructive to present an example environment in which aspects of the present disclosure can be implemented.

Example Lithographic Systems

Figure 1A:
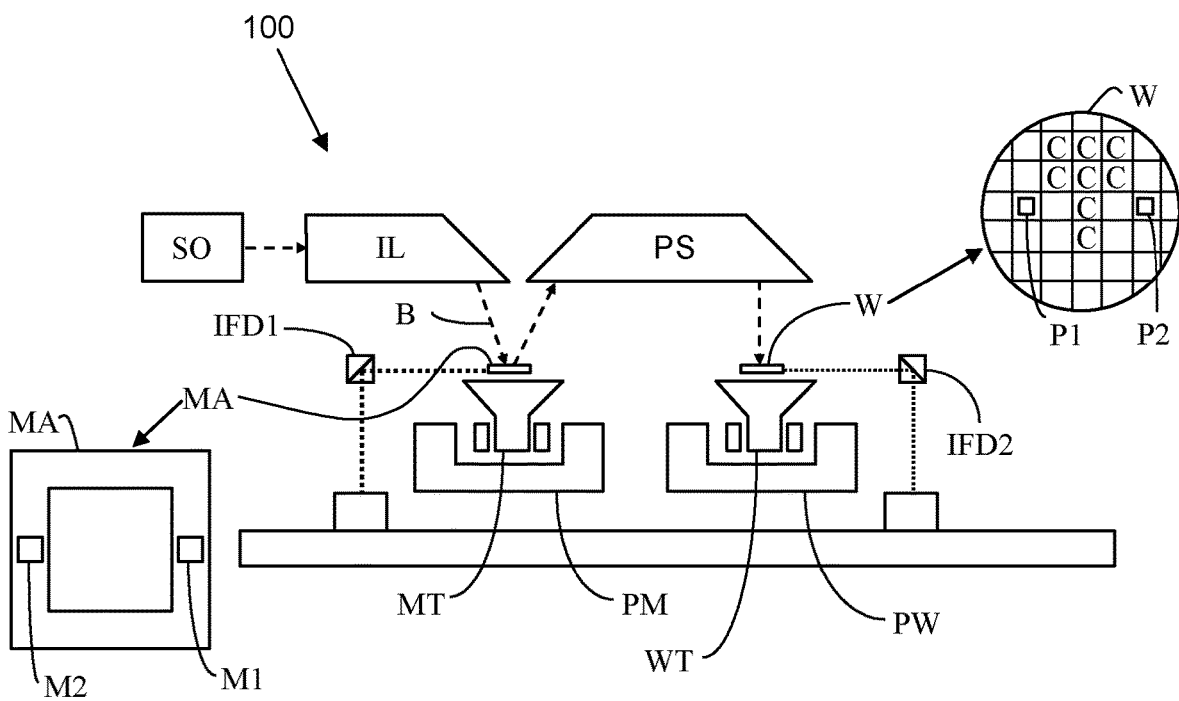
FIG. 1A is a schematic illustration of an example reflective lithographic apparatus according to some aspects of the present disclosure.
Figure 1B:
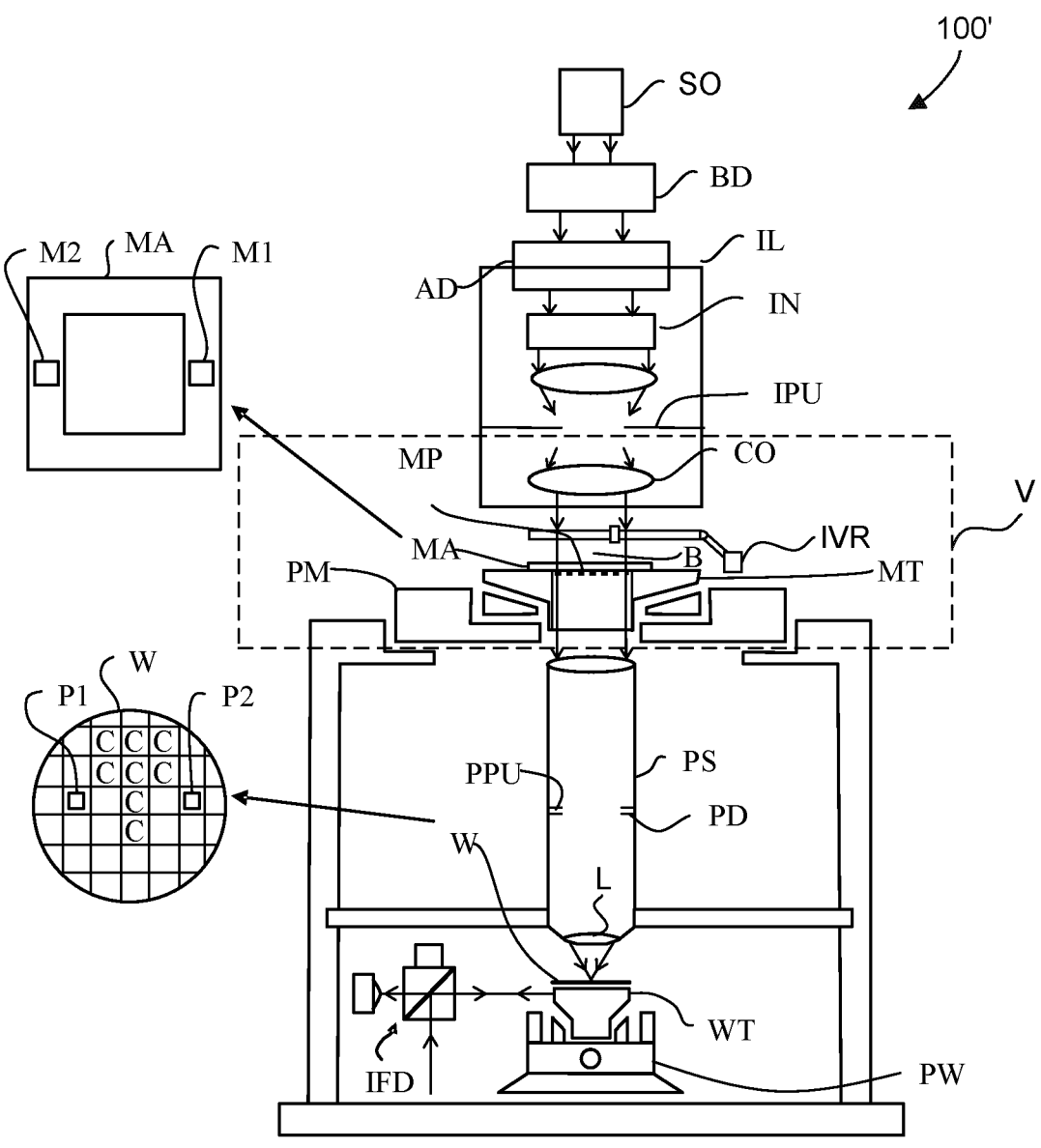
FIG. 1B is a schematic illustration of an example transmissive lithographic apparatus according to some aspects of the present disclosure.

FIGS. 1A and 1B are schematic illustrations of a lithographic apparatus 100 and a lithographic apparatus 100', respectively, in which aspects of the present disclosure can be implemented. As shown in FIGS. 1A and 1B, the lithographic apparatuses 100 and 100' are illustrated from a point of view (e.g., a side view) that is normal to the XZ plane (e.g., the X-axis points to the right, the Z-axis points upward, and the Y-axis points into the page away from the viewer), while the patterning device MA and the substrate W are presented from additional points of view (e.g., a top view) that are normal to the XY plane (e.g., the X-axis points to the right, the Y-axis points upward, and the Z-axis points out of the page toward the viewer).

In some aspects, the lithographic apparatus 100 and/or the lithographic apparatus 100' can include one or more of the following structures: an illumination system IL (e.g., an illuminator) configured to condition a radiation beam B (e.g., a DUV radiation beam or an EUV radiation beam); a support structure MT (e.g., a mask table) configured to support a patterning device MA (e.g., a mask, a reticle, or a dynamic patterning device) and connected to a first positioner PM configured to accurately position the patterning device MA; and, a substrate holder such as a substrate table WT (e.g., a wafer table) configured to hold a substrate W (e.g., a resist-coated wafer) and connected to a second positioner PW configured to accurately position the substrate W. Lithographic apparatuses 100 and 100' also have a projection system PS (e.g., a refractive projection lens system) configured to project a pattern imparted to the radiation beam B by patterning device MA onto a target portion C (e.g., a portion including one or more dies) of the substrate W. In lithographic apparatus 100, the patterning device MA and the projection system PS are reflective. In lithographic apparatus 100', the patterning device MA and the projection system PS are transmissive.

In some aspects, in operation, the illumination system IL can receive a radiation beam from a radiation source SO (e.g., via a beam delivery system BD shown in FIG. 1B). The illumination system IL can include various types of optical structures, such as refractive, reflective, catadioptric, magnetic, electromagnetic, electrostatic, and other types of optical components, or any combination thereof, for directing, shaping, or controlling radiation. In some aspects, the illumination system IL can be configured to condition the radiation beam B to have a desired spatial and angular intensity distribution in its cross-section at a plane of the patterning device MA.

In some aspects, the support structure MT can hold the patterning device MA in a manner that depends on the orientation of the patterning device MA with respect to a reference frame, the design of at least one of the lithographic apparatuses 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

In some aspects, the patterning device MA can be transmissive (as in lithographic apparatus 100' of FIG. 1B) or reflective (as in lithographic apparatus 100 of FIG. 1A). The patterning device MA can include various structures such as reticles, masks, programmable mirror arrays, programmable LCD panels, other suitable structures, or combinations thereof. Masks can include mask types such as binary, alternating phase shift, or attenuated phase shift, as well as various hybrid mask types. In one example, a programmable mirror array can include a matrix arrangement of small mirrors, each of which can be individually tilted so as to reflect an incoming radiation beam in different directions. The tilted mirrors can impart a pattern in the radiation beam B, which is reflected by a matrix of small mirrors.

The term "projection system" PS should be interpreted broadly and can encompass any type of projection system, including refractive, reflective, catadioptric, magnetic, anamorphic, electromagnetic, and electrostatic optical systems, or any combination thereof, as appropriate for the exposure radiation being used, and/or for other factors such as the use of an immersion liquid (e.g., on the substrate W) or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps. In addition, any use herein of the term "projection lens" can be interpreted, in some aspects, as synonymous with the more general term "projection system" PS.

In some aspects, the lithographic apparatus 100 and/or the lithographic apparatus 100' can be of a type having two (e.g., "dual stage") or more substrate tables WT and/or two or more mask tables). In such "multiple stage" machines, the additional substrate tables WT can be used in parallel, or preparatory steps can be carried out on one or more tables while one or more other substrate tables WT are being used for exposure. In one example, steps in preparation of a subsequent exposure of the substrate W can be carried out on the substrate W located on one of the substrate tables WT while another substrate W located on another of the substrate tables WT is being used for exposing a pattern on another substrate W. In some aspects, the additional table may not be a substrate table WT.

In some aspects, in addition to the substrate table WT, the lithographic apparatus 100 and/or the lithographic apparatus 100' can include a measurement stage. The measurement stage can be arranged to hold a sensor. The sensor can be arranged to measure a property of the projection system PS, a property of the radiation beam B, or both. In some aspects, the measurement stage can hold multiple sensors. In some aspects, the measurement stage can move beneath the projection system PS when the substrate table WT is away from the projection system PS.

In some aspects, the lithographic apparatus 100 and/or the lithographic apparatus 100' can also be of a type wherein at least a portion of the substrate can be covered by a liquid having a relatively high refractive index, e.g., water, so as to fill a space between the projection system PS and the substrate W. An immersion liquid can also be applied to other spaces in the lithographic apparatus, for example, between the patterning device MA and the projection system PS Immersion techniques provide for increasing the numerical aperture of projection systems. The term "immersion" as used herein does not mean that a structure, such as a substrate, must be submerged in liquid, but rather only means that liquid is located between the projection system and the substrate during exposure. Various immersion techniques are described in U.S. Pat. No. 6,952,253, issued Oct. 4, 2005, and titled "LITHOGRAPHIC APPARATUS AND DEVICE MANUFACTURING METHOD," which is incorporated by reference herein in its entirety.

Referring to FIGS. 1A and 1B, the illumination system IL receives a radiation beam B from a radiation source SO. The radiation source SO and the lithographic apparatus 100 or 100' can be separate physical entities, for example, when the radiation source SO is an excimer laser. In such cases, the radiation source SO is not considered to form part of the lithographic apparatus 100 or 100', and the radiation beam B passes from the radiation source SO to the illumination system IL with the aid of a beam delivery system BD (e.g., shown in FIG. 1B) including, for example, suitable directing mirrors and/or a beam expander. In other cases, the radiation source SO can be an integral part of the lithographic apparatus 100 or 100', for example, when the radiation source SO is a mercury lamp. The radiation source SO and the illuminator IL, together with the beam delivery system BD, if required, can be referred to as a radiation system.

In some aspects, the illumination system IL can include an adjuster AD for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illumination system IL can include various other components, such as an integrator IN and a radiation collector CO (e.g., a condenser or collector optic). In some aspects, the illumination system IL can be used to condition the radiation beam B to have a desired uniformity and intensity distribution in its cross section.

Referring to FIG. 1A, in operation, the radiation beam B can be incident on the patterning device MA (e.g., a mask, reticle, programmable mirror array, programmable LCD panel, any other suitable structure or combination thereof), which can be held on the support structure MT (e.g., a mask table), and can be patterned by the pattern (e.g., design layout) present on the patterning device MA. In lithographic apparatus 100, the radiation beam B can be reflected from the patterning device MA. Having traversed (e.g., after being reflected from) the patterning device MA, the radiation beam B can pass through the projection system PS, which can focus the radiation beam B onto a target portion C of the substrate W or onto a sensor arranged at a stage.

In some aspects, with the aid of the second positioner PW and position sensor IFD2 (e.g., an interferometric device, linear encoder, or capacitive sensor), the substrate table WT can be moved accurately, e.g., so as to position different target portions C in the path of the radiation beam B. Similarly, the first positioner PM and another position sensor IFD1 (e.g., an interferometric device, linear encoder, or capacitive sensor) can be used to accurately position the patterning device MA with respect to the path of the radiation beam B.

In some aspects, patterning device MA and substrate W can be aligned using mask alignment marks M1 and M2 and substrate alignment marks P1 and P2. Although FIGS. 1A and 1B illustrate the substrate alignment marks P1 and P2 as occupying dedicated target portions, the substrate alignment marks P1 and P2 may be located in spaces between target portions. Substrate alignment marks P1 and P2 are known as scribe-lane alignment marks when they are located between the target portions C. Substrate alignment marks P1 and P2 can also be arranged in the target portion C area as in-die marks. These in-die marks can also be used as metrology marks, for example, for overlay measurements.

In some aspects, for purposes of illustration and not limitation, one or more of the figures herein can utilize a Cartesian coordinate system. The Cartesian coordinate system includes three axes: an X-axis; a Y-axis; and a Z-axis. Each of the three axes is orthogonal to the other two axes (e.g., the X-axis is orthogonal to the Y-axis and the Z-axis, the Y-axis is orthogonal to the X-axis and the Z-axis, the Z-axis is orthogonal to the X-axis and the Y-axis). A rotation around the X-axis is referred to as an Rx-rotation. A rotation around the Y-axis is referred to as an Ry-rotation. A rotation around about the Z-axis is referred to as an Rz-rotation. In some aspects, the X-axis and the Y-axis define a horizontal plane, whereas the Z-axis is in a vertical direction. In some aspects, the orientation of the Cartesian coordinate system may be different, for example, such that the Z-axis has a component along the horizontal plane. In some aspects, another coordinate system, such as a cylindrical coordinate system, can be used.

Referring to FIG. 1B, the radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. In some aspects, the projection system PS can have a pupil conjugate to an illumination system pupil. In some aspects, portions of radiation can emanate from the intensity distribution at the illumination system pupil and traverse a mask pattern without being affected by diffraction at the mask pattern MP and create an image of the intensity distribution at the illumination system pupil.

The projection system PS projects an image MP' of the mask pattern MP, where image MP' is formed by diffracted beams produced from the mask pattern MP by radiation from the intensity distribution, onto a resist layer coated on the substrate W. For example, the mask pattern MP can include an array of lines and spaces. A diffraction of radiation at the array and different from zeroth-order diffraction generates diverted diffracted beams with a change of direction in a direction perpendicular to the lines. Reflected light (e.g., zeroth-order diffracted beams) traverses the pattern without any change in propagation direction. The zeroth-order diffracted beams traverse an upper lens or upper lens group of the projection system PS, upstream of the pupil conjugate of the projection system PS, to reach the pupil conjugate. The portion of the intensity distribution in the plane of the pupil conjugate and associated with the zeroth-order diffracted beams is an image of the intensity distribution in the illumination system pupil of the illumination system IL. In some aspects, an aperture device can be disposed at, or substantially at, a plane that includes the pupil conjugate of the projection system PS.

The projection system PS is arranged to capture, by means of a lens or lens group, not only the zeroth-order diffracted beams, but also first-order or first- and higher-order diffracted beams (not shown). In some aspects, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the substrate W to create an image of the mask pattern MP at highest possible resolution and process window (e.g., usable depth of focus in combination with tolerable exposure dose deviations). In some aspects, astigmatism aberration can be reduced by providing radiation poles (not shown) in opposite quadrants of an illumination system pupil. Further, in some aspects, astigmatism aberration can be reduced by blocking the zeroth-order beams in the pupil conjugate of the projection system PS associated with radiation poles in opposite quadrants. This is described in more detail in U.S. Pat. No. 7,511,799, issued Mar. 31, 2009, and titled "LITHOGRAPHIC PROJECTION APPARATUS AND A DEVICE MANUFACTURING METHOD," which is incorporated by reference herein in its entirety.

In some aspects, with the aid of the second positioner PW and a position measurement system PMS (e.g., including a position sensor such as an interferometric device, linear encoder, or capacitive sensor), the substrate table WT can be moved accurately, e.g., so as to position different target portions C in the path of the radiation beam B at a focused and aligned position. Similarly, the first positioner PM and another position sensor (e.g., an interferometric device, linear encoder, or capacitive sensor) (not shown in FIG. 1B) can be used to accurately position the patterning device MA with respect to the path of the radiation beam B (e.g., after mechanical retrieval from a mask library or during a scan). Patterning device MA and substrate W can be aligned using mask alignment marks M1 and M2 and substrate alignment marks P1 and P2.

In general, movement of the support structure MT can be realized with the aid of a long-stroke positioner (coarse positioning) and a short-stroke positioner (fine positioning), which form part of the first positioner PM. Similarly, movement of the substrate table WT can be realized using a long-stroke positioner and a short-stroke positioner, which form part of the second positioner PW. In the case of a stepper (as opposed to a scanner), the support structure MT can be connected to a short-stroke actuator only or can be fixed. Patterning device MA and substrate W can be aligned using mask alignment marks M1 and M2, and substrate alignment marks P1 and P2. Although the substrate alignment marks (as illustrated) occupy dedicated target portions, they can be located in spaces between target portions (e.g., scribe-lane alignment marks). Similarly, in situations in which more than one die is provided on the patterning device MA, the mask alignment marks M1 and M2 can be located between the dies.

Support structure MT and patterning device MA can be in a vacuum chamber V, where an in-vacuum robot can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot. In some instances, both the in-vacuum and out-of-vacuum robots need to be calibrated for a smooth transfer of any payload (e.g., a mask) to a fixed kinematic mount of a transfer station.

In some aspects, the lithographic apparatuses 100 and 100' can be used in at least one of the following modes:

1. In step mode, the support structure MT and the substrate table WT are kept essentially stationary, while an entire pattern imparted to the radiation beam B is projected onto a target portion C at one time (e.g., a single static exposure). The substrate table WT is then shifted in the X and/or Y direction so that a different target portion C can be exposed.
2. In scan mode, the support structure MT and the substrate table WT are scanned synchronously while a pattern imparted to the radiation beam B is projected onto a target portion C (e.g., a single dynamic exposure). The velocity and direction of the substrate table WT relative to the support structure MT (e.g., mask table) can be determined by the (de-)magnification and image reversal characteristics of the projection system PS.
3. In another mode, the support structure MT is kept substantially stationary holding a programmable patterning device MA, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device MA, such as a programmable mirror array.

In some aspects, the lithographic apparatuses 100 and 100' can employ combinations and/or variations of the above-described modes of use or entirely different modes of use. In some aspects, as shown in FIG. 1A, the lithographic apparatus 100 can include an EUV source configured to generate an EUV radiation beam B for EUV lithography. In general, the EUV source can be configured in a radiation source SO, and a corresponding illumination system IL can be configured to condition the EUV radiation beam B of the EUV source.

Figures 2, 3:
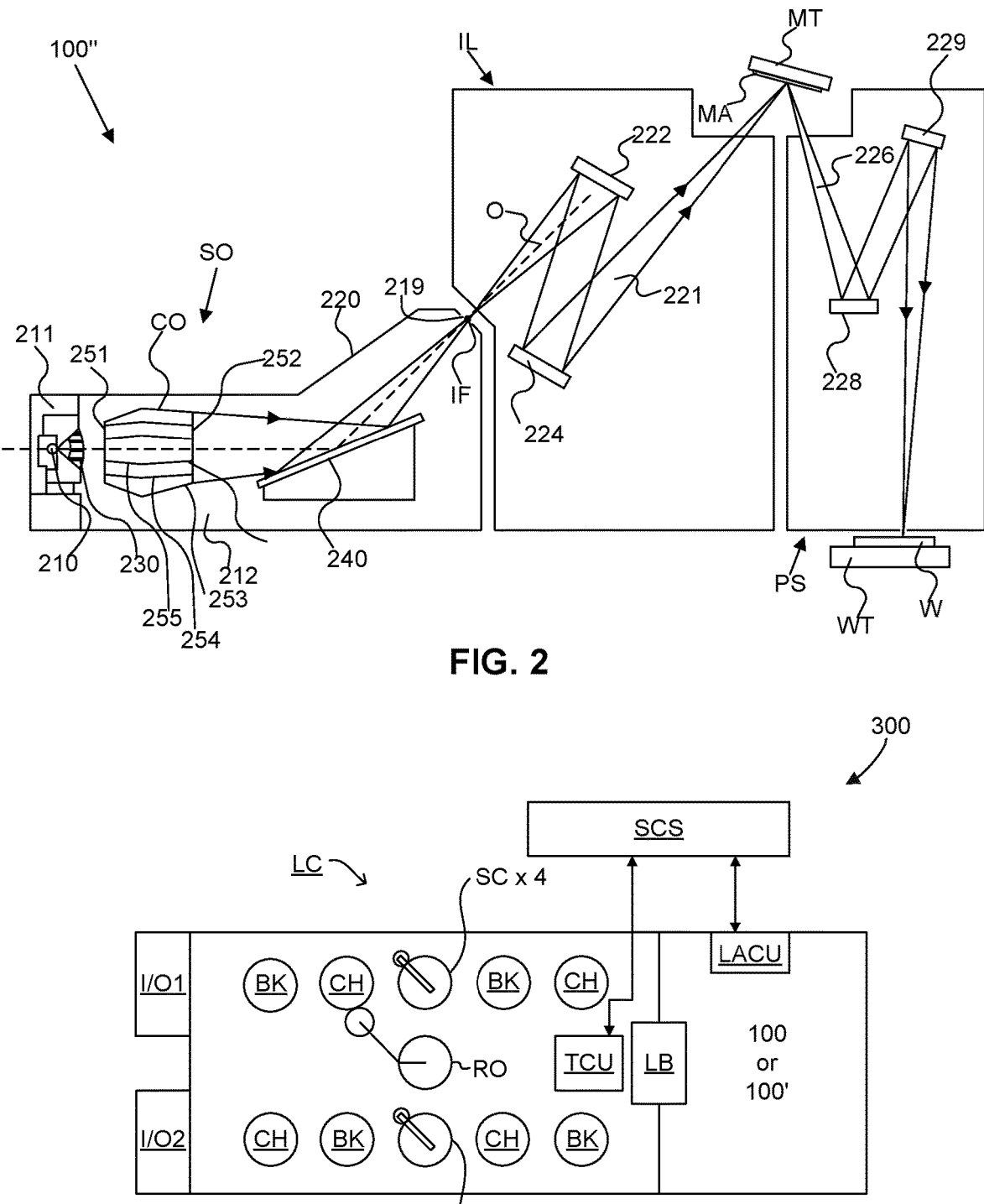
FIG. 2 is a more detailed schematic illustration of the reflective lithographic apparatus shown in FIG. 1A according to some aspects of the present disclosure.
FIG. 3 is a schematic illustration of an example lithographic cell according to some aspects of the present disclosure.

FIG. 2 shows the lithographic apparatus 100 in more detail, including the radiation source SO (e.g., a source collector apparatus), the illumination system IL, and the projection system PS. As shown in FIG. 2, the lithographic apparatus 100 is illustrated from a point of view (e.g., a side view) that is normal to the XZ plane (e.g., the X-axis points to the right and the Z-axis points upward).

The radiation source SO is constructed and arranged such that a vacuum environment can be maintained in an enclosing structure 220. The radiation source SO includes a source chamber 211 and a collector chamber 212 and is configured to produce and transmit EUV radiation. EUV radiation can be produced by a gas or vapor, for example xenon (Xe) gas, lithium (Li) vapor, or tin (Sn) vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, about 10.0 pascals (Pa) of Xe gas, Li vapor, Sn vapor, or any other suitable gas or vapor can be used for efficient generation of the radiation. In some aspects, a plasma of excited tin is provided to produce EUV radiation.

The radiation emitted by the EUV radiation emitting plasma 210 is passed from the source chamber 211 into the collector chamber 212 via an optional gas barrier or contaminant trap 230 (e.g., in some cases also referred to as contaminant barrier or foil trap), which is positioned in or behind an opening in the source chamber 211. The contaminant trap 230 can include a channel structure. Contaminant trap 230 can also include a gas barrier or a combination of a gas barrier and a channel structure. The contaminant trap 230 further indicated herein at least includes a channel structure.

The collector chamber 212 can include a radiation collector CO (e.g., a condenser or collector optic), which can be a so-called grazing incidence collector. Radiation collector CO has an upstream radiation collector side 251 and a downstream radiation collector side 252. Radiation that traverses radiation collector CO can be reflected off a grating spectral filter 240 to be focused in a virtual source point IF. The virtual source point IF is commonly referred to as the intermediate focus, and the source collector apparatus is arranged such that the virtual source point IF is located at or near an opening 219 in the enclosing structure 220. The virtual source point IF is an image of the EUV radiation emitting plasma 210. The grating spectral filter 240 can be used to suppress infrared (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the radiation beam 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination system IL and projection system PS. Optionally, the grating spectral filter 240 can be present depending upon the type of lithographic apparatus. Further, there can be more mirrors present than those shown in the FIG. 2. For example, there can be one to six additional reflective elements present in the projection system PS than shown in FIG. 2.

Radiation collector CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a radiation collector CO of this type is preferably used in combination with a discharge produced plasma (DPP) source.

Example Lithographic Cell

FIG. 3 shows a lithographic cell 300, also sometimes referred to a lithocell or cluster. As shown in FIG. 3, the lithographic cell 300 is illustrated from a point of view (e.g., a top view) that is normal to the XY plane (e.g., the X-axis points to the right and the Y-axis points upward).

Lithographic apparatus 100 or 100' can form part of lithographic cell 300. Lithographic cell 300 can also include one or more apparatuses to perform pre- and post-exposure processes on a substrate. For example, these apparatuses can include spin coaters SC to deposit resist layers, developers DE to develop exposed resist, chill plates CH, and bake plates BK. A substrate handler RO (e.g., a robot) picks up substrates from input/output ports I/O1 and I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Example Substrate Stage

Figure 4:
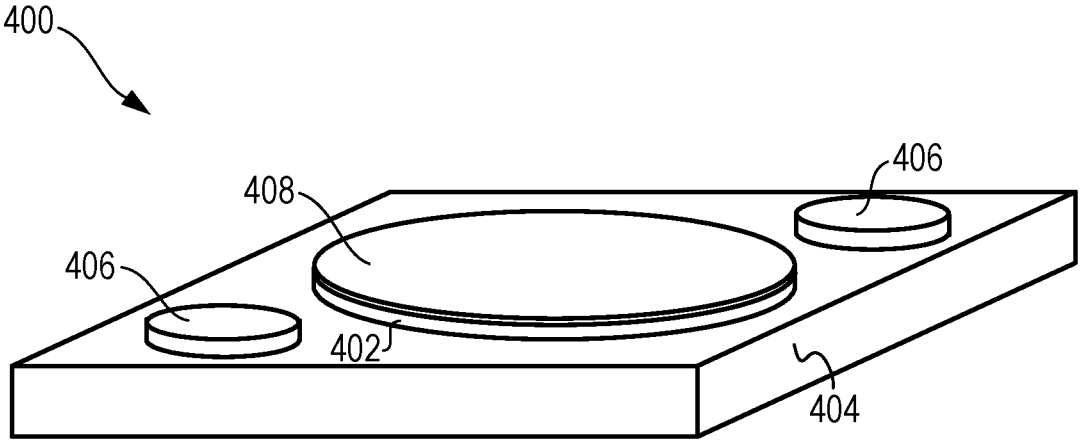
FIG. 4 is a schematic illustration of an example substrate stage according to some aspects of the present disclosure.

FIG. 4 shows a schematic illustration of an example substrate stage 400, according to some aspects of the present disclosure. In some aspects, the example substrate stage 400 can include a substrate table 402, a support block 404, one or more sensor structures 406, any other suitable component, or any combination thereof. In some aspects, substrate table 402 can include a clamp (e.g., a wafer clamp, a reticle clamp, an electrostatic clamp) to hold a substrate 408. In some aspects, each of one or more sensor structures 406 can include a transmission image sensor (TIS) plate. The TIS plate is a sensor unit that includes one or more sensors and/or markers for use in a TIS sensing system used for accurate positioning of the wafer relative to the position of a projection system (e.g., projection system PS described with reference to FIGS. 1A, 1B, and 2) and a mask (e.g., patterning device MA described with reference to FIGS. 1A, 1B, and 2) of a lithographic apparatus (e.g., lithographic apparatus 100 and lithographic apparatus 100' described with reference to FIGS. 1A, 1B, and 2). While TIS plates are shown here for illustration, aspects herein are not limited to any particular sensor. Substrate table 402 is disposed on support block 404. One or more sensor structures 406 are disposed on support block 404.

In some aspects, substrate 408 can be disposed on substrate table 402 when the example substrate stage 400 supports the substrate 408.

The terms "flat," "flatness" or the like can be used herein to describe structures in relation to a general plane of a surface. For example, a bent or unleveled surface can be one that does not conform to a flat plane. Protrusions and recesses on a surface can also be characterized as deviations from a "flat" plane.

The terms "smooth," "roughness" or the like, can be used herein to refer to a local variation, microscopic deviations, graininess, or texture of a surface. For example, the term "surface roughness" can refer to microscopic deviations of the surface profile from a mean line or plane. The deviations are generally measured (in unit of length) as an amplitude parameter, such as root mean squared (RMS) or arithmetical mean deviation (Ra) (e.g., 1 nm RMS).

In some aspects, the surface of the substrate tables mentioned above (e.g., substrate table WT in FIGS. 1A and 1B, substrate table 402 in FIG. 4) can be flat or burled. When the surface of a substrate table is flat, any particulates or contaminants stuck between the substrate table and a wafer will cause the contaminant to print through the wafer, causing lithography errors in its vicinity. Consequently, contaminants reduce device yield rates and increase production costs.

Disposing burls on substrate tables help to reduce the undesirable effects of a flat substrate table. When a wafer is clamped to a burled substrate table, empty spaces are available in the regions where the wafer does not contact the substrate table. The empty spaces function as pockets for contaminants so as to prevent printing errors. Another advantage is that contaminants located on the burls are more likely to become crushed due to the increased load caused by the burls. Crushing contaminants helps mitigate print-through errors as well. In some aspects, the combined surface area of the burls can be approximately one percent to five percent of the surface area of the substrate table. Here, surface area of the burls refers to the surfaces that come into contact with the wafer (e.g., not including the side walls); and surface area of the substrate table refers to the span of surface of the substrate table where the burls reside (e.g., not including the lateral or back side of the substrate table). When the wafer is clamped onto the burled substrate table, the load is increased by 100 fold as compared to a flat substrate table, which is enough to crush most contaminants. Though the example here uses a substrate table, the example is not intended to be limiting. For example, aspects of the present disclosure can be implemented on reticle tables, for a variety of clamping structures (e.g., electrostatic clamps, clamping membranes), and in a variety of lithographic systems (e.g., DUV, EUV).

In some aspects, the burl-to-wafer interface governs the functional performance of the substrate table. When the surface of a substrate table is smooth, an adhesion force can develop between the smooth surface of the substrate table and the smooth surface of a wafer. The phenomenon where two smooth surfaces in contact cling together is known as wringing. Wringing can cause issues (e.g., overlay issues) in device fabrication due to high friction and in-plane stresses in the wafer (it is optimal to have the wafer glide easily during alignment).

Example Substrate Tables

Figure 5:
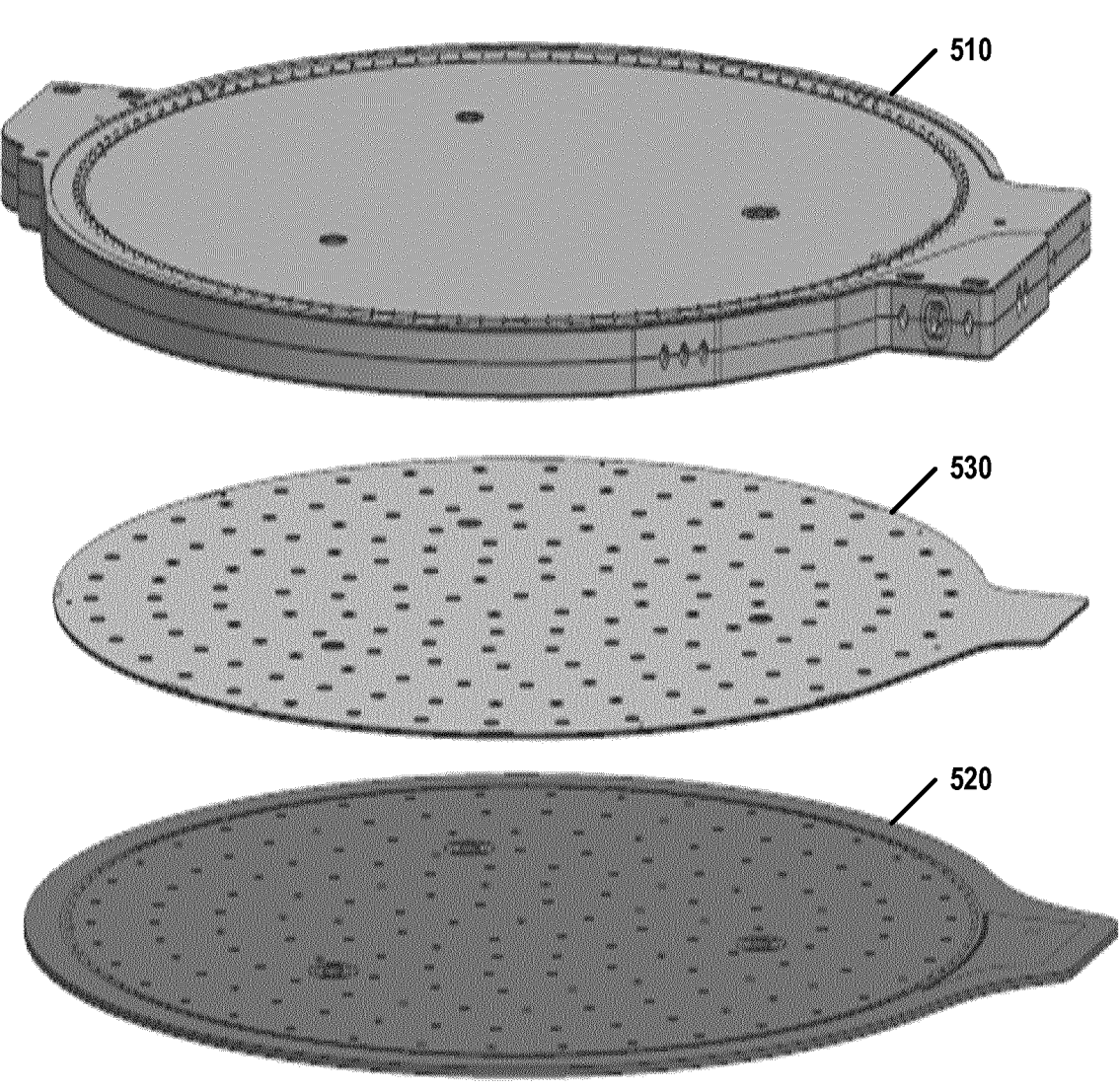
FIG. 5 is a schematic illustration of portions of an example EUV substrate table according to some aspects of the present disclosure.

FIG. 5 is a schematic illustration of portions of an example EUV substrate table 500 according to some aspects of the present disclosure. It is to be appreciated that the illustrated portions of example EUV substrate table 500 may be used outside of an EUV application. For instance, the illustrated portions of example EUV substrate table 500 may be used in a DUV application and, in some aspects, may omit or otherwise not include electrostatic sheet 530.

As shown in FIG. 5, example EUV substrate table 500 can include a core body 510 and an electrostatic sheet 530. In some aspects, electrostatic sheet 530 can be mounted to core body 510 using a vacuum sheet 520.

Figure 6A:
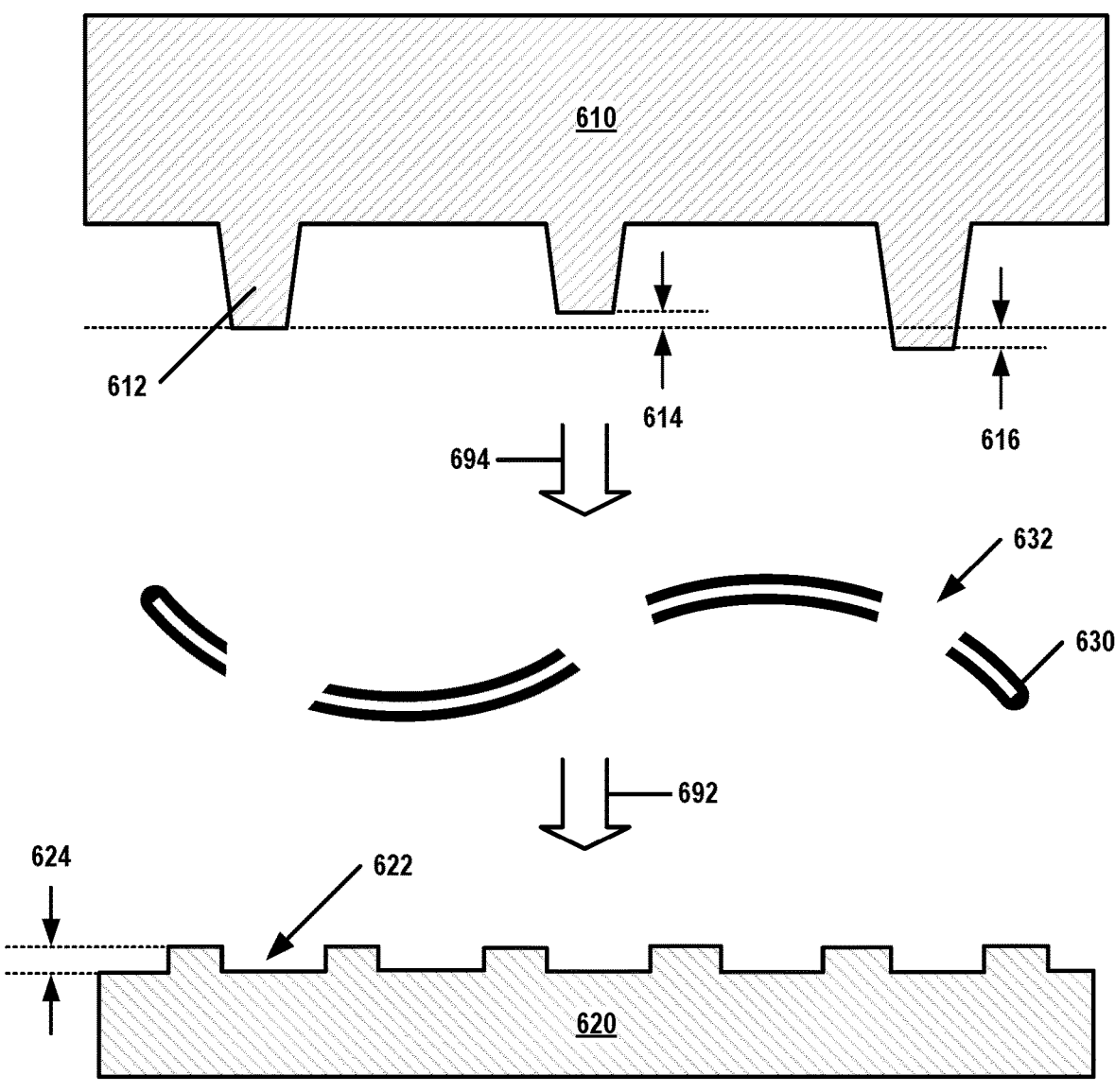
FIGS. 6A, 6B, and 6C are cross-sectional illustrations of portions of an example EUV substrate table according to some aspects of the present disclosure.
Figure 6B:
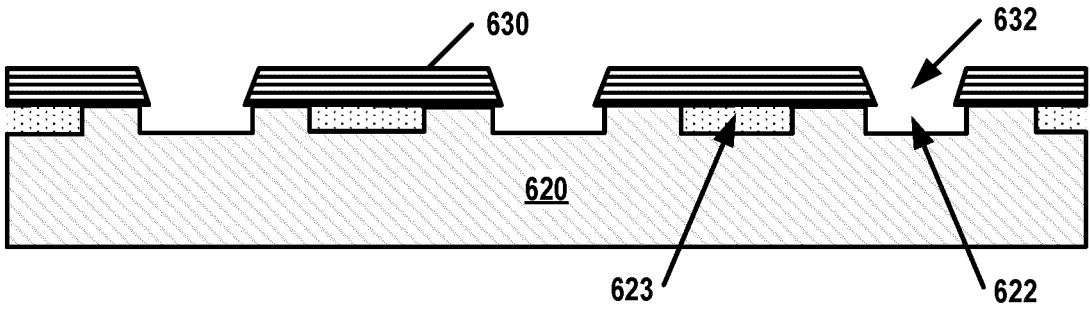
Figure 6C:
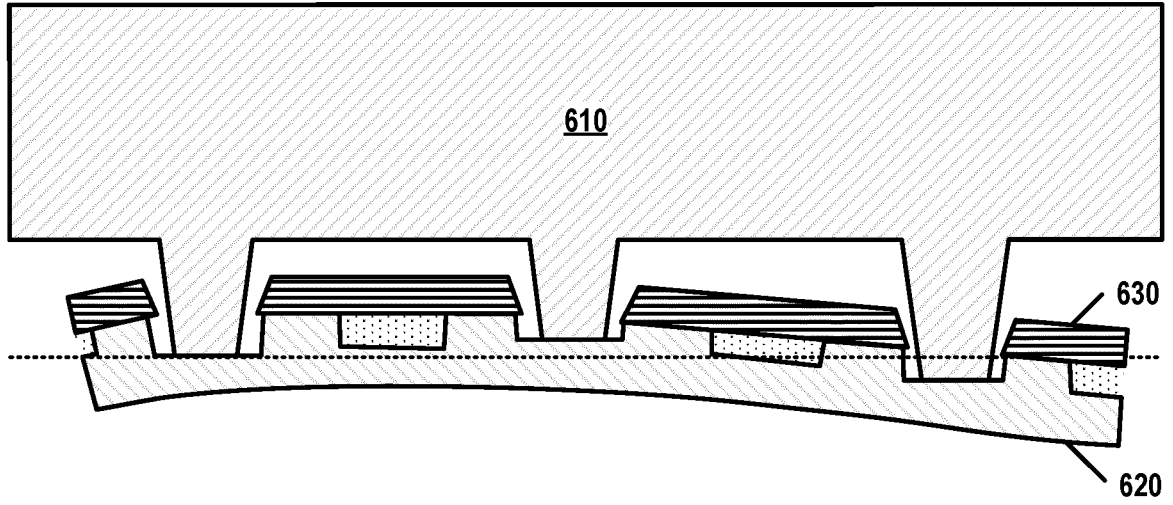

FIGS. 6A, 6B, and 6C are cross-sectional illustrations of portions of an example EUV substrate table 600 according to some aspects of the present disclosure. It is to be appreciated that the illustrated portions of example EUV substrate table 600 may be used outside of an EUV application. For instance, the illustrated portions of example EUV substrate table 600 may be used in a DUV application and, in some aspects, may omit or otherwise not include electrostatic sheet 630.

As shown in FIG. 6A, example EUV substrate table 600 can include a core body 610 and an electrostatic sheet 630. In some aspects, electrostatic sheet 630 can be mounted to core body 610 using a vacuum sheet 620.

In some aspects, core body 610 can include a plurality of burls 612 (e.g., glass burls, hard burls, flexburls, or any other suitable burls). In some aspects, plurality of burls 612 can be configured to support an object, such as a wafer (e.g., plurality of burls 612 can be disposed on the top side of core body 610 facing the wafer). In some aspects, differences in the respective height of each of plurality of burls 612 can cause core body 610 to have a non-flatness as indicated by burl-top height differences 614 and 616. In some aspects, vacuum sheet 620 can include a plurality of vacuum connections (not shown) and a plurality of recesses 622 configured to receive the plurality of burls 612. In some aspects, plurality of recesses 622 can have a recess depth 624 of between about 8.00 microns+/−0.25 microns and about 20.00 microns+/−0.25 microns. In some aspects, electrostatic sheet 630 can include a plurality of apertures 632 configured to receive plurality of burls 612. In some aspects, electrostatic sheet 630 can be configured to connect to vacuum sheet 620 such that plurality of apertures 632 line up with plurality of recesses 622.

In some aspects, at least a portion of core body 610 can be formed of SiSiC or SiC. In some aspects, at least a portion of plurality of burls 612 can be formed of SiSiC, SiC, DLC, AN, SiN, or CrN. In some aspects, at least a portion of vacuum sheet 620 can be formed of fused silica. In some aspects, at least a portion of electrostatic sheet 630 can be formed of borosilicate glass. In some aspects, at least another portion of electrostatic sheet 630 can be formed of an electrically conductive material. In some aspects, electrostatic sheet 630 can include one or more electrodes sandwiched between two or more dielectric layers, such as two glass wafers. In some aspects, a stiffness of core body 610 can be greater than a stiffness of vacuum sheet 620, and the stiffness of vacuum sheet 620 can be greater than a stiffness of electrostatic sheet 630. For example, electrostatic sheet 630, vacuum sheet 620, or both can be flexible enough to conform to the non-flatness of core body 610.

In some aspects, plurality of recesses 622 can be formed by patterning and etching vacuum sheet 620 based on the pattern (e.g., amount, spacing, location, etc.) of plurality of burls 612, the pattern of plurality of apertures 632, or both. Additionally or alternatively, in some aspects, plurality of recesses 622 can be formed by depositing a layer of metal (e.g., Cu, CrN) on vacuum sheet 620 and then patterning and etching the deposited metal layer based on the pattern of plurality of burls 612, the pattern of plurality of apertures 632, or both. In some aspects, plurality of apertures 632 can be formed by patterning and etching electrostatic sheet 630 based on the pattern of plurality of burls 612, the plurality of recesses 622, or both. In some aspects, plurality of apertures 632 can be formed by drilling electrostatic sheet 630 based on the pattern of plurality of burls 612, the plurality of recesses 622, or both.

In some aspects, as indicated by arrow 692, vacuum sheet 620 can be configured to vacuum clamp electrostatic sheet 630 to vacuum sheet 620 in response to an application of a vacuum to the plurality of vacuum connections of vacuum sheet 620. Additionally or alternatively, in some aspects, vacuum sheet 620 can include an electrode layer (e.g., Cu or CrN) including one or more electrodes, and vacuum sheet 620 can be configured to electrostatically clamp electrostatic sheet 630 to vacuum sheet 620 in response to an application of one or more voltages to one or more of the one or more electrodes of the electrode layer of vacuum sheet 620. In one example, when the electrodes of electrostatic sheet 630 is not grounded, example EUV substrate table 500 can include two electrodes, one at negative and the other at positive potential, for electrostatically clamping electrostatic sheet 630 to vacuum sheet 620. In another example, when the electrodes of electrostatic sheet 630 is grounded, example EUV substrate table 500 can include one electrode for electrostatically clamping electrostatic sheet 630 to vacuum sheet 620.

In some aspects, vacuum sheet 620 can include a coating disposed on at least a portion of a surface of vacuum sheet 620 facing electrostatic sheet 630 (e.g., at least in the areas where vacuum sheet 620 and electrostatic sheet 630 touch when electrostatic sheet 630 is clamped to vacuum sheet 620). In some aspects, the characteristics of this coating can be configured to substantially prevent optical contacting, or other strong or substantially permanent adhesion, between vacuum sheet 620 and electrostatic sheet 630. In some aspects, at least a portion of this coating can be formed of CrN or DLC.

In some aspects, as indicated by arrow 694, vacuum sheet 620 can be configured to vacuum clamp core body 610 to electrostatic sheet 630 and vacuum sheet 620 in response to an application of a vacuum to the plurality of vacuum connections of vacuum sheet 620. Additionally or alternatively, in some aspects, electrostatic sheet 630 can be configured to be bonded to core body 610 using an adhesive (e.g., one or more glue dots).

As shown in FIG. 6B, vacuum sheet 620 is connected to electrostatic sheet 630, such that plurality of apertures 632 line up with plurality of recesses 622. In some aspects, vacuum sheet 620 can be connected, partially or wholly, to electrostatic sheet 630 by a plurality of connection regions 623, which may include a plurality of vacuum chambers.

As shown in FIG. 6C, electrostatic sheet 630 and vacuum sheet 620 are connected to core body 610 such that vacuum sheet 620 and electrostatic sheet 630 conform to the non-flatness of core body 610. In some aspects, once the manufacturing process is complete, vacuum sheet 720 can be removed from core body 610 and electrostatic sheet 630.

Figure 7:
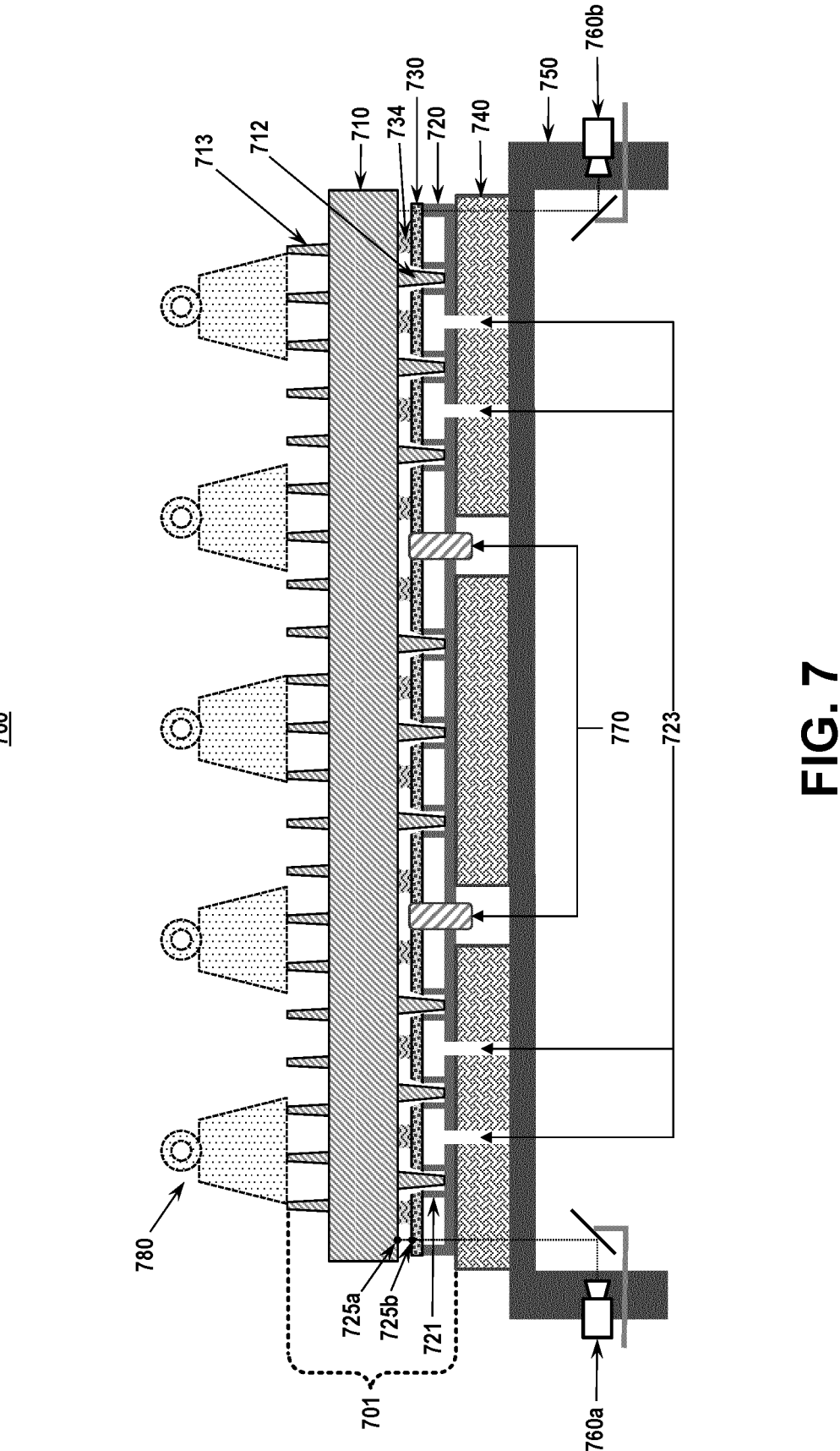
FIG. 7 is a cross-sectional illustration of a region of an example EUV substrate table manufacturing system according to some aspects of the present disclosure.

FIG. 7 is a cross-sectional illustration of portions of an example EUV substrate table manufacturing system 700 according to some aspects of the present disclosure. It is to be appreciated that example EUV substrate table manufacturing system 700 can be used in applications aside from EUV. In some aspects, an example EUV substrate table 701 can include a core body 710, a vacuum sheet 720, and an electrostatic sheet 730. In some aspects, core body 710 can be mounted to electrostatic sheet 730 using a vacuum sheet 720. In some aspects, the example EUV substrate table 701 can be placed on a compliant layer 740 disposed on a table 750. In some aspects, the example EUV substrate table 701 can be placed under a plurality of weights 780 (e.g., steel plates laid on core body 710; or, in some aspects, an electro-mechanical force) configured to keep core body 710 pressed into compliant layer 740. In some aspects, once the manufacturing process is complete, plurality of weights 780 can be removed from the example EUV substrate table 701, and the example EUV substrate table 701 can be removed from vacuum sheet 720 and compliant layer 740.

In some aspects, core body 710 can include a plurality of burls 712 (e.g., glass burls, hard burls, flexburls, or any other suitable burls) configured to connect with vacuum sheet 720. In some aspects, plurality of burls 712 can be configured to support an object, such as a wafer (e.g., plurality of burls 712 can be disposed on the top side of core body 710 and configured to face the wafer during operation of an lithographic apparatus). In some aspects, core body 710 can further include a plurality of burls 713 (e.g., glass burls, hard burls, flexburls, or any other suitable burls) configured to support a substrate (e.g., a weighted substrate). In some aspects, vacuum sheet 720 can include a plurality of vacuum connections 723 and a plurality of recesses (e.g., formed by etching a doughnut-shaped ring 721 at each burl location to a depth of between about 8.00 microns+/−0.25 microns and about 20.00 microns+/−0.25 microns) configured to receive the plurality of burls 712. In some aspects, plurality of recesses can have a recess depth of between about 8.00 microns+/−0.25 microns and about 20.00 microns+/−0.25 microns. In some aspects, electrostatic sheet 730 can include a plurality of apertures configured to receive plurality of burls 712. In some aspects, electrostatic sheet 730 can be configured to connect to vacuum sheet 720 such that plurality of apertures of electrostatic sheet 730 line up with plurality of recesses of vacuum sheet 720.

In some aspects, at least a portion of core body 710 can be formed of SiSiC or SiC. In some aspects, at least a portion of plurality of burls 712 can be formed of SiSiC, SiC, DLC, AlN, SiN, or CrN. In some aspects, at least a portion of plurality of burls 713 can be formed of SiSiC, SiC, DLC, AlN, SiN, or CrN. In some aspects, at least a portion of vacuum sheet 720 can be formed of fused silica. In some aspects, at least a portion of electrostatic sheet 730 can be formed of borosilicate glass. In some aspects, at least another portion of electrostatic sheet 730 can be formed of an electrically conductive material. In some aspects, electrostatic sheet 730 can include one or more electrodes sandwiched between two or more dielectric layers, such as two glass wafers. In some aspects, compliant layer 740 may be or include a flexible support structure formed of PDMS; a soft, low-durometer polymer, such as durometer 20A silicone; any other suitable material; or any combination thereof.

In some aspects, a stiffness of core body 710 can be greater than a stiffness of vacuum sheet 720, and the stiffness of vacuum sheet 720 can be greater than a stiffness of electrostatic sheet 730. For example, electrostatic sheet 730, vacuum sheet 720, or both can be flexible enough to conform to the non-flatness of core body 710.

In some aspects, compliant layer 740 and table 750 may include one or more apertures (e.g. holes) for an alignment system (e.g., vision alignment system 760a, vision alignment system 760b) to look through to view (e.g., image, capture) an alignment mark 725a disposed on core body 710 and an alignment mark 725b disposed on electrostatic sheet 730.

In some aspects, plurality of recesses of vacuum sheet 720 can be formed by patterning and etching vacuum sheet 720 based on the pattern (e.g., amount, spacing, location, etc.) of plurality of buds 712, the pattern of plurality of apertures of electrostatic sheet 730, or both. Additionally or alternatively, in some aspects, plurality of recesses of vacuum sheet 720 can be formed by depositing a layer of metal (e.g., Cu, CrN) on vacuum sheet 720 and then patterning and etching the deposited metal layer based on the pattern of plurality of burls 712, the pattern of plurality of apertures of electrostatic sheet 730, or both.

In some aspects, plurality of apertures of electrostatic sheet 730 can be formed by patterning and etching electrostatic sheet 730 based on the pattern of plurality of burls 712, the plurality of recesses of vacuum sheet 720, or both. In some aspects, plurality of apertures of electrostatic sheet 730 can be formed by drilling electrostatic sheet 730 based on the pattern of plurality of burls 712, the plurality of recesses of vacuum sheet 720, or both.

In some aspects, electrostatic sheet 730 can be configured to be bonded to core body 710 using a plurality of adhesive structures 734 (e.g., a plurality of glue dots applied to electrostatic sheet 730).

In some aspects, vacuum sheet 720 can be configured to vacuum clamp electrostatic sheet 730, core body 710, or both to vacuum sheet 720 in response to an application of a vacuum to plurality of vacuum connections 723 of vacuum sheet 720. Additionally or alternatively, in some aspects, vacuum sheet 720 can include an electrode layer (e.g., Cu or CrN), and vacuum sheet 720 can be configured to electrostatically clamp electrostatic sheet 730, core body 710, or both to vacuum sheet 720 in response to an application of a voltage to the electrode layer of vacuum sheet 720. In some aspects, electrostatic sheet 730 and vacuum sheet 720 can be connected to core body 710 such that vacuum sheet 720 and electrostatic sheet 730 conform to the non-flatness of core body 710.

In some aspects, vacuum sheet 720 can be connected to electrostatic sheet 730 and core body 710 such that the plurality of apertures of electrostatic sheet 730 and plurality of burls 712 of core body 710 line up with the plurality of recesses of vacuum sheet 720. In some aspects, vacuum sheet 720, electrostatic sheet 730, or both can include a plurality of e-pin holes configured to receive a plurality of e-pins 770. In some aspects, vacuum sheet 720 can be further connected to electrostatic sheet 730 and core body 710 such that a subset of the plurality of e-pin holes line up with plurality of e-pins 770.

Figure 8:
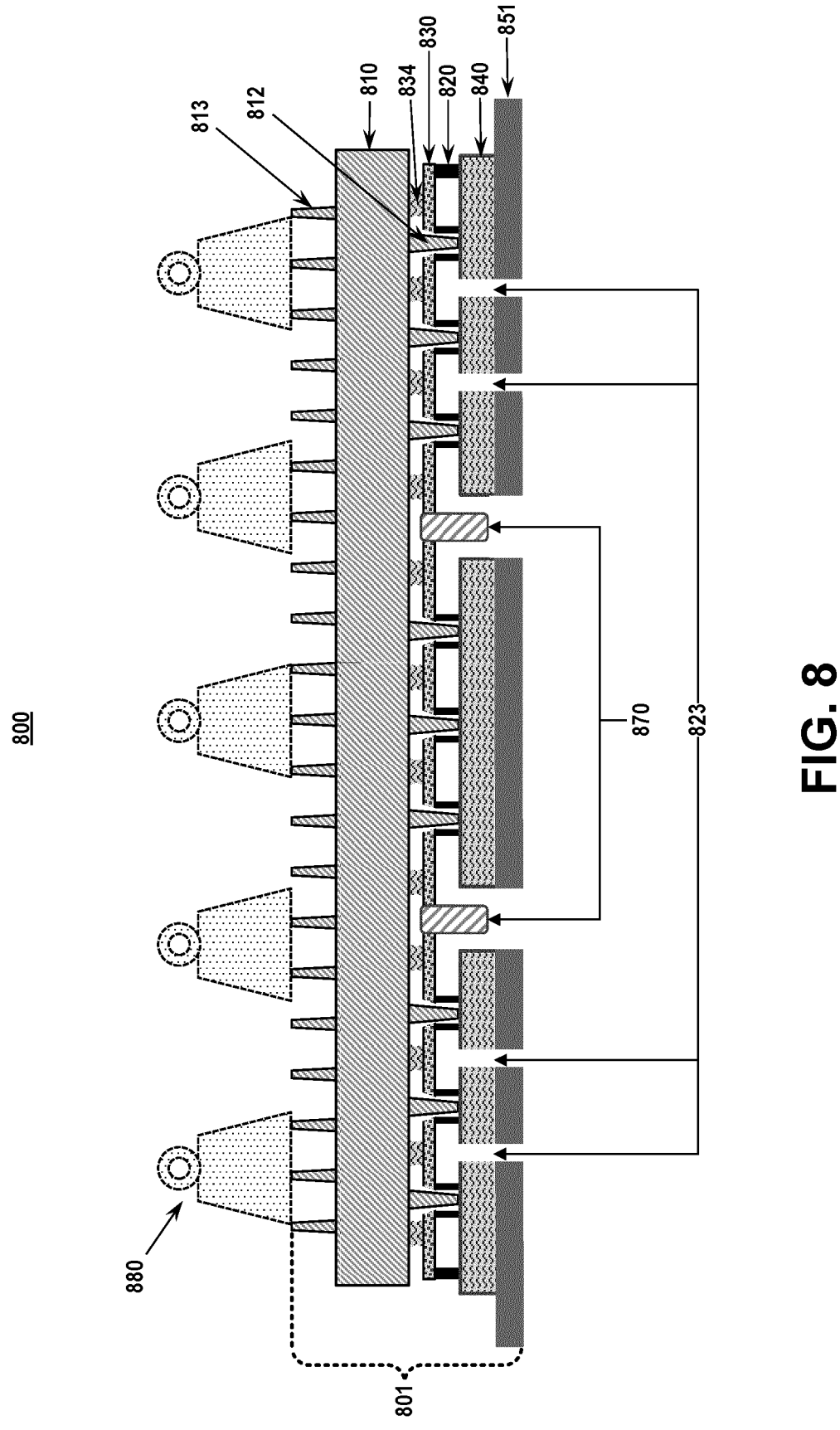
FIG. 8 is a cross-sectional illustration of a region of another example EUV substrate table manufacturing system according to some aspects of the present disclosure.

FIG. 8 is a cross-sectional illustration of portions of another example EUV substrate table manufacturing system 800 according to some aspects of the present disclosure. It is to be appreciated that example EUV substrate table manufacturing system 800 can be used in applications aside from EUV. In some aspects, an example EUV substrate table 801 can include a core body 810, an electrostatic sheet 830. In some aspects, core body 810 can be mounted to electrostatic sheet 830 using a metal layer 820 formed on a compliant layer 740 that is formed on a substrate 851. In some aspects, the example EUV substrate table 801 can be placed under a plurality of weights 880 (e.g., steel plates laid on core body 710; or, in some aspects, an electro-mechanical force) configured to keep core body 810 pressed into compliant layer 840. In some aspects, the force exerted by plurality of weights 880 can be adjusted to modify the height of metal layer 820. In some aspects, once the manufacturing process is complete, plurality of weights 880 can be removed from the example EUV substrate table 801.

In some aspects, core body 810 can include a plurality of burls 812 (e.g., glass burls, hard burls, flexburls, or any other suitable burls) configured to connect with compliant layer 840. In some aspects, plurality of burls 812 can be configured to support an object, such as a wafer (e.g., plurality of burls 812 can be disposed on the top side of core body 810 and configured to face the wafer during operation of an lithographic apparatus). In some aspects, core body 810 can further include a plurality of burls 813 (e.g., glass burls, hard burls, flexburls, or any other suitable burls) configured to support a substrate (e.g., a weighted substrate).

In some aspects, substrate 851 can include a plurality of vacuum connections 823 (e.g., formed by patterning and etching, or any other suitable technique or combination of techniques). In some aspects, compliant layer 840 can include a plurality of vacuum connections (e.g., formed by patterning and etching, or any other suitable technique or combination of techniques) configured to line up with plurality of vacuum connections 823 of substrate 851.

In some aspects, metal layer 820 can include a plurality of apertures (e.g., formed by patterning metal layer 820 to form a plurality of doughnut-shaped metal rings, where each doughnut-shaped metal ring surrounds a respective burl and has a height of between about 8.00 microns+/−0.25 microns and about 20.00 microns+/−0.25 microns) configured to receive the plurality of burls 812. In some aspects, the plurality of apertures of metal layer 820 can be formed by depositing a layer of metal (e.g., Cu, CrN) on compliant layer 840 and then patterning and etching the deposited metal layer based on the pattern (e.g., amount, spacing, location, etc.) of plurality of burls 812, the pattern of plurality of apertures of electrostatic sheet 830, or both.

In some aspects, electrostatic sheet 830 can include a plurality of apertures configured to receive plurality of burls 812. In some aspects, electrostatic sheet 830 can be configured to connect to metal layer 820 such that plurality of apertures of electrostatic sheet 830 line up with plurality of apertures of metal layer 820. In some aspects, plurality of apertures of electrostatic sheet 830 can be formed by patterning and etching electrostatic sheet 830 based on the pattern of plurality of burls 812, the plurality of apertures of metal layer 820, or both. In some aspects, plurality of apertures of electrostatic sheet 830 can be formed by drilling electrostatic sheet 830 based on the pattern of plurality of burls 812, the plurality of apertures of metal layer 820, or both.

In some aspects, at least a portion of core body 810 can be formed of SiSiC. In some aspects, at least a portion of plurality of burls 812 can be formed of DLC, AlN, SiN, or CrN. In some aspects, at least a portion of plurality of burls 813 can be formed of DLC, AlN, SiN, or CrN. In some aspects, at least a portion of metal layer 820 can be formed of Cu or CrN. In some aspects, at least a portion of electrostatic sheet 830 can be formed of borosilicate glass. In some aspects, at least another portion of electrostatic sheet 830 can be formed of an electrically conductive material. In some aspects, electrostatic sheet 830 can include one or more electrodes sandwiched between two or more dielectric layers, such as two glass wafers. In some aspects, compliant layer 840 may be or include a flexible support structure formed of PDMS; a soft, low-durometer polymer, such as durometer 20A silicone; any other suitable material; or any combination thereof. In some aspects, at least a portion of substrate 851 can be formed of fused silica. In some aspects, substrate 851 may be any suitable substrate, such as a glass wafer.

In some aspects, a stiffness of core body 810 can be greater than a stiffness of electrostatic sheet 830. In some aspects, a stiffness of core body 810 can be greater than a stiffness of compliant layer 840. For example, electrostatic sheet 830, compliant layer 840, or both can be flexible enough to conform to the non-flatness of core body 810. In some aspects, electrostatic sheet 830 can be configured to be bonded to core body 810 using a plurality of adhesive structures 834 (e.g., a plurality of glue dots applied to electrostatic sheet 830).

In some aspects, substrate 851 can be configured to vacuum clamp electrostatic sheet 830, core body 810, or both to metal layer 820, compliant layer 840, and substrate 851 in response to an application of a vacuum to plurality of vacuum connections 823 of substrate 851. Additionally or alternatively, in some aspects, metal layer 820 can be configured to electrostatically clamp electrostatic sheet 830, core body 810, or both to metal layer 820, compliant layer 840, and substrate 851 in response to an application of a voltage to metal layer 820. In some aspects, electrostatic sheet 830, metal layer 820, compliant layer 840, and substrate 851 can be connected to core body 810 such that compliant layer 840 and electrostatic sheet 830 conform to the non-flatness of core body 810.

In some aspects, metal layer 820 and compliant layer 840 can be connected to electrostatic sheet 830 and core body 810 such that the plurality of apertures of electrostatic sheet 830 and plurality of burls 812 of core body 810 line up with the plurality of apertures of metal layer 820. In some aspects, electrostatic sheet 830, compliant layer 840, substrate 851, or a combination thereof can include a plurality of e-pin holes configured to receive a plurality of e-pins 870. In some aspects, metal layer 820 and compliant layer 840 can be further connected to electrostatic sheet 830 and core body 810 such that a subset of the plurality of e-pin holes line up with plurality of e-pins 870.

Example Burls Surrounded by Trenches

FIGS. 9A, 9B, 9C, 9D, 9E, 9F, and 9G are cross-sectional illustrations of example burls surrounded by example trenches, referred to herein as "flexburls," according to some aspects of the present disclosure. In some aspects the example flexburls shown in FIGS. 9A, 9B, 9C, 9D, 9E, 9F, and 9G can be incorporated into any of the example substrate tables disclosed herein, such as on the top surface, bottom surface, or both of an example core body.

Figure 9A:
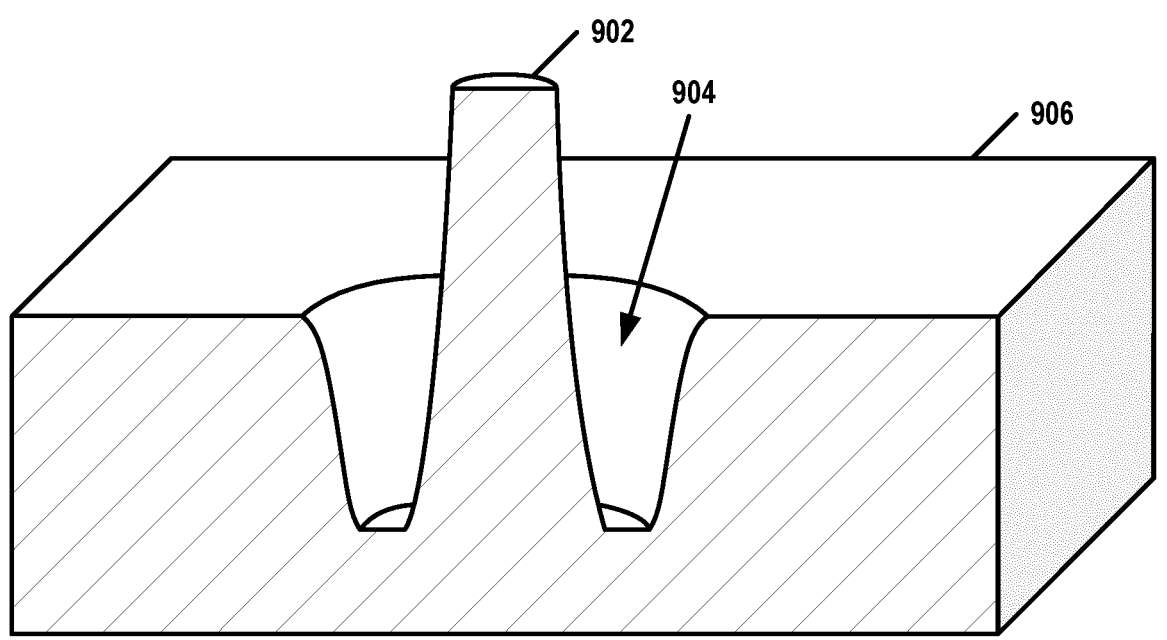
FIGS. 9A, 9B, 9C, 9D, 9E, 9F, and 9G are cross-sectional illustrations of example burls surrounded by example trenches according to some aspects of the present disclosure.

As shown in FIG. 9A, in some aspects, an example flexburl 900 can include a burl 902 surrounded by a trench 904 formed in a core body 906. In some aspects, trench 904 can be formed around burl 902 using e.g., using deep reactive-ion etching (DRIE), laser ablation, powder blasting, chemical etching, or another suitable technique. In some aspects, trench 904 can be etched directly into core body 906, into one or more layers disposed on core body 906, or a combination thereof. In some aspects, one or more portions of burl 902 can be formed of SiSiC, SiC, DLC, AN, SiN, or CrN. In some aspects, burl 902 can have a top diameter of about 100 microns to around 500 microns. For example, burl 902 can have a top diameter of about 210 microns. In some aspects, burl 902 can have a stiffness of less than about $10^7$ Nm$^{-1}$.

Figure 9B:
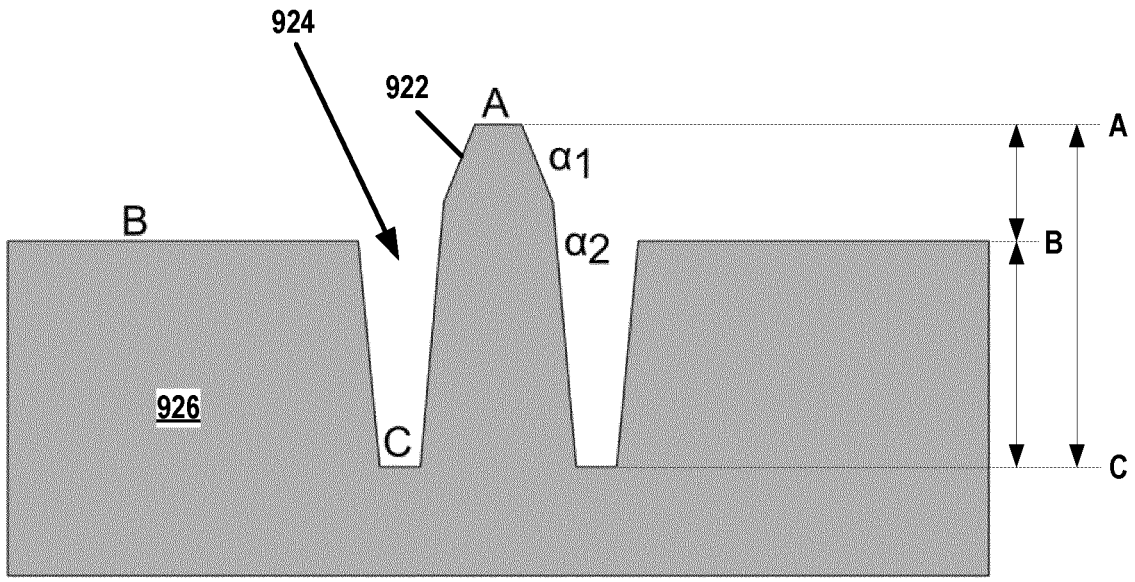

As shown in FIG. 9B, in some aspects, an example flexburl 920 can include a burl 922 surrounded by a trench 924 formed in a core body 926. In some aspects, the top of burl 922 can be disposed at about a height level A, the non-burl surface of core body 926 can be disposed at about a height level B, and the bottom of trench 924 can be disposed at about a height level C. In some aspects, burl 922 can have a profile f(z) as a function of height z that can be optimized for stiffness and robustness while satisfying requirements on burl top contact area and volume footprint. In some aspects, the profile f(z) can increase the burl width towards the bottom of burl 922 (e.g., height level C), and decrease the burl width towards the top of burl 922 (e.g., height level A). In one illustrative and non-limiting example, burl 922 can have a first taper angle $\alpha_1$ towards the top of burl 922 and a second taper angle $\alpha_2$ towards the bottom of burl 922, where the first taper angle $\alpha_1$ is different from the second taper angle $\alpha_2$. In some aspects, one or more portions of burl 922 can have a profile f(z) that includes one or more discrete steps (e.g., rather than a continuous taper angle).

In some aspects, the substrate-to-substrate table distance A-B can range from about microns to over 1.0 mm). In some aspects, the length of burl 922 (e.g., distance A-C) can range from about 10.0 microns to over 1.0 mm (e.g., from about 100 microns to about 2.5 mm). In some aspects, the depth of trench 944 (e.g., distance B-C) can range from about 50.0 microns to over 1.0 mm (e.g., from about 100 microns to about 2.5 mm). In one illustrative and non-limiting example, the substrate-to-substrate table distance A-B can be about 10 microns, the height of burl 922 (e.g., distance A-C) can be about 100 microns, and the depth of trench 924 (e.g., distance B-C) can be about 90 microns.

Figure 9C:
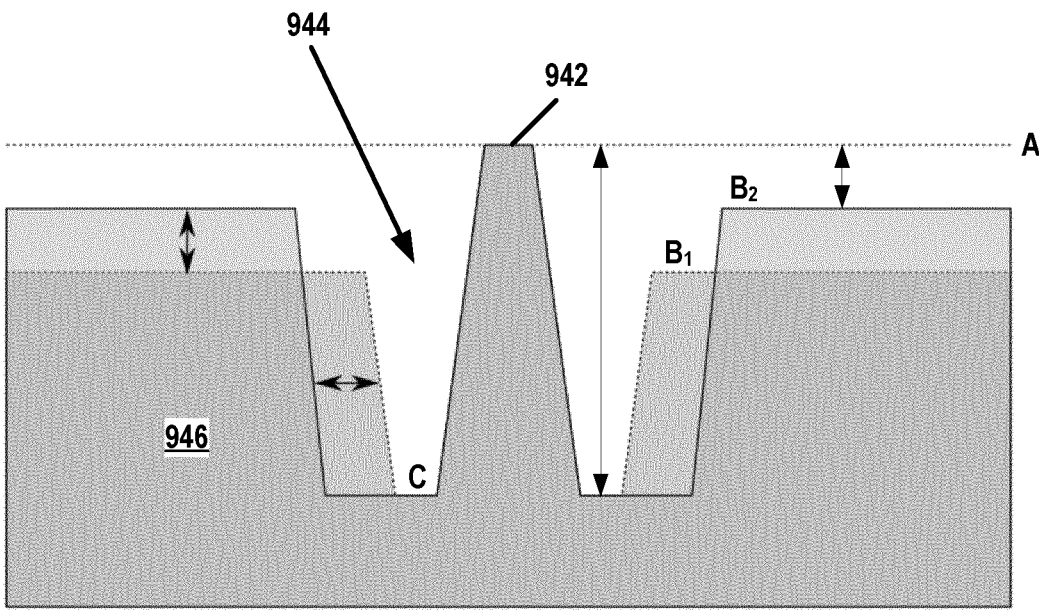

As shown in FIG. 9C, in some aspects, an example flexburl 940 can include a burl 942 surrounded by a trench 944 formed in a core body 946. In some aspects, the depth, width, shape, or a combination thereof of trench 944 can be tailored to generate a desired lateral burl stiffness and vacuum volume. For example, FIG. 9C shows a representative, not-to-scale illustration of the design freedom of vacuum volume (i.e., the white area) between the substrate at height level A and the substrate table at height level B, without changing the stiffness of burl 942. In some aspects, different substrate-to-substrate table distances A-B (e.g., from about 10.0 microns to over 1.0 m) can be obtained while keeping the vacuum volume substantially the same. For example, a first substrate-to-substrate table distance A-B₁ can provide substantially the same vacuum volume as a second substrate-to-substrate table distance A-B₂, where the width of trench 944 when associated with height level B₁ is greater than the width of trench 944 when associated with height level B₂.

Figure 10A:
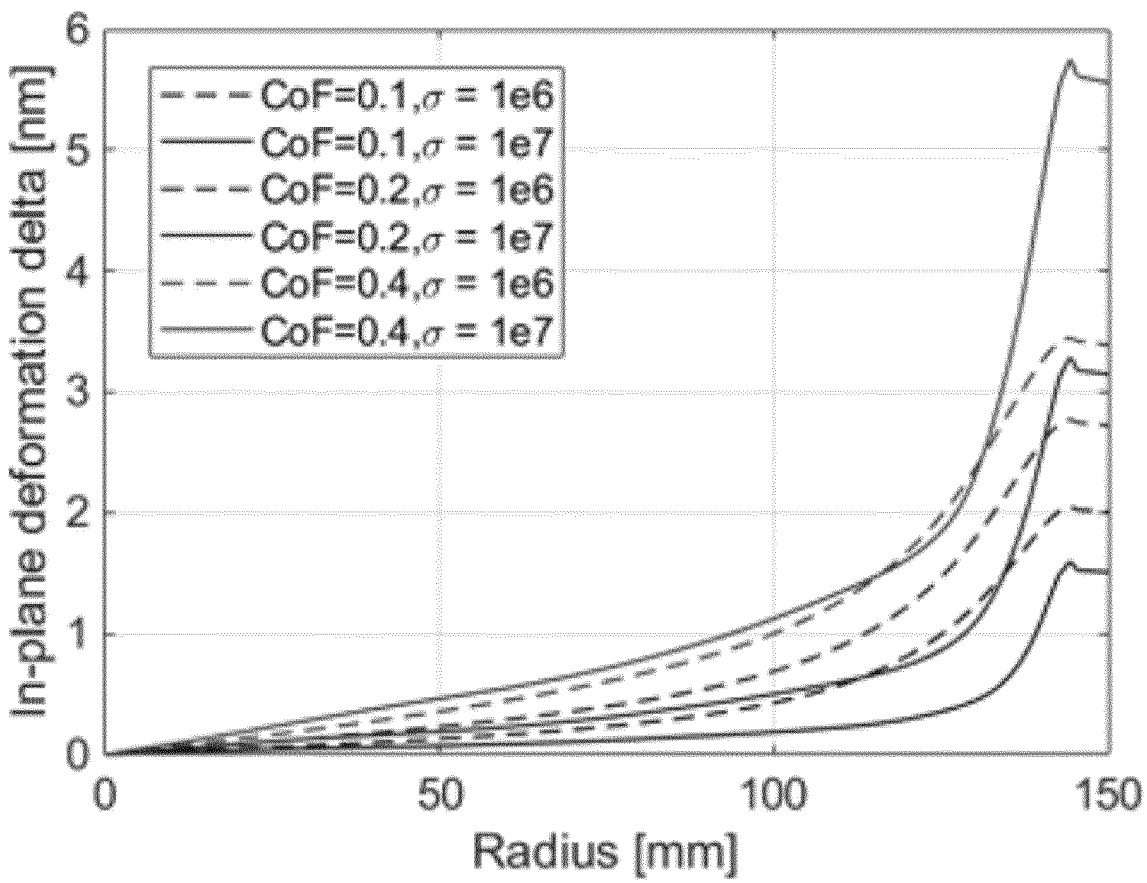
FIGS. 10A and 10B are example graphs showing example substrate in-plane deformation deltas as a function of radius for example bow and umbrella shape substrates, respectively, according to some aspects of the present disclosure.
Figure 10B:
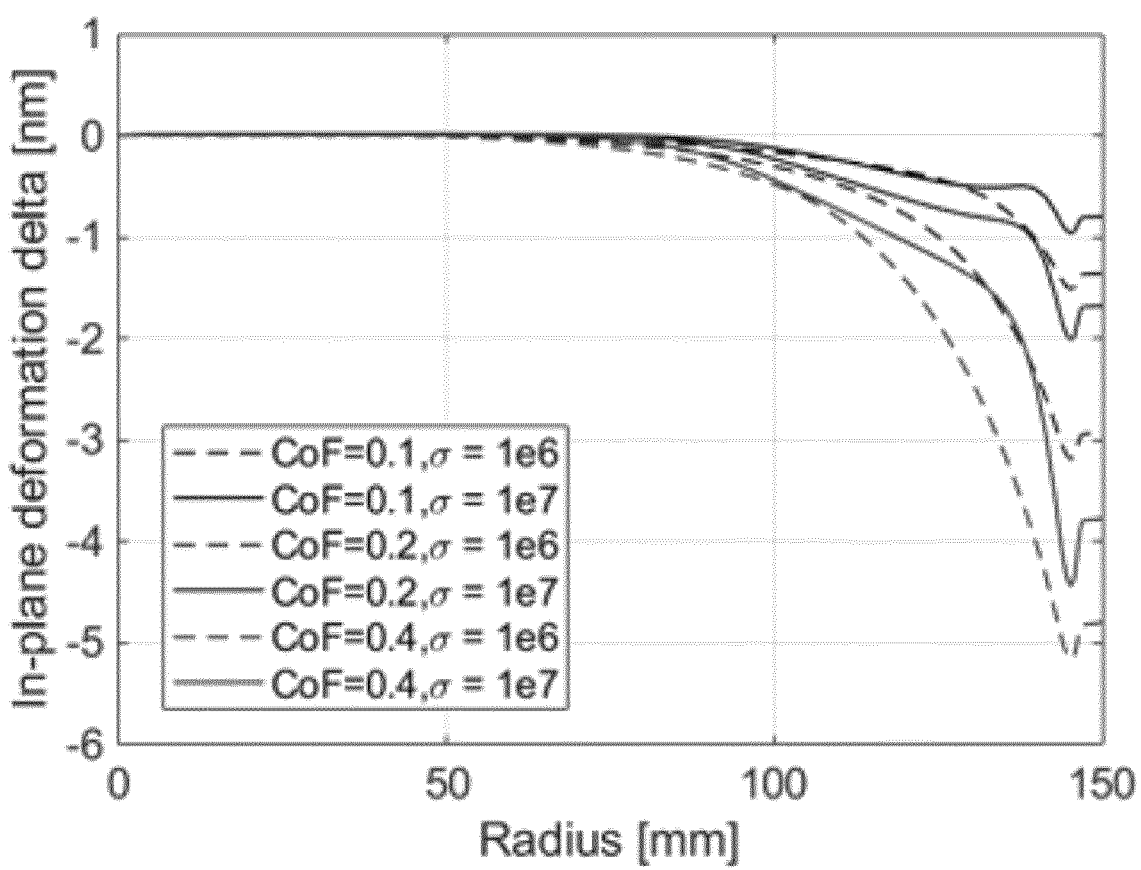

FIG. 10A is an example graph 1000 showing example substrate in-plane deformation deltas in nanometers (nm) for different coefficients of friction (CoF) and stiffnesses ($\sigma$ in units of N/m) as a function of radius in millimeters (mm) for an example 300 mm diameter wafer having a 200 micron bow shape deformation. FIG. 10B is an example graph 1020 showing example substrate in-plane deformation deltas for different coefficients of friction and stiffnesses as a function of radius for another example 300 mm diameter wafer having a 200 micron umbrella shape deformation.

Referring now to FIGS. 9D, 9E, 9F, and 9G, in some aspects, to achieve a lateral compliant burl with a high vertical stiffness (e.g., a ratio of 1000× between vertical and lateral stiffness), a slender rod shape may be used instead of a cone. However, in some aspects, such a slender rod may not withstand the external forces that can be applied on the burl. In some aspects, an "end of stroke" (e.g., the portion of the core body forming the exterior annulus of the trench surrounding a burl) can be used to prevent the burl from bending too far, causing the burl to break. In some aspects, the end of stroke may be utilized to make a lateral compliant burl robust against external forces (e.g., polishing, cleaning, handling, etc.).

In some aspects, the gap between the burl and the end of stroke of the core body can be chosen such that the burl will not touch the end of stroke during the wafer load. In some aspects, the largest displacement can occur during the load of an umbrella wafer. In some aspects, the displacement on the last burls can be approximately 0.5 um per 100 um warpage. As a result, the gap between the burl and end of stroke can be at least a few micrometers. In some aspects, the maximal deflection for a slender rod can be determined as shown in Equation 1 below:

$$\Delta x = \frac{\sigma L^2}{3 \, Ed} \qquad (1)$$

where $\sigma$ represents the yield stress and E represents the Young's modulus. For a slender rod, the ratio of vertical stiffness $C_z$ over lateral stiffness $C_{lat}$ can be defined using Euler-Bernoulli beam theory for a cantilever beam as shown in Equation 2 below:

$$\frac{C_z}{C_{lat}} = \frac{64}{12} \frac{L^2}{d^2} \qquad (2)$$

From this example of Equation 2 it follows that the dimensions of the slender rod can be chosen freely as long as the ratio L/d is about equal to 13.7.

Figure 9D:
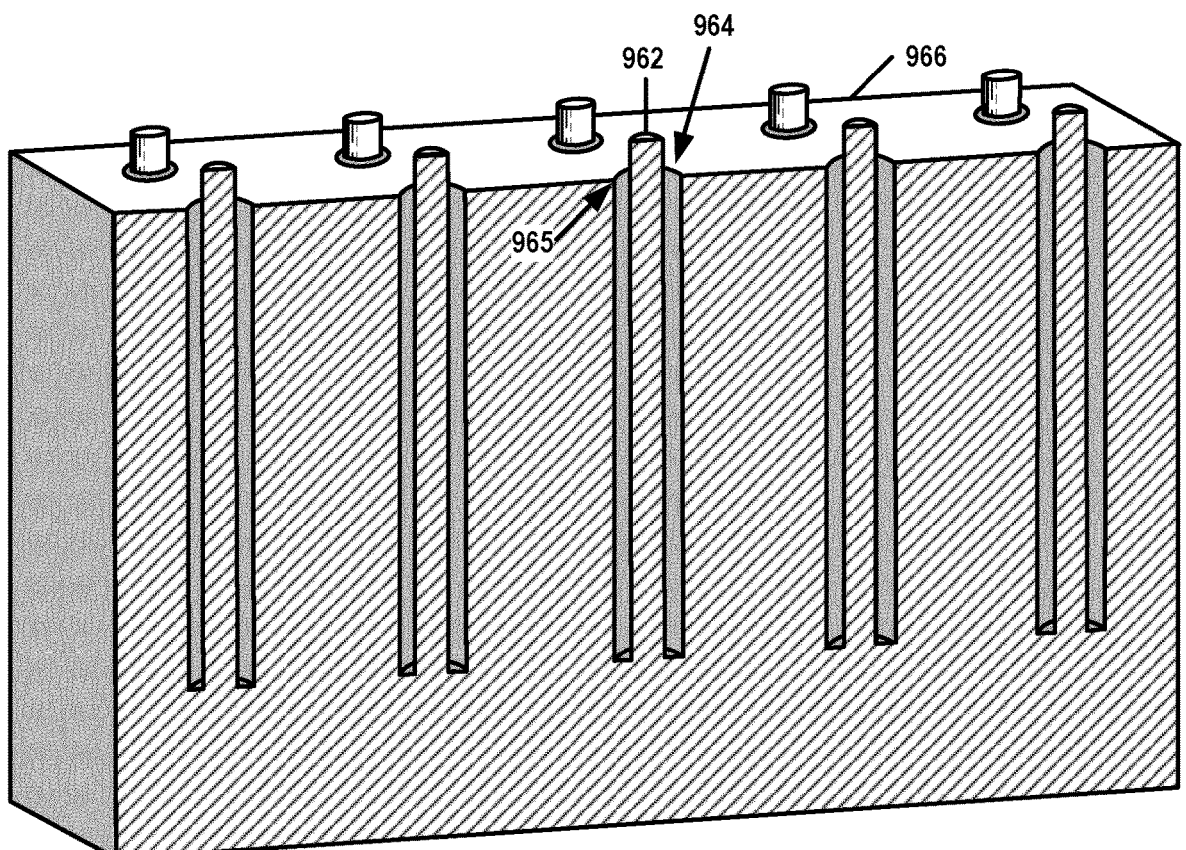

As shown in FIG. 9D, in some aspects, a perspective of a portion of an example substrate table 960 can include burls 962 (e.g., 15 burls) surrounded by trenches 964 formed in a core body 966. In some aspects, the length L of each of the burls 962 can be about 1500 um, the diameter d of each of the burls 962 can be about 110 um, and the gap between each of the burls 962 and each end of stroke 965 of the core body 966 can be about 9 um. In some aspects, each burl can have a vertical stiffness of about 7e5 N/m and a lateral stiffness of about 7e2 N/m, resulting in a vertical-to-lateral stiffness ratio of about 1000:1. In some aspects, the burls 962 can have a combined lateral stiffness of about 1e4 N/m and a combined vertical stiffness of about 1e7 N/m.

Figure 9E:
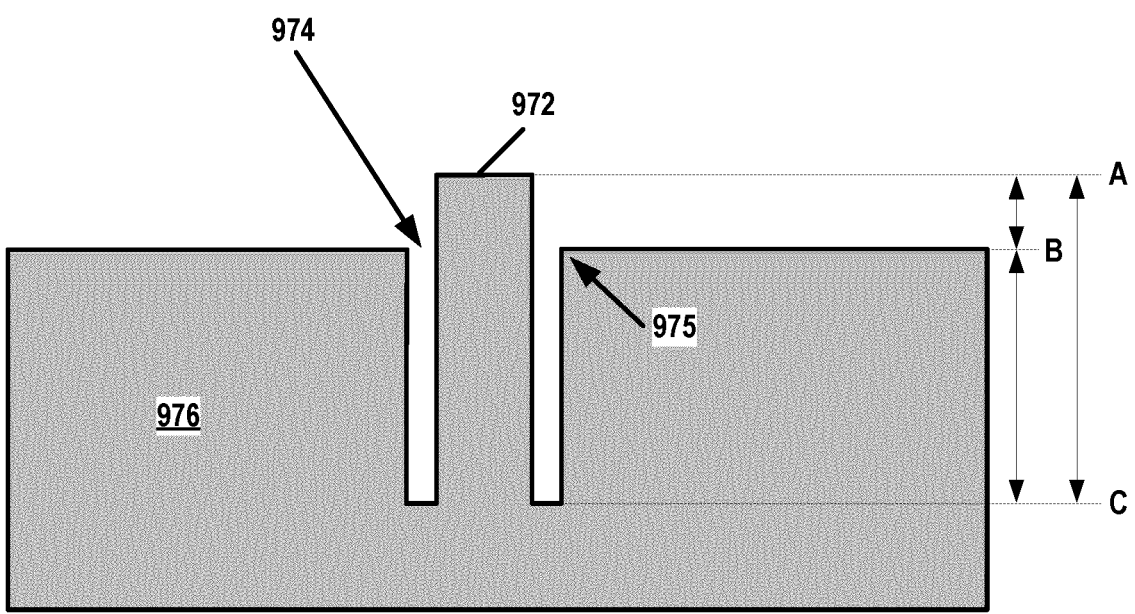

As shown in FIG. 9E, in some aspects, an example flexburl 970 can include a burl 972 surrounded by a trench 974 (e.g., a deep, narrow trench) formed in a core body 976. In some aspects, the length L of the burl 972 (e.g., distance A-C) can be about 1500 um, the diameter d of each of the burl 972 can be about 110 um, and the gap between the burl 972 and the end of stroke 975 of the core body 976 can be about 9 um. In some aspects, the burl 972 can have a vertical stiffness of about 7e5 N/m and a lateral stiffness of about 7e2 N/m, resulting in a vertical-to-lateral stiffness ratio of about 1000:1.

Figure 9F:
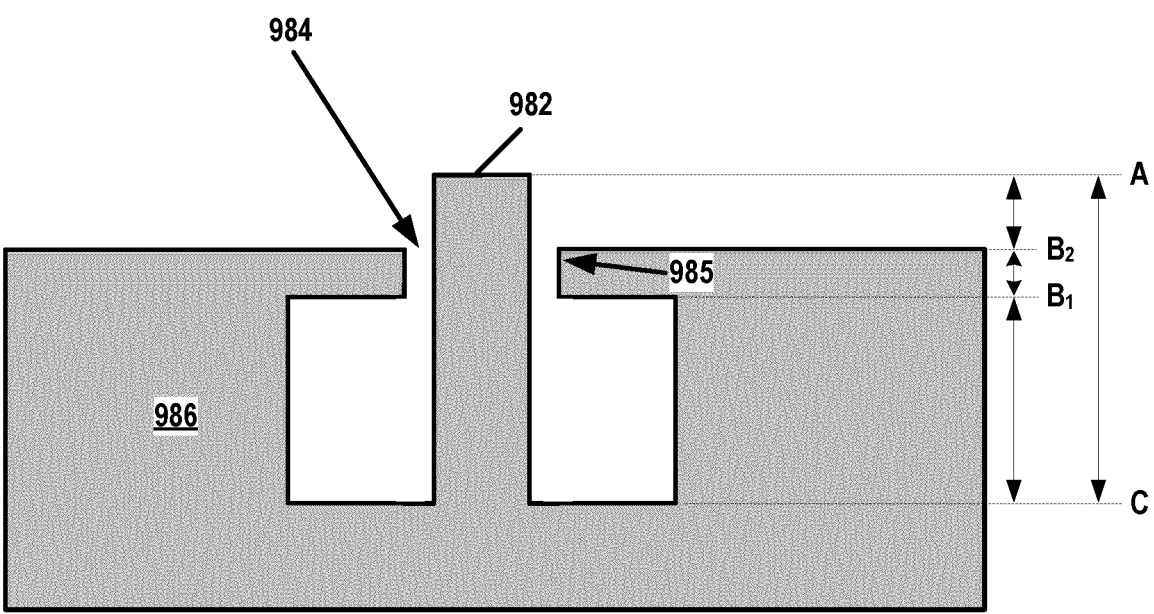

As shown in FIG. 9F, in some aspects, an example flexburl 980 can include a burl 982 surrounded by a trench 984 (e.g., a shallow, narrow trench near the surface B₂ followed by a deep, wide trench) formed in a core body 986. In some aspects, the gap between the burl 982 and the end of stroke 985 of the core body 986 can be about 9 um near the top of the burl 982 (e.g., corresponding to the distance B₂-B₁), and can be wider near the middle and bottom of the burl 982 (e.g., corresponding to the distance B₁-C).

Figure 9G:
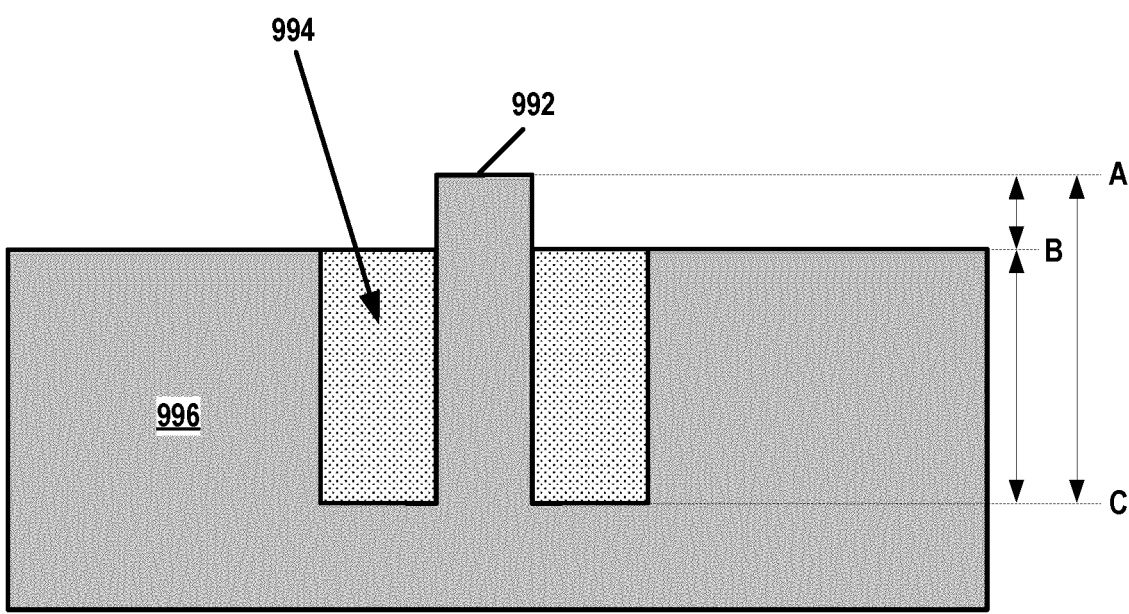

As shown in FIG. 9G, in some aspects, an example flexburl 990 can include a burl 992 surrounded by a filament 994 (e.g., a non-linear elastic filament) formed in a core body 996. In some aspects, the example flexburl 990 can be formed by (i) creating a wide trench with low tolerances around the burl 992; and (ii) filling the trench with an elastic filament. In some aspects, over the first micrometers of travel, the filament 994 can have a low stiffness. When bending the burl, the filament 994 can become compressed, which can increase the stiffness of the filament 994. In some aspects, the filament 994 can have a sufficiently non-linear elasticity to prevent the burl 992 from breaking.

In some aspects, FIGS. 10A and 10B show the one dimensional (1D) simulation results of dynamic wafer loading onto an example EUV wafer clamp. The plotted in-plane deformation can be the delta with the zero coefficient of friction (e.g., CoF=0) and shows that for more flexible burls (e.g., $\sigma$=1e6 N/m), WLG has lower spatial frequencies while the magnitude is similar to stiffer burls (e.g., $\sigma$=1e7 N/m). As a result, WLG for the more flexible burls is better correctable than for the stiffer burls. In some aspects, the results also show less dependence on the CoF.

Figure 11A:
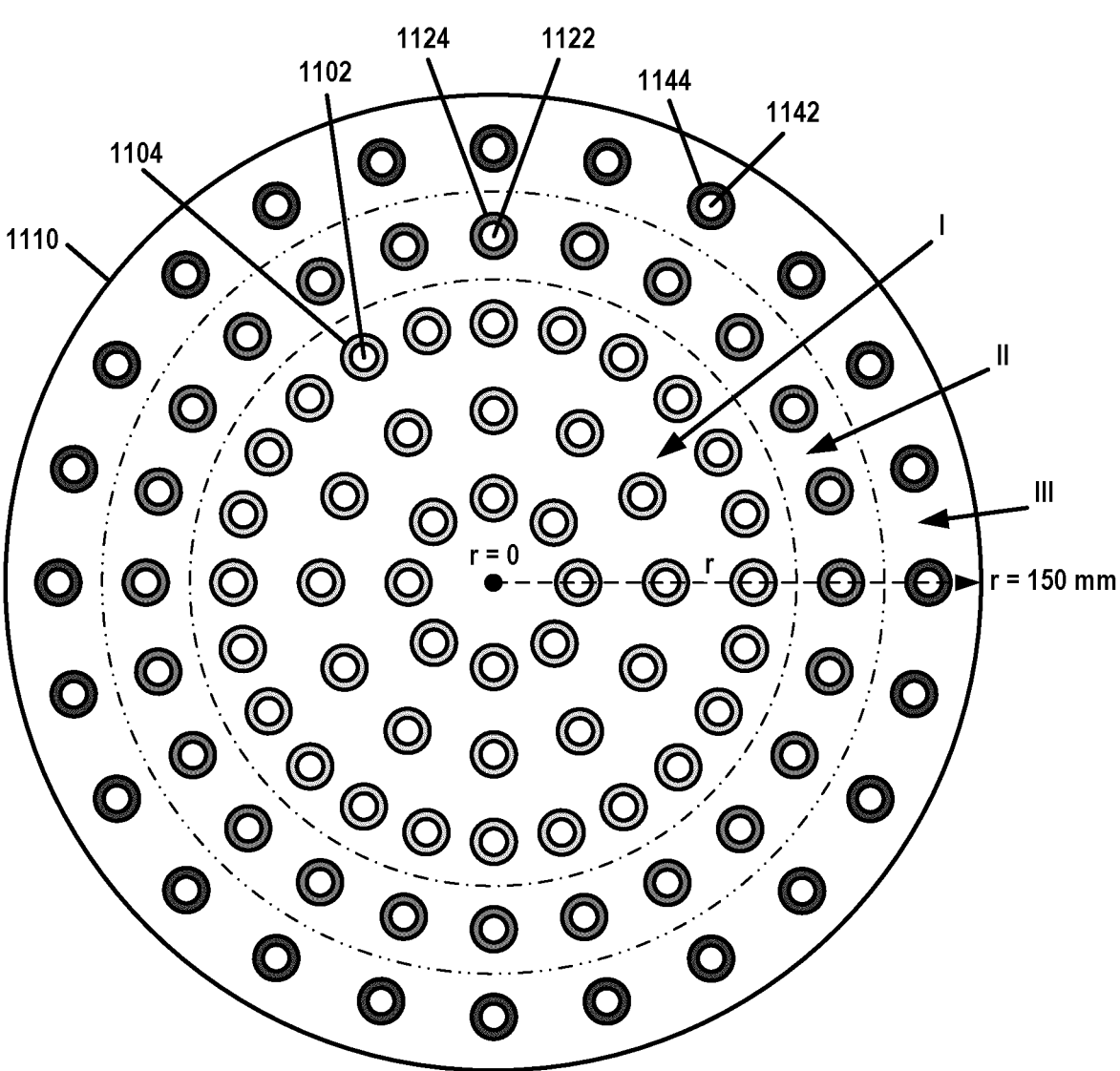
FIGS. 11A and 11B are planar and cross-sectional illustrations of an example substrate table surface including example burls surrounded by example trenches according to some aspects of the present disclosure.
Figure 11B:
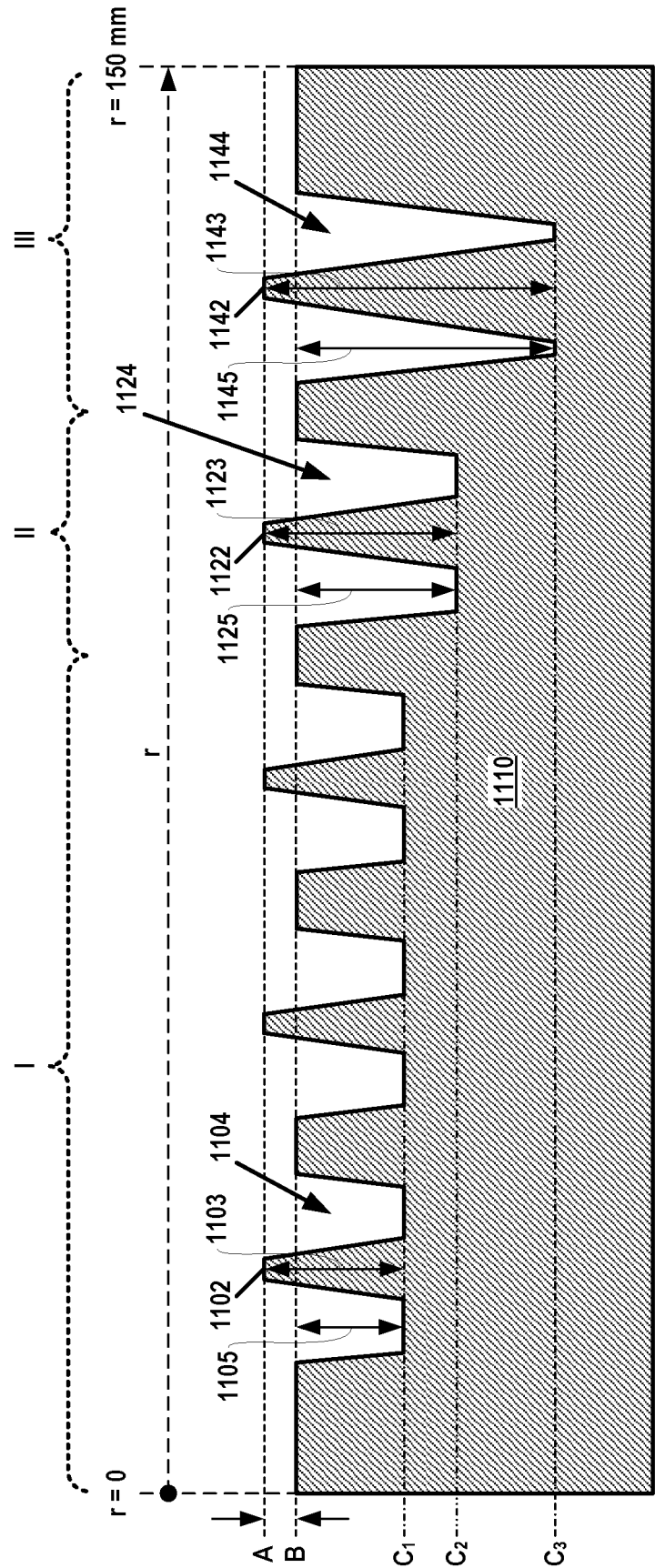

FIGS. 11A and 11B are planar and cross-sectional illustrations of an example substrate table surface including example burls surrounded by example trenches according to some aspects of the present disclosure. FIG. 11A shows a planar view (e.g., top view) of a portion of an example substrate table 1100. FIG. 11B shows a cross-section through a portion of the example substrate table 1100 from the center to the edge of core body 1110 (e.g., $0 \leq r \leq 150$ mm).

As shown in FIGS. 11A and 11B, example substrate table 1100 can include a plurality of flexburls formed in, or on, a core body 1110 (e.g., the top or bottom surface of a core body having a diameter of about 300 mm). The plurality of flexburls can include, for example, 30,000 flexburls. In some aspects, each flexburl can be about 175 microns tall and have a top diameter of about 210 microns. In some aspects, a pitch between the flexburls can be about 1.5 mm.

In some aspects, the height difference between the surface of core body 1110 and the top of each of the plurality of buds (e.g., the substrate-to-substrate table distance A-B) can be substantially constant across core body 1110, while the height difference between the bottom of each of the plurality of trenches and the top of each of the plurality of burls can vary across core body 1110. For example, the trench depth B-C can increase as the distance r increases from the center of core body 1110. As a result, in some aspects, the length and stiffness of each of the plurality of burls can vary across core body 1110 without altering the height of the tops of the plurality of burls above the surface of core body 1110. For example, the burl length A-C can increase and the burl stiffness can decrease as the distance r increases from the center of core body 1110. In other words, burls disposed in the peripheral region of core body 1110 can have greater lengths and lower stiffnesses than burls disposed in the central region of core body 1110. In some aspects, burls disposed near the periphery of core body 1110 can have lower stiffnesses so that they can be displaced using less force to follow more easily the expanding surface of a substrate due to thermal load.

In some aspects, the plurality of flexburls can include, in a first region I (e.g., a central region), a first subset of flexburls surrounded by a first subset of trenches, such as burl 1102 surrounded by trench 1104. In some aspects, the plurality of flexburls can include, in a second region II (e.g., an intermediate region), a second subset of burls surrounded by a second subset of trenches, such as burl 1122 surrounded by trench 1124. In some aspects, the plurality of flexburls can include, in a third region III (e.g., a peripheral region), a third subset of burls surrounded by a third subset of trenches, such as burl 1142 surrounded by trench 1144.

In some aspects, a depth of each of the first subset of trenches in the first region I can be less than a depth of each of the second subset of trenches in the second region II. In some aspects, a depth of each of the second subset of trenches in the second region II can be less than a depth of each of the third subset of trenches in the third region III. For example, a depth 1105 (e.g., distance B-$C_1$) of trench 1104 in the first region I can be less than a depth 1125 (e.g., distance B-$C_2$) of trench 1124 in the second region II, and depth 1125 of trench 1124 in the second region II can be less than a depth 1145 (e.g., distance B-$C_3$) of trench 1144 in the third region III.

In some aspects, a length of each of the first subset of burls in the first region I can be greater than a length of each of the second subset of burls in the second region II. In some aspects, a length of each of the second subset of burls in the second region II can be greater than a length of each of the third subset of burls in the third region III. For example, a length 1103 (e.g., distance A-$C_1$) of burl 1102 in the first region I can be greater than a length 1123 (e.g., distance A-$C_2$) of burl 1122 in the second region II, and length 1123 of burl 1122 in the second region II can be greater than a length 1143 (e.g., distance A-$C_3$) of burl 1142 in the third region III.

In some aspects, a stiffness of each of the first subset of burls in the first region I can be greater than a stiffness of each of the second subset of burls in the second region II. In some aspects, a stiffness of each of the second subset of burls in the second region II can be greater than a stiffness of each of the third subset of buds in the third region III. For example, a stiffness of burl 1102 in the first region I can be greater than a stiffness of burl 1122 in the second region II, and a stiffness of burl 1122 in the second region II can be greater than a stiffness of burl 1142 in the third region III.

Example Processes for Manufacturing an Apparatus

FIG. 12 is an example method 1200 for manufacturing an apparatus according to some aspects of the present disclosure or portion(s) thereof. The operations described with reference to example method 1200 can be performed by, or according to, any of the systems, apparatuses, components, techniques, or combinations thereof described herein, such as those described with reference to FIGS. 1-11 above and 13-17 below.

At operation 1202, the method can include forming a core body (e.g., core body 510, 610, 710, 810, 906, 1110). In some aspects, the forming of the core body can include forming at least a portion of the core body of SiSiC or SiC. In some aspects, the forming of the core body can include forming a plurality of burls on a surface of the core body. In some aspects, the plurality of burls can be configured to support an object, such as a wafer. For example, the plurality of burls can be formed on the top side of core body and configured to face the wafer during operation of an lithographic apparatus. In some aspects, the forming of the plurality of burls can include forming at least a portion of the plurality of burls of DLC, AlN, SiN, or CrN. In some aspects, the forming of the plurality of burls can include forming at least one burl of the plurality of burls to have a stiffness of less than about $10^7$ Nm$^{-1}$. In some aspects, the forming of the plurality of burls can include forming a first burl in a central region of the core body, forming a second burl in a peripheral region of the core body, forming a first trench surrounding the first burl, and forming a second trench surrounding the second burl, where a length of the second burl is greater than a length of the first burl, where a depth of the first trench is less than a depth of the second trench, and where a stiffness of the second burl is less than a stiffness of the first burl. In some aspects, the forming of the core body can include forming a trench around at least one burl of the plurality of burls. In some aspects, the forming of the core body can include forming the core body to have a stiffness greater than a stiffness of the vacuum sheet and, optionally, greater than a stiffness of the electrostatic sheet. In some aspects, the core body can be configured to connect to the vacuum sheet and the electrostatic sheet such that the plurality of burls of the core body line up with the plurality of recesses of the vacuum sheet and the plurality of apertures of the electrostatic sheet. In some aspects, the forming of the core body can be accomplished using suitable mechanical or other methods and include forming the core body in accordance with any aspect or combination of aspects described with reference to FIGS. 1-11 above and 13-17 below.

At operation 1204, the method can include forming a vacuum sheet (e.g., vacuum sheet 520, 620, 720; the combined structure of metal layer 820, compliant layer 840, and substrate 851). In some aspects, the forming of the vacuum sheet can include forming at least a portion of the vacuum sheet of fused silica. In some aspects, the forming of the vacuum sheet can include forming a plurality of vacuum connections in the vacuum sheet. In some aspects, the forming of the vacuum sheet can include forming, in a surface of the vacuum sheet, a plurality of recesses config- ured to receive the plurality of burls of the core body. In some aspects, the forming of the vacuum sheet can include forming an electrode layer including one or more electrodes on a surface of the vacuum sheet. In some aspects, the forming of electrode layer of the vacuum sheet can include forming at least a portion of the electrode layer of the vacuum sheet of Cu or CrN. In some aspects, the forming of the vacuum sheet can include forming the vacuum sheet to have a stiffness less than a stiffness of the core body and, optionally, greater than a stiffness of the electrostatic sheet. In some aspects, the vacuum sheet can be configured to connect the core body to the electrostatic sheet such that the plurality of recesses of the vacuum sheet line up with the plurality of burls of the core body and the plurality of apertures of the electrostatic sheet. In some aspects, the vacuum sheet can be configured to vacuum clamp the electrostatic sheet to the vacuum sheet in response to an application of a vacuum to the plurality of vacuum connec- tions of the vacuum sheet. In some aspects, where the vacuum sheet includes an electrode layer, the vacuum sheet can be configured to electrostatically clamp the electrostatic sheet to the vacuum sheet in response to an application of a voltage to the electrode layer of the vacuum sheet. In some aspects, the forming of the vacuum sheet can be accom- plished using suitable mechanical or other methods and include forming the vacuum sheet in accordance with any aspect or combination of aspects described with reference to FIGS. 1-11 above and 13-17 below.

At operation 1206, the method can include forming an electrostatic sheet (e.g., electrostatic sheet 530, 630, 730, 830). In some aspects, the forming of the electrostatic sheet can include forming at least a first portion of the electrostatic sheet of an electrically conductive material (e.g., one or more electrodes) and at least a second portion of the elec- trostatic sheet of a dielectric material. For example, the forming of the electrostatic sheet can include forming the electrostatic sheet to include one or more electrodes sand- wiched between two or more dielectric layers. In some aspects, the forming of the electrostatic sheet can include forming, in the electrostatic sheet, a plurality of apertures configured to receive the plurality of burls of the core body. In some aspects, the forming of the electrostatic sheet can include forming the electrostatic sheet to have a stiffness less than a stiffness of the core body and less than a stiffness of the vacuum sheet. In some aspects, the electrostatic sheet can be configured to connect to the core body using the vacuum sheet such that the plurality of apertures of the electrostatic sheet line up with the plurality of burls of the core body and the plurality of recesses of the vacuum sheet. In some aspects, the forming of the electrostatic sheet can be accomplished using suitable mechanical or other methods and include forming the electrostatic sheet in accordance with any aspect or combination of aspects described with reference to FIGS. 1-11 above and 13-17 below.

At operation 1208, the method can include mounting the electrostatic sheet to the vacuum sheet. In some aspects, the mounting of the electrostatic sheet to the vacuum sheet can include applying a vacuum to the plurality of vacuum connections of the vacuum sheet to vacuum clamp the electrostatic sheet to the vacuum sheet. In some aspects, where the vacuum sheet includes an electrode layer, the mounting of the electrostatic sheet to the vacuum sheet can include applying a voltage to the electrode layer of the vacuum sheet to electrostatically clamp the electrostatic sheet to the vacuum sheet. In some aspects, the mounting of the electrostatic sheet to the vacuum sheet can be accom- plished using suitable mechanical or other methods and include mounting the electrostatic sheet to the vacuum sheet in accordance with any aspect or combination of aspects described with reference to FIGS. 1-11 above and 13-17 below.

At operation 1210, the method can include mounting, using the vacuum sheet, the electrostatic sheet to the core body. In some aspects, the mounting of the electrostatic sheet to the core body can include applying a vacuum to the plurality of vacuum connections of the vacuum sheet to vacuum clamp the core body to the electrostatic sheet. In some aspects, where the vacuum sheet includes an electrode layer, the mounting of the electrostatic sheet to the core body can include applying a voltage to the electrode layer of the vacuum sheet to electrostatically clamp the core body to the electrostatic sheet. In some aspects, the mounting of the electrostatic sheet to the core body can include applying an adhesive material to one or more portions of the core body, the electrostatic sheet, or a combination thereof, to affix the core body to the electrostatic sheet. In some aspects, the mounting of the electrostatic sheet to the core body can be accomplished using suitable mechanical or other methods and include using the vacuum sheet to mount the electro- static sheet to the core body in accordance with any aspect or combination of aspects described with reference to FIGS. 1-11 above and 13-17 below.

Example Vacuum Assemblies

Systems, apparatuses, and methods are provided for manufacturing a substrate table using a vacuum assembly that includes a vacuum sheet, a compliant layer with burls, and a manifold. An example method can include forming a compliant layer having burls configured to support a vacuum sheet, first vacuum connections, and a first atmospheric pressure connection. Optionally, each burl can be sur- rounded, partially or wholly, by a trench. The example method can further include forming a manifold having second vacuum connections configured to line up with the first vacuum connections, and a second atmospheric pres- sure connection configured to line up with the first atmo- spheric pressure connection. The example method can fur- ther include mounting the compliant layer to the manifold and the vacuum sheet to the compliant layer. Optionally, the example method can further include using the vacuum assembly to mount a core body of the substrate table to an electrostatic sheet.

As described herein, the present disclosure describes various aspects of systems, apparatuses, and methods for manufacturing and using a substrate table having a core body and an elastomeric sheet for use in an EUV radiation system. In some aspects, the elastomeric sheet can be mounted to the core body using a vacuum assembly that includes a vacuum sheet, a compliant layer, and a manifold, where the compliant layer includes burls for supporting the vacuum sheet.

In some aspects, the present disclosure describes a sys- tem. The system can include a vacuum assembly that includes a compliant layer. The compliant layer can include a plurality of burls configured to support a vacuum sheet. The compliant layer can further include a plurality of vacuum connections.

In some aspects, at least a portion of the plurality of burls can be formed of an elastomeric material. In some aspects, at least one burl of the plurality of burls can have a stiffness of less than about 10 meganewtons per meter ($10^7$ Nm$^{-1}$). In some aspects, the plurality of burls can include a first burl having a first taper angle towards a top of the first burl and a second taper angle towards a bottom of the first burl.

In some aspects, the plurality of burls can include a first subset of burls disposed in a first region of the compliant layer and a second subset of burls disposed in a second region of the compliant layer, and a first inter-burl spacing of the first plurality of burls can be less than a second inter-burl spacing of the second subset of burls. In some aspects, the plurality of burls can be a first plurality of burls, and a first pattern of the first plurality of burls can correspond to a second pattern of a second plurality of burls disposed on a core body configured to attach to the vacuum sheet.

In some aspects, the plurality of vacuum connections can be a first plurality of vacuum connections, and the vacuum assembly can further include a manifold that includes a second plurality of vacuum connections configured to line up with the first plurality of vacuum connections. In some aspects, the compliant layer can further include a first atmospheric pressure connection, the manifold can further include a second atmospheric pressure connection configured to line up with the first atmospheric pressure connection.

In some aspects, the compliant layer can further include a plurality of trenches, and each burl of the plurality of burls can be surrounded by a respective trench of the plurality of trenches. In some aspects, the plurality of burls can include a first burl disposed in a first region of the compliant layer and a second burl disposed in a second region of the compliant layer, and a first length of the first burl can be less than a second length of the second burl. In some aspects, the plurality of trenches can include a first trench surrounding the first burl and a second trench surrounding the second burl, and a first depth of the first trench can be less than a second depth of the second trench. In some aspects, a first stiffness of the first burl can be less than a second stiffness of the second burl.

In some aspects, the present disclosure describes an apparatus such as a vacuum assembly. The apparatus can include a compliant layer that includes a plurality of burls configured to support a vacuum sheet, a first plurality of vacuum connections, and a first atmospheric pressure connection. The apparatus can further include a manifold configured to be mounted to the compliant layer and including a second plurality of vacuum connections configured to line up with the first plurality of vacuum connections, and a second atmospheric pressure connection configured to line up with the first atmospheric pressure connection. In some aspects, the apparatus can further include the vacuum sheet.

In some aspects, at least a portion of the plurality of burls can be formed of an elastomeric material. In some aspects, the plurality of burls can include a first subset of burls disposed in a first region of the compliant layer and a second subset of burls disposed in a second region of the compliant layer, and a first inter-burl spacing of the first plurality of burls can be less than a second inter-burl spacing of the second subset of burls. In some aspects, the plurality of burls can be a first plurality of burls, and a first pattern of the first plurality of burls can correspond to a second pattern of a second plurality of burls disposed on a core body configured to contact the vacuum sheet.

In some aspects, the plurality of burls can include a first burl having a first taper angle towards a top of the first burl and a second taper angle towards a bottom of the first burl. In some aspects, the compliant layer can further include a plurality of trenches, and each burl of the plurality of burls can be surrounded by a respective trench of the plurality of trenches.

In some aspects, the present disclosure describes a method for manufacturing a vacuum assembly. The method can include forming a compliant layer that includes a plurality of burls configured to support a vacuum sheet, a first plurality of vacuum connections, and a first atmospheric pressure connection. In some aspects, at least one burl can be surrounded by a trench. The method can further include forming a manifold that includes a second plurality of vacuum connections configured to line up with the first plurality of vacuum connections, and a second atmospheric pressure connection configured to line up with the first atmospheric pressure connection. The method can further include mounting the compliant layer to the manifold. In some aspects, the method can further include mounting the vacuum sheet to the compliant layer.

In some aspects, when manufacturing an example substrate table, the loading of a vacuum sheet onto a compliant layer can be a dynamic process with complex interactions between the vacuum sheet and the burls of the compliant layer combined with a time-dependent air pressure between the vacuum sheet and the compliant layer due to the locally-varying distance (e.g., volume change) between the vacuum sheet and the compliant layer. Aspects of the present disclosure provide for optimizing the behavior of vacuum pressure transients during substrate table manufacturing (e.g., when the distance between the vacuum sheet and the compliant layer is changing locally) by decoupling, or partially decoupling, the distance between the burl tops and the lowered plane height (e.g., the surface on which the burls are disposed) from the total volume between the vacuum sheet and the compliant layer without changing the general above-surface geometry of the flexburls (e.g., the height, pattern, and contact area of the burl tops). By increasing the volume beneath the surface of the compliant layer, the time for vacuum to build is increased, resulting in a slower ramp of clamping forces and less transverse loading (e.g., bending) in the vacuum sheet. Without flexburls, increases in volume can increase the distance between the burl tops and the lowered plane height, making it harder to clamp warped vacuum sheets (e.g., larger initial distance to start forming vacuum). As a result of the techniques described in the present disclosure (e.g., by using flexburls to decouple the volume from the distance between the burl tops and the lowered plane height), the compliant layer can become even more compliant so that the force applied during manufacturing can more fully conform the vacuum sheet to the substrate table while reducing transverse loading in the vacuum sheet.

In some aspects, the compliant layer of the vacuum assembly can have a patterned structure (e.g., burl pattern) which provides for fine tuning of stiffness in different functional regions of the core body. In some aspects, the compliant layer burl pattern can be tuned to minimize transverse loading (e.g., bending) in the vacuum sheet. In some aspects, the compliant layer burl pattern can be formed by laser ablation. In some aspects, the compliant layer can function as a vacuum feedthrough between the manifold and the vacuum sheet. In some aspects, the inter-burl space can be vented to atmosphere.

In some aspects, the burls on the top surface of the elastomeric compliant layer can be manufactured using a subtractive manufacturing process, such as laser ablation.

In one example, the creation of three-dimensional (3D) structures in elastomeric materials, such as burls on the surface of a compliant layer of a vacuum assembly, can involve injection molding or compression molding the material into a cavity which has the desired geometry. However, machining errors in the mold contribute to errors in the final part geometry. For example, a part which is flat on the bottom with burl structures on top would require a mold with flat-bottom holes drilled via a computer numerical control (CNC) machine. The profile tolerance of the bottom surface of the hole, which defines the plane of the burl tops, is dictated by how repeatably the CNC machine can drill to a certain location in the Z axis. Further, molding techniques are sensitive to the material's ability to flow into the features of the mold and thus can only be used to manufacture a limited number of geometric shapes.

In another example, the creation of 3D structures in elastomeric materials can involve 3D printing certain types of rubber. However, 3D printing has a very limited material selection which greatly limits the design freedom of a rubber part.

In yet another example, the creation of 3D structures in elastomeric materials can involve grinding, which requires the material to be a very firm durometer and to be flooded with liquid nitrogen during processing. However, the rubber material used for some example compliant layers may be too soft to be ground.

In contrast, the present disclosure discloses techniques for optimizing elastomeric materials for flatness and parallelism via subtractive manufacturing processes such as laser ablation. Such subtractive manufacturing techniques can optimize the manufacturing process for a blank piece of elastomeric material while being able to retroactively remove material to form sharp, intricate features with high precision. Further, such subtractive manufacturing techniques can utilize materials beyond those which can flow through an injection mold or be ground and are not limited to only geometries which are manufacturable via compression or injection molding or grinding. Further still, such subtractive manufacturing techniques can cut the compliant layer from a sheet of elastomeric material that has been manufactured in a way that optimizes flatness and parallelism.

There are many exemplary aspects to the systems, apparatuses, methods, and computer program products disclosed herein. For example, aspects of the present disclosure provide for subtractive manufacturing techniques, such as laser ablation techniques, for manufacturing compliant layers that do not require molds and thus impose no nonrecurring tooling cost or mold-fabrication lead time when making a part. As a result of the techniques described in the present disclosure, the design iteration feedback loop is drastically shortened and made less expensive.

FIGS. 13A and 13B are cross-sectional illustrations of portions of an example EUV substrate table manufacturing system 1300 according to some aspects of the present disclosure. It is to be appreciated that example EUV substrate table manufacturing system 1300 can be used in applications aside from EUV.

As shown in FIG. 13A, in some aspects, example EUV substrate table manufacturing system 1300 can include an example EUV substrate table 1301 that includes a core body 1310 and an electrostatic sheet 1330. In some aspects, example EUV substrate table manufacturing system 1300 can further include a vacuum assembly 1302 that includes a vacuum sheet 1320, a compliant layer 1340, and a manifold 1351.

In some aspects, core body 1310 can be mounted to electrostatic sheet 1330 using vacuum assembly 1302. In some aspects, the example EUV substrate table 1301 can be placed on vacuum assembly 1302 and weights 1380 (e.g., steel plates laid on core body 1310; or, in some aspects, an electro-mechanical force) can be placed on the example EUV substrate table 1301 to keep core body 1310 pressed into compliant layer 1340 while a vacuum clamping force is applied to vacuum sheet 1320 via vacuum connections 1323. In some aspects, once the manufacturing process is complete, weights 1380 can be removed from the example EUV substrate table 1301, and the example EUV substrate table 1301 can be removed from vacuum assembly 1302.

In some aspects, core body 1310 can include burls 1312 (e.g., glass burls, hard burls, flexburls, or any other suitable burls) configured to connect with vacuum sheet 1320. In some aspects, burls 1312 can be configured to support an object, such as a wafer (e.g., burls 1312 can be disposed on the top side of core body 1310 and configured to face the wafer during operation of a lithographic apparatus). In some aspects, core body 1310 can further include burls 1313 (e.g., glass burls, hard burls, flexburls, or any other suitable burls) configured to support a substrate (e.g., a weighted substrate). In some aspects, vacuum sheet 1320, compliant layer 1340, and manifold 1351 can include vacuum connections 1323. In some aspects, compliant layer 1340 and manifold 1351 can include one or more atmospheric pressure connections 1371 configured to vent the inter-burl space between burls 1372 to atmosphere. In some aspects, vacuum sheet 1320 can further include recesses (e.g., formed by etching a doughnut-shaped ring 1321 at each burl location to a depth of between about 14.00 microns+/−0.25 microns and about 20.00 microns+/−0.25 microns) configured to receive burls 1312. In some aspects, recesses can have a recess depth of between about 14.00 microns+/−0.25 microns and about 20.00 microns+/−0.25 microns. In some aspects, electrostatic sheet 1330 can include apertures configured to receive burls 1312. In some aspects, electrostatic sheet 1330 can be configured to connect to vacuum sheet 1320 such that the apertures of electrostatic sheet 1330 line up with the recesses of vacuum sheet 1320.

In some aspects, at least a portion of core body 1310 can be formed of SiSiC or SiC. In some aspects, at least a portion of burls 1312 can be formed of SiSiC, SiC, DLC, AlN, SiN, or CrN. In some aspects, at least a portion of burls 1313 can be formed of SiSiC, SiC, DLC, AlN, SiN, or CrN. In some aspects, at least a portion of vacuum sheet 1320 can be formed of fused silica. In some aspects, at least a portion of electrostatic sheet 1330 can be formed of borosilicate glass. In some aspects, at least another portion of electrostatic sheet 1330 can be formed of an electrically conductive material. In some aspects, electrostatic sheet 1330 can include one or more electrodes sandwiched between two or more dielectric layers, such as two glass wafers. In some aspects, compliant layer 1340 may be or include a flexible support structure formed of an elastomeric material such as silicone (e.g., durometer 20A silicone or another soft, low-durometer polymer), PDMS (e.g., formed using a 25:1 elastomeric-base-to-elastomeric-curing-agent mixing ratio), a fluoroelastomeric material (e.g., fluorinated hydrocarbon rubber), any other suitable material, or any combination thereof.

In some aspects, vacuum sheet 1320 can include the upper portions of vacuum connections 1323. In some aspects, compliant layer 1340 can include burls 1372 configured to support vacuum sheet 1320, the middle portions of vacuum connections 1323, and the upper portion(s) of one or more atmospheric pressure connections 1371. In some aspects, manifold 1351 can include the lower portions of vacuum connections 1323 and the lower portion(s) of one or more atmospheric pressure connections 1371. In some aspects, the middle portions of vacuum connections 1323 included in compliant layer 1340 can align (e.g., line up) with the upper and lower portions of vacuum connections 1323 included in vacuum sheet 1320 and manifold 1351, respectively. In some aspects, the upper portion of one or more atmospheric pressure connections 1371 included in compliant layer 1340 can align with the lower portions of one or more atmospheric pressure connections 1371 included in manifold 1351.

In some aspects, a stiffness of core body 1310 can be greater than a stiffness of vacuum sheet 1320, and the stiffness of vacuum sheet 1320 can be greater than a stiffness of electrostatic sheet 1330 and a stiffness of compliant layer 1340. For example, compliant layer 1340, electrostatic sheet 1330, and vacuum sheet 1320 can be flexible enough to conform to the non-flatness of core body 1310. In some aspects, a pattern of burls 1372 of compliant layer 1340 can be tuned to minimize transverse loading (e.g., bending) in vacuum sheet 1320.

In some aspects, compliant layer 1340, manifold 1351, and table 1350 can include one or more apertures (e.g. holes) for an alignment system (e.g., vision alignment system 1360a, vision alignment system 1360b) to look through to view (e.g., image, capture) an alignment mark 1325a disposed on core body 1310 and an alignment mark 1325b disposed on electrostatic sheet 1330.

In some aspects, the recesses of vacuum sheet 1320 can be formed by patterning and etching vacuum sheet 1320 based on the pattern (e.g., amount, spacing, location, etc.) of burls 1312, the pattern of the apertures of electrostatic sheet 1330, or both. Additionally or alternatively, in some aspects, the recesses of vacuum sheet 1320 can be formed by depositing a layer of metal (e.g., Cu, CrN) on vacuum sheet 1320 and then patterning and etching the deposited metal layer based on the pattern of burls 1312, the pattern of the apertures of electrostatic sheet 1330, or both.

In some aspects, the apertures of electrostatic sheet 1330 can be formed by patterning and etching electrostatic sheet 1330 based on the pattern of burls 1312, the recesses of vacuum sheet 1320, or both. In some aspects, the apertures of electrostatic sheet 1330 can be formed by drilling electrostatic sheet 1330 based on the pattern of burls 1312, the pattern of the recesses of vacuum sheet 1320, or both.

In some aspects, electrostatic sheet 1330 can be configured to be bonded to core body 1310 using adhesive structures 1334 (e.g., glue dots applied to electrostatic sheet 1330).

In some aspects, vacuum sheet 1320 can be configured to vacuum clamp electrostatic sheet 1330, core body 1310, or both to vacuum sheet 1320 in response to an application of a vacuum to vacuum connections 1323 of vacuum sheet 1320, compliant layer 1340, and manifold 1351. Additionally or alternatively, in some aspects, vacuum sheet 1320 can include an electrode layer (e.g., Cu or CrN), and vacuum sheet 1320 can be configured to electrostatically clamp electrostatic sheet 1330, core body 1310, or both to vacuum sheet 1320 in response to an application of a voltage to the electrode layer of vacuum sheet 1320. In some aspects, electrostatic sheet 1330 and vacuum sheet 1320 can be connected to core body 1310 such that vacuum sheet 1320 and electrostatic sheet 1330 conform to the non-flatness of core body 1310.

In some aspects, vacuum sheet 1320 can be connected to electrostatic sheet 1330 and core body 1310 such that the apertures of electrostatic sheet 1330 and burls 1312 of core body 1310 line up with the recesses of vacuum sheet 1320. In some aspects, vacuum sheet 1320, electrostatic sheet

1330, or both can include e-pin holes configured to receive e-pins 1370. In some aspects, vacuum sheet 1320 can be further connected to electrostatic sheet 1330 and core body 1310 such that a subset of the e-pin holes line up with e-pins 1370.

FIG. 13B illustrates some example features of compliant layer 1340. As shown in FIG. 13B, compliant layer 1340 can include burls 1372 formed on compliant layer 1340. In some aspects, burls 1372 can be configured to support vacuum sheet 1320. For example, burls 1372 can be formed on the top side of compliant layer 1340 and configured to face the bottom side of the vacuum sheet. In some aspects, burls 1372 can be formed of an elastomeric material such as silicone, PDMS, a fluoroelastomeric material, any other suitable material, or any combination thereof. In some aspects, burls 1372 can be formed by laser ablation (or using another suitable subtractive manufacturing process) of the top surface of compliant layer 1340. In some aspects, burls 1372 can have a stiffness of less than about $10^7$ Nm$^{-1}$. In some aspects, burls 1372 can be formed in accordance with a pattern that corresponds to burls 1312 disposed on core body 1310.

In some aspects, a first subset 1372a of burls 1372 can have a first inter-burl spacing in a central region VI of compliant layer 1340, a second subset 1372b of burls 1372 can have a second inter-burl spacing in a near-intermediate region VII of compliant layer 1340, a third subset 1372c of buds 1372 can have a third inter-burl spacing in a far-intermediate region VIII of compliant layer 1340, a fourth subset 1372d of burls 1372 (or alternatively, no burls) can have a fourth inter-burl spacing in a peripheral region IX of compliant layer 1340, where "first inter-burl spacing<second inter-burl spacing<third inter-burl spacing<fourth inter-burl spacing," such that the burls 1372 are denser near the center of compliant layer 1340 and sparser near the periphery of compliant layer 1340. Alternatively, in some aspects, compliant layer 1340 can have very few or no burls in peripheral region IX.

In some aspects, one or more of burls 1372 can be flexburls, tapered, or both as described herein. In some aspects, the inter-burl space between burls 1372 can be vented to atmosphere by one or more atmospheric pressure connections 1371.

FIG. 14 is a cross-sectional illustration of portions of another example EUV substrate table manufacturing system 1400 according to some aspects of the present disclosure. It is to be appreciated that example EUV substrate table manufacturing system 1400 can be used in applications aside from EUV.

In some aspects, example EUV substrate table manufacturing system 1400 can include an example EUV substrate table 1401 that includes a core body 1410 and an electrostatic sheet 1430. In some aspects, example EUV substrate table manufacturing system 1400 can further include a vacuum assembly 1402 that includes a metal layer 1420 formed on a compliant layer 1440 mounted on a manifold 1451.

In some aspects, core body 1410 can be mounted to electrostatic sheet 1430 using vacuum assembly 1402. In some aspects, the example EUV substrate table 1401 can be placed on vacuum assembly 1402 and weights 1480 (e.g., steel plates laid on core body 1410; or, in some aspects, an electro-mechanical force) can be placed on the example EUV substrate table 1401 to keep core body 1410 pressed into compliant layer 1440 while a vacuum clamping force is applied to metal layer 1420 via vacuum connections 1423. In some aspects, the force exerted by weights 1480 can be adjusted to modify the height of metal layer 1420. In some aspects, once the manufacturing process is complete, weights 1480 can be removed from the example EUV substrate table 1401, and the example EUV substrate table 1401 can be removed from vacuum assembly 1402.

In some aspects, core body 1410 can include burls 1412 (e.g., glass burls, hard burls, flexburls, or any other suitable burls) configured to connect with compliant layer 1440. In some aspects, burls 1412 can be configured to support an object, such as a wafer (e.g., burls 1412 can be disposed on the top side of core body 1410 and configured to face the wafer during operation of a lithographic apparatus). In some aspects, core body 1410 can further include burls 1413 (e.g., glass burls, hard burls, flexburls, or any other suitable burls) configured to support a substrate (e.g., a weighted substrate).

In some aspects, manifold 1451 can include the lower portions of vacuum connections 1423 (e.g., formed by patterning and etching, or any other suitable technique or combination of techniques). In some aspects, compliant layer 1440 can include the upper portions of vacuum connections 1423 (e.g., formed by patterning and etching, or any other suitable technique or combination of techniques) that are configured to line up with the lower portions of vacuum connections 1423 of manifold 1451.

In some aspects, metal layer 1420 can include apertures (e.g., formed by patterning metal layer 1420 to form doughnut-shaped metal rings, where each doughnut-shaped metal ring surrounds a respective burl and has a height of between about 14.00 microns+/−0.25 microns and about microns+/−0.25 microns) configured to receive burls 1412. In some aspects, the apertures of metal layer 1420 can be formed by depositing a layer of metal (e.g., Cu, CrN) on compliant layer 1440 and then patterning and etching the deposited metal layer based on the pattern (e.g., amount, spacing, location, etc.) of burls 1412, the pattern of the apertures of electrostatic sheet 1430, or both.

In some aspects, electrostatic sheet 1430 can include apertures configured to receive burls 1412. In some aspects, electrostatic sheet 1430 can be configured to connect to metal layer 1420 such that the apertures of electrostatic sheet 1430 line up with the apertures of metal layer 1420. In some aspects, the apertures of electrostatic sheet 1430 can be formed by patterning and etching electrostatic sheet 1430 based on the pattern of burls 1412, the pattern of the apertures of metal layer 1420, or both. In some aspects, the apertures of electrostatic sheet 1430 can be formed by drilling electrostatic sheet 1430 based on the pattern of burls 1412, the pattern of the apertures of metal layer 1420, or both.

In some aspects, at least a portion of core body 1410 can be formed of SiSiC. In some aspects, at least a portion of burls 1412 can be formed of DLC, AlN, SiN, or CrN. In some aspects, at least a portion of burls 1413 can be formed of DLC, AlN, SiN, or CrN. In some aspects, at least a portion of metal layer 1420 can be formed of Cu or CrN. In some aspects, at least a portion of electrostatic sheet 1430 can be formed of borosilicate glass. In some aspects, at least another portion of electrostatic sheet 1430 can be formed of an electrically conductive material. In some aspects, electrostatic sheet 1430 can include one or more electrodes sandwiched between two or more dielectric layers, such as two glass wafers. In some aspects, compliant layer 1440 may be or include a flexible support structure formed of an elastomeric material such as silicone, PDMS, a fluoroelastomeric material, any other suitable material, or any combination thereof. In some aspects, at least a portion of manifold 1451 can be formed of fused silica. In some aspects, manifold 1451 may be any suitable substrate, such as a glass wafer.

In some aspects, a stiffness of core body 1410 can be greater than a stiffness of electrostatic sheet 1430. In some aspects, a stiffness of core body 1410 can be greater than a stiffness of compliant layer 1440. For example, electrostatic sheet 1430, compliant layer 1440, or both can be flexible enough to conform to the non-flatness of core body 1410. In some aspects, electrostatic sheet 1430 can be configured to be bonded to core body 1410 using adhesive structures 1434 (e.g., glue dots applied to electrostatic sheet 1430).

In some aspects, manifold 1451 can be configured to vacuum clamp electrostatic sheet 1430, core body 1410, or both to metal layer 1420, compliant layer 1440, and manifold 1451 in response to an application of a vacuum to vacuum connections 1423 of manifold 1451. Additionally or alternatively, in some aspects, metal layer 1420 can be configured to electrostatically clamp electrostatic sheet 1430, core body 1410, or both to metal layer 1420, compliant layer 1440, and manifold 1451 in response to an application of a voltage to metal layer 1420. In some aspects, electrostatic sheet 1430, metal layer 1420, compliant layer 1440, and manifold 1451 can be connected to core body 1410 such that compliant layer 1440 and electrostatic sheet 1430 conform to the non-flatness of core body 1410.

In some aspects, metal layer 1420 and compliant layer 1440 can be connected to electrostatic sheet 1430 and core body 1410 such that the apertures of electrostatic sheet 1430 and burls 1412 of core body 1410 line up with the apertures of metal layer 1420. In some aspects, electrostatic sheet 1430, compliant layer 1440, manifold 1451, or a combination thereof can include e-pin holes configured to receive e-pins 1470. In some aspects, metal layer 1420 and compliant layer 1440 can be further connected to electrostatic sheet 1430 and core body 1410 such that a subset of the e-pin holes line up with e-pins 1470.

FIGS. 15A, 15B, and 15C are cross-sectional illustrations of example burls surrounded by example trenches, referred to herein as "flexburls," according to some aspects of the present disclosure. In some aspects the example flexburls shown in FIGS. 15A, 15B, and 15C can be incorporated into any of the example substrate tables disclosed herein, such as on the top surface of an example compliant layer.

As shown in FIG. 15A, in some aspects, an example flexburl 1500 can include a burl 1502 surrounded by a trench 1504 formed in a compliant layer 1506. In some aspects, trench 1504 can be formed around burl 1502 using e.g., using deep reactive-ion etching (DRIE), laser ablation, powder blasting, chemical etching, or another suitable technique. In some aspects, trench 1504 can be etched directly into compliant layer 1506, into one or more layers disposed on compliant layer 1506, or a combination thereof. In some aspects, one or more portions of burl 1502 can be formed of an elastomeric material such as silicone (e.g., durometer 20A silicone or another soft, low-durometer polymer), PDMS (e.g., formed using a 25:1 elastomeric-base-to-elastomeric-curing-agent mixing ratio), a fluoroelastomeric material (e.g., fluorinated hydrocarbon rubber), any other suitable material, or any combination thereof. In some aspects, burl 1502 can have a top diameter of about 100 microns to around 500 microns. For example, burl 1502 can have a top diameter of about 210 microns. In some aspects, burl 1502 can have a stiffness of less than about $10^7$ Nm$^{-1}$.

As shown in FIG. 15B, in some aspects, an example flexburl 1520 can include a burl 1522 surrounded by a trench 1524 formed in a compliant layer 1526. In some aspects, the top of burl 1522 can be disposed at about a height level A, the non-burl surface of compliant layer 1526 can be disposed at about a height level B, and the bottom of trench 1524 can be disposed at about a height level C. In some aspects, burl 1522 can have a profile f(z) as a function of height z that can be optimized for stiffness and robustness while satisfying requirements on burl top contact area and volume footprint. In some aspects, the profile f(z) can increase the burl width towards the bottom of burl 1522 (e.g., height level C), and decrease the burl width towards the top of burl 1522 (e.g., height level A). In one illustrative and non-limiting example, burl 1522 can have a first taper angle $\alpha_1$ towards the top of burl 1522 and a second taper angle $\alpha_2$ towards the bottom of burl 1522, where the first taper angle $\alpha_1$ is different from the second taper angle $\alpha_2$. In some aspects, one or more portions of burl 1522 can have a profile f(z) that includes one or more discrete steps (e.g., rather than a continuous taper angle).

In some aspects, the vacuum-sheet-to-compliant-layer distance A-B can range from about 10.0 microns to over 1.0 mm). In some aspects, the length of burl 1522 (e.g., distance A-C) can range from about 10.0 microns to over 1.0 mm (e.g., from about 100 microns to about 2.5 mm). In some aspects, the depth of trench 1544 (e.g., distance B-C) can range from about 50.0 microns to over 1.0 mm (e.g., from about 100 microns to about 2.5 mm). In one illustrative and non-limiting example, the vacuum-sheet-to-compliant-layer distance A-B can be about 10 microns, the height of burl 1522 (e.g., distance A-C) can be about 100 microns, and the depth of trench 1524 (e.g., distance B-C) can be about 150 microns.

As shown in FIG. 15C, in some aspects, an example flexburl 1540 can include a burl 1542 surrounded by a trench 1544 formed in a compliant layer 1546. In some aspects, the depth, width, shape, or a combination thereof of trench 1544 can be tailored to generate a desired lateral burl stiffness and vacuum volume. For example, FIG. 15C shows a representative, not-to-scale illustration of the design freedom of vacuum volume (i.e., the white area) between the substrate at height level A and the substrate table at height level B, without changing the stiffness of burl 1542. In some aspects, different vacuum-sheet-to-compliant-layer distances A-B (e.g., from about 10.0 microns to over 1.0 m) can be obtained while keeping the vacuum volume substantially the same. For example, a first vacuum-sheet-to-compliant-layer distance A-B$_1$ can provide substantially the same vacuum volume as a second vacuum-sheet-to-compliant-layer distance A-B$_2$, where the width of trench 1544 when associated with height level B$_1$ is greater than the width of trench 1544 when associated with height level B$_2$.

FIGS. 16A and 16B are planar and cross-sectional illustrations of an example substrate table surface including example burls surrounded by example trenches according to some aspects of the present disclosure. FIG. 16A shows a planar view (e.g., top view) of a portion of an example vacuum assembly 1600. FIG. 16B shows a cross-section through a portion of the example vacuum assembly 1600 from the center to the edge of compliant layer 1610 (e.g., $0 \leq r \leq 150$ mm).

As shown in FIGS. 16A and 16B, example vacuum assembly 1600 can include flexburls formed in, or on, a compliant layer 1610 (e.g., the top or bottom surface of a compliant layer such as compliant layer 1340 described with reference to FIGS. 13A and 13B). The flexburls can include, for example, 30,000 flexburls. In some aspects, each flexburl can be about 175 microns tall and have a top diameter of about 210 microns. In some aspects, a pitch between the flexburls can be about 1.5 mm.

In some aspects, the height difference between the surface of compliant layer 1610 and the top of each of the burls (e.g., the vacuum-sheet-to-compliant-layer distance A-B) can be substantially constant across compliant layer 1610, while the height difference between the bottom of each of the trenches and the top of each of the burls can vary across compliant layer 1610. For example, the trench depth B-C can increase as the distance r increases from the center of compliant layer 1610. As a result, in some aspects, the length and stiffness of each of the burls can vary across compliant layer 1610 without altering the height of the tops of the burls above the surface of compliant layer 1610. For example, the burl length A-C can increase and the burl stiffness can decrease as the distance r increases from the center of compliant layer 1610. In other words, burls disposed in the peripheral region of compliant layer 1610 can have greater lengths and lower stiffnesses than burls disposed in the central region of compliant layer 1610. In some aspects, burls disposed near the periphery of compliant layer 1610 can have lower stiffnesses so that they can be displaced using less force to follow more easily the expanding surface of a substrate due to thermal load.

In some aspects, the flexburls can include, in a central region XI, a first subset of flexburls surrounded by a first subset of trenches, such as burl 1602 surrounded by trench 1604. In some aspects, the flexburls can include, in an intermediate region XII, a second subset of burls surrounded by a second subset of trenches, such as burl 1622 surrounded by trench 1624. In some aspects, the flexburls can include, in a peripheral region XIII, a third subset of burls surrounded by a third subset of trenches, such as burl 1642 surrounded by trench 1644.

In some aspects, a depth of each of the first subset of trenches in the central region XI can be less than a depth of each of the second subset of trenches in the intermediate region XII. In some aspects, a depth of each of the second subset of trenches in the intermediate region XII can be less than a depth of each of the third subset of trenches in the peripheral region XIII. For example, a depth 1605 (e.g., distance B-C$_1$) of trench 1604 in the central region XI can be less than a depth 1625 (e.g., distance B-C$_2$) of trench 1624 in the intermediate region XII, and depth 1625 of trench 1624 in the intermediate region XII can be less than a depth 1645 (e.g., distance B-C$_3$) of trench 1644 in the peripheral region XIII.

In some aspects, a length of each of the first subset of burls in the central region XI can be greater than a length of each of the second subset of burls in the intermediate region XII. In some aspects, a length of each of the second subset of burls in the intermediate region XII can be greater than a length of each of the third subset of burls in the peripheral region XIII. For example, a length 1603 (e.g., distance A-C$_1$) of burl 1602 in the central region XI can be greater than a length 1623 (e.g., distance A-C$_2$) of burl 1622 in the intermediate region XII, and length 1623 of burl 1622 in the intermediate region XII can be greater than a length 1643 (e.g., distance A-C$_3$) of burl 1642 in the peripheral region XIII.

In some aspects, a stiffness of each of the first subset of burls in the central region XI can be greater than a stiffness of each of the second subset of burls in the intermediate region XII. In some aspects, a stiffness of each of the second subset of burls in the intermediate region XII can be greater than a stiffness of each of the third subset of burls in the peripheral region XIII. For example, a stiffness of burl 1602 in the central region XI can be greater than a stiffness of burl 1622 in the intermediate region XII, and a stiffness of burl 1622 in the intermediate region XII can be greater than a stiffness of burl 1642 in the peripheral region XIII.

Example Processes for Manufacturing an Apparatus

FIG. 17 is an example method 1700 for manufacturing an apparatus according to some aspects of the present disclosure or portion(s) thereof. The operations described with reference to example method 1700 can be performed by, or according to, any of the systems, apparatuses, components, techniques, or combinations thereof described herein, such as those described with reference to FIGS. 1-16 above.

At operation 1702, the method can include forming a core body (e.g., core body 1310, 1410). In some aspects, the forming of the core body can be accomplished using suitable mechanical or other methods and include forming the core body in accordance with any aspect or combination of aspects described with reference to FIGS. 1-16 above.

In some aspects, the forming of the core body can include forming at least a portion of the core body of SiSiC or SiC. In some aspects, the forming of the core body can include forming burls (e.g., burls 1312, 1313, 1412, 1413, 1500, 1502, 1520, 1522, 1540, 1542, 1602, 1622, 1642) on a surface of the core body. In some aspects, the burls can be configured to support an object, such as a wafer. For example, the burls can be formed on the top side of the core body and configured to face the wafer during operation of a lithographic apparatus. In some aspects, the forming of the burls can include forming at least a portion of the burls of DLC, AlN, SiN, or CrN. In some aspects, the forming of the burls can include forming at least one burl to have a stiffness of less than about $10^7$ $Nm^{-1}$.

In some aspects, the forming of the core body can include forming a trench (e.g., trench 1504, 1524, 1544, 1604, 1624, 1644) around at least one burl. In some aspects, the forming of the burls can include forming a first burl in a central region (e.g., central region XI shown in FIGS. 16A and 16B) of the core body, forming a second burl in a peripheral region (e.g., intermediate region XIII shown in FIGS. 16A and 16B) of the core body, forming a first trench surrounding the first burl, and forming a second trench surrounding the second burl, where a length of the second burl is greater than a length of the first burl, where a depth of the first trench is less than a depth of the second trench, and where a stiffness of the second burl is less than a stiffness of the first burl. In some aspects, the forming of the core body can include forming the core body to have a stiffness greater than a stiffness of the vacuum sheet and, optionally, greater than a stiffness of the electrostatic sheet. In some aspects, the core body can be configured to connect to the vacuum sheet and the electrostatic sheet such that the burls of the core body line up with the recesses of the vacuum sheet and the apertures of the electrostatic sheet.

At operation 1704, the method can include forming a vacuum assembly (e.g., vacuum assembly 1302, 1402) that includes a vacuum sheet (e.g., vacuum sheet 1320; or metal layer 1420), a compliant layer (e.g., compliant layer 1340, 1440, 1506, 1526, 1546, 1610), and a manifold (e.g., manifold 1351, 1451). In some aspects, the forming of the vacuum assembly can be accomplished using suitable mechanical or other methods and include forming the vacuum assembly in accordance with any aspect or combination of aspects described with reference to FIGS. 1-16 above.

In some aspects, the forming of the vacuum sheet of the vacuum assembly can include forming at least a portion of the vacuum sheet of fused silica. In some aspects, the forming of the vacuum sheet can include forming vacuum connections in the vacuum sheet. In some aspects, the forming of the vacuum sheet can include forming, in a surface of the vacuum sheet, recesses configured to receive the burls of the core body. In some aspects, the forming of the vacuum sheet can include forming an electrode layer including one or more electrodes on a surface of the vacuum sheet. In some aspects, the forming of electrode layer of the vacuum sheet can include forming at least a portion of the electrode layer of the vacuum sheet of Cu or CrN. In some aspects, the forming of the vacuum sheet can include forming the vacuum sheet to have a stiffness less than a stiffness of the core body and, optionally, greater than a stiffness of the electrostatic sheet. In some aspects, the vacuum sheet can be configured to connect the core body to the electrostatic sheet such that the recesses of the vacuum sheet line up with the burls of the core body and the apertures of the electrostatic sheet. In some aspects, the vacuum sheet can be configured to vacuum clamp the electrostatic sheet to the vacuum sheet in response to an application of a vacuum to the vacuum connections of the vacuum sheet. In some aspects, where the vacuum sheet includes an electrode layer, the vacuum sheet can be configured to electrostatically clamp the electrostatic sheet to the vacuum sheet in response to an application of a voltage to the electrode layer of the vacuum sheet.

In some aspects, the forming of the compliant layer of the vacuum assembly can include forming the compliant layer of an elastomeric material such as silicone, PDMS, a fluoroelastomeric material, any other suitable material, or any combination thereof. In some aspects, the forming of the compliant layer can include forming burls (e.g., burls 1372, 1500, 1502, 1520, 1522, 1540, 1542, 1602, 1622, 1642) on a surface of the compliant layer. In some aspects, the burls can be configured to support the vacuum sheet. For example, the burls can be formed on the top side of the compliant layer and configured to face the bottom side of the vacuum sheet. In some aspects, the forming of the burls can include forming at least a portion of the burls of an elastomeric material such as silicone, PDMS, a fluoroelastomeric material, any other suitable material, or any combination thereof. In some aspects, the forming of the burls can include forming at least a portion of the burls by laser ablation of the top surface of the compliant layer. In some aspects, the forming of the burls can include forming at least one burl to have a stiffness of less than about $10^7$ $Nm^{-1}$. In some aspects, the forming of the burls can include forming the burls in accordance with a pattern that corresponds to burls (e.g., burls 1312) disposed on the core body. In some aspects, the forming of the burls can include forming a first subset of burls having a first inter-burl spacing in a first region (e.g., central region VI shown in FIG. 13B; central region XI shown in FIGS. 16A and 16B) of the compliant layer, forming a second subset of burls having a second inter-burl spacing in a second region (e.g., peripheral region IX shown in FIG. 13B; peripheral region XIII shown in FIGS. 16A and 16B) of the compliant layer, where the first inter-burl spacing of the first plurality of burls is less than the second inter-burl spacing of the second subset of burls (e.g., the burls are denser in the central region and sparser in the peripheral region).

In some aspects, the forming of the compliant layer can include forming (e.g., by laser ablation) a trench (e.g., trench 1504, 1524, 1544, 1604, 1624, 1644) around at least one burl. In some aspects, the forming of the burls can include forming at least one burl having a first taper angle towards a top of the burl (e.g., first taper angle $\alpha_1$ towards the top of

US 12,560,872 B2

43 burl 1522) and a second taper angle towards a bottom of the burl (e.g., second taper angle $\alpha_2$ towards the bottom of burl 1522). In some aspects, the forming of the burls can include forming a first burl in a central region (e.g., central region VI shown in FIG. 13B; central region XI shown in FIGS. 16A and 16B) of the compliant layer, forming a second burl in a peripheral region (e.g., peripheral region IX shown in FIG. 13B; peripheral region XIII shown in FIGS. 16A and 16B) of the compliant layer, forming a first trench surrounding the first burl, and forming a second trench surrounding the second burl, where a length of the second burl is greater than a length of the first burl, where a depth of the first trench is less than a depth of the second trench, and where a stiffness of the second burl is less than a stiffness of the first burl.

In some aspects, the forming of the compliant layer can further include forming (e.g., by laser ablation) a first plurality of vacuum connections (e.g., the upper portions of vacuum connections 1323, 1423) that pass through the compliant layer. In some aspects, the forming of the compliant layer can further include forming (e.g., by laser ablation) a first atmospheric pressure connection (e.g., the upper portion of one or more atmospheric pressure connections 1371) that passes through the compliant layer.

In some aspects, the forming of the manifold of the vacuum assembly can include forming the manifold of any suitable material, such as one or more of the materials disclosed herein. In some aspects, the forming of the manifold can further include forming (e.g., by laser ablation) a second plurality of vacuum connections (e.g., the lower portions of vacuum connections 1323, 1423) that pass through the manifold. In some aspects, the forming of the manifold can further include forming (e.g., by laser ablation) a second atmospheric pressure connection (e.g., the lower portion of one or more atmospheric pressure connections 1371) that passes through the manifold.

At operation 1706, the method can include forming an electrostatic sheet (e.g., electrostatic sheet 1330, 1430). In some aspects, the forming of the electrostatic sheet can include forming at least a first portion of the electrostatic sheet of an electrically conductive material (e.g., one or more electrodes) and at least a second portion of the electrostatic sheet of a dielectric material. For example, the forming of the electrostatic sheet can include forming the electrostatic sheet to include one or more electrodes sandwiched between two or more dielectric layers. In some aspects, the forming of the electrostatic sheet can include forming, in the electrostatic sheet, apertures configured to receive the burls of the core body. In some aspects, the forming of the electrostatic sheet can include forming the electrostatic sheet to have a stiffness less than a stiffness of the core body and less than a stiffness of the vacuum sheet and a stiffness of the compliant layer. In some aspects, the electrostatic sheet can be configured to connect to the core body using the vacuum assembly such that the apertures of the electrostatic sheet line up with the burls of the core body and the recesses of the vacuum sheet. In some aspects, the forming of the electrostatic sheet can be accomplished using suitable mechanical or other methods and include forming the electrostatic sheet in accordance with any aspect or combination of aspects described with reference to FIGS. 1-16 above.

At operation 1708, the method can include mounting the electrostatic sheet to the vacuum sheet of the vacuum assembly. In some aspects, the mounting of the electrostatic sheet to the vacuum sheet can include applying a vacuum to the vacuum connections of the vacuum assembly to vacuum clamp the electrostatic sheet to the vacuum sheet. In some aspects, where the vacuum sheet includes an electrode layer, the mounting of the electrostatic sheet to the vacuum sheet can include applying a voltage to the electrode layer of the vacuum sheet to electrostatically clamp the electrostatic sheet to the vacuum sheet. In some aspects, the mounting of the electrostatic sheet to the vacuum sheet can be accomplished using suitable mechanical or other methods and include mounting the electrostatic sheet to the vacuum sheet in accordance with any aspect or combination of aspects described with reference to FIGS. 1-16 above.

At operation 1710, the method can include mounting, using the vacuum assembly, the electrostatic sheet to the core body. In some aspects, the mounting of the electrostatic sheet to the core body can include applying a vacuum to the vacuum connections of the vacuum assembly to vacuum clamp the core body to the electrostatic sheet. In some aspects, where the vacuum sheet of the vacuum assembly includes an electrode layer, the mounting of the electrostatic sheet to the core body can include applying a voltage to the electrode layer of the vacuum sheet to electrostatically clamp the core body to the electrostatic sheet. In some aspects, the mounting of the electrostatic sheet to the core body can include applying an adhesive material to one or more portions of the core body, the electrostatic sheet, or a combination thereof, to affix the core body to the electrostatic sheet. In some aspects, the mounting of the electrostatic sheet to the core body can be accomplished using suitable mechanical or other methods and include using the vacuum assembly to mount the electrostatic sheet to the core body in accordance with any aspect or combination of aspects described with reference to FIGS. 1-16 above.

The embodiments may further be described using the following clauses:

1. A substrate table comprising:
    a core body comprising:
        a plurality of burls for supporting an object; and
        a plurality of trenches,
    wherein each burl of the plurality of burls is surrounded by a respective trench of the plurality of trenches.
2. The substrate table of clause 1, wherein at least a portion of the core body is formed of siliconized silicon carbide (SiSiC) or silicon carbide (SiC).
3. The substrate table of clause 1, wherein at least a portion of the plurality of burls are formed of diamond-like carbon (DLC), aluminum nitride (AlN), silicon nitride (SiN), or chromium nitride (CrN).
4. The substrate table of clause 1, wherein at least one burl of the plurality of burls has a stiffness of less than about 10 meganewtons per meter ($10^7$ Nm$^{-1}$).
5. The substrate table of clause 1, wherein:
    the plurality of burls comprises:
        a first burl disposed in a first region of the core body; and
        a second burl disposed in a second region of the core body; and
    a length of the second burl is greater than a length of the first burl.
6. The substrate table of clause 5, wherein:
    the plurality of trenches comprises:
        a first trench surrounding the first burl; and
        a second trench surrounding the second burl; and
    a depth of the first trench is less than a depth of the second trench.
7. The substrate table of clause 5, wherein:
    a stiffness of the second burl is less than a stiffness of the first burl.

8. The substrate table of clause 1, wherein:
   the plurality of burls comprises a first burl; and
   the first burl has:
      a first taper angle towards a top of the first burl; and
      a second taper angle towards a bottom of the first burl.

9. The substrate table of clause 1, wherein the core body is further configured to connect to an electrostatic sheet comprising a plurality of apertures configured to receive the plurality of burls of the core body such that the plurality of burls of the core body line up with the plurality of apertures of the electrostatic sheet.

10. An apparatus comprising:
   a vacuum sheet comprising:
      a plurality of vacuum connections; and
      a plurality of recesses configured to receive a plurality of burls of a core body.

11. The apparatus of clause 10, wherein at least a portion of the vacuum sheet is formed of fused silica.

12. The apparatus of clause 10, wherein a stiffness of the vacuum sheet is less than a stiffness of the core body.

13. The apparatus of clause 10, wherein the vacuum sheet is configured to:
   mount the core body to an electrostatic sheet comprising a plurality of apertures configured to receive the plurality of burls of the core body,
   wherein the plurality of recesses of the vacuum sheet are configured to line up with the plurality of apertures of the electrostatic sheet.

14. The apparatus of clause 13, wherein the vacuum sheet is configured to vacuum clamp the electrostatic sheet to the vacuum sheet in response to an application of a vacuum to the plurality of vacuum connections of the vacuum sheet.

15. The apparatus of clause 13, wherein:
   a stiffness of the vacuum sheet is less than a stiffness of the core body; and
   the stiffness of the vacuum sheet is greater than a stiffness of the electrostatic sheet.

16. The apparatus of clause 13, wherein:
   the vacuum sheet comprises an electrode layer comprising one or more electrodes; and
   the vacuum sheet is configured to electrostatically clamp the electrostatic sheet to the vacuum sheet in response to an application of one or more voltages to one or more of the one or more electrodes in the electrode layer of the vacuum sheet.

17. The apparatus of clause 13, wherein the vacuum sheet comprises a coating disposed on at least a portion of a surface of the vacuum sheet facing the electrostatic sheet.

18. A method for manufacturing an apparatus, comprising:
   forming a vacuum sheet comprising:
      a plurality of vacuum connections; and
      a plurality of recesses configured to receive a plurality of burls of a core body; and
   mounting, using the vacuum sheet, the core body to an electrostatic sheet,
   wherein the electrostatic sheet comprises a plurality of apertures configured to receive the plurality of burls.

19. The method of clause 18, further comprising:
   mounting, using the vacuum sheet, the core body to the electrostatic sheet such that the plurality of apertures of the electrostatic sheet line up with the plurality of recesses of the vacuum sheet and the plurality of the core body.

20. The method of clause 18, wherein:
   the plurality of burls are configured to support an object; and
   at least one burl of the plurality of burls of the core body is surrounded by a trench.

21. A system comprising:
   a vacuum assembly comprising a compliant layer, wherein the compliant layer comprises:
      a plurality of burls configured to support a vacuum sheet; and
      a plurality of vacuum connections.

22. The system of clause 21, wherein at least a portion of the plurality of burls are formed of an elastomeric material.

23. The system of clause 21, wherein at least one burl of the plurality of burls has a stiffness of less than about 10 meganewtons per meter ($10^7$ Nm$^{-1}$).

24. The system of clause 21, wherein:
   the plurality of burls comprises:
      a first subset of burls disposed in a first region of the compliant layer; and
      a second subset of burls disposed in a second region of the compliant layer; and
   a first inter-burl spacing of the first plurality of burls is less than a second inter-burl spacing of the second subset of burls.

25. The system of clause 21, wherein:
   the plurality of burls are a first plurality of burls; and
   a first pattern of the first plurality of burls corresponds to a second pattern of a second plurality of burls disposed on a core body configured to attach to the vacuum sheet.

26. The system of clause 21, wherein:
   the plurality of vacuum connections is a first plurality of vacuum connections;
   the vacuum assembly further comprises a manifold;
   the manifold comprises a second plurality of vacuum connections; and
   the second plurality of vacuum connections are configured to line up with the first plurality of vacuum connections.

27. The system of clause 26, wherein:
   the compliant layer further comprises a first atmospheric pressure connection;
   the manifold further comprises a second atmospheric pressure connection; and
   the second atmospheric pressure connection is configured to line up with the first atmospheric pressure connection.

28. The system of clause 21, wherein:
   the plurality of burls comprises a first burl; and
   the first burl has:
      a first taper angle towards a top of the first burl; and
      a second taper angle towards a bottom of the first burl.

29. The system of clause 21, wherein:
   the compliant layer further comprises a plurality of trenches; and
   each burl of the plurality of burls is surrounded by a respective trench of the plurality of trenches.

30. The system of clause 29, wherein:
   the plurality of burls comprises:
      a first burl disposed in a first region of the compliant layer; and
      a second burl disposed in a second region of the compliant layer; and a first length of the first burl is less than a second length of the second burl.

31. The system of clause 30, wherein:

the plurality of trenches comprises:

a first trench surrounding the first burl; and a second trench surrounding the second burl; and a first depth of the first trench is less than a second depth of the second trench.

32. The system of clause 30, wherein:

a first stiffness of the first burl is less than a second stiffness of the second burl.

33. An apparatus comprising:

a compliant layer comprising:

a plurality of burls configured to support a vacuum sheet, a first plurality of vacuum connections, and a first atmospheric pressure connection; and a manifold configured to be mounted to the compliant layer and comprising:

a second plurality of vacuum connections configured to line up with the first plurality of vacuum connections, and a second atmospheric pressure connection configured to line up with the first atmospheric pressure connection.

34. The apparatus of clause 33, wherein at least a portion of the plurality of burls are formed of an elastomeric material.

35. The apparatus of clause 33, wherein:

the plurality of burls comprises:

a first subset of burls disposed in a first region of the compliant layer; and a second subset of burls disposed in a second region of the compliant layer; and a first inter-burl spacing of the first plurality of burls is less than a second inter-burl spacing of the second subset of burls.

36. The apparatus of clause 33, wherein:

the plurality of burls are a first plurality of burls; and a first pattern of the first plurality of burls corresponds to a second pattern of a second plurality of burls disposed on a core body configured to attach to the vacuum sheet.

37. The apparatus of clause 33, wherein:

the plurality of burls comprises a first burl; and the first burl has:

a first taper angle towards a top of the first burl; and a second taper angle towards a bottom of the first burl.

38. The apparatus of clause 33, wherein:

the compliant layer further comprises a plurality of trenches; and each burl of the plurality of burls is surrounded by a respective trench of the plurality of trenches.

39. A method for manufacturing a vacuum assembly, comprising:

forming a compliant layer comprising:

a plurality of burls configured to support a vacuum sheet, a first plurality of vacuum connections, and a first atmospheric pressure connection;

forming a manifold comprising:

a second plurality of vacuum connections configured to line up with the first plurality of vacuum connections, and a second atmospheric pressure connection configured to line up with the first atmospheric pressure connection; and mounting the compliant layer to the manifold.

40. The method of clause 39, wherein at least one burl of the plurality of burls is surrounded by a trench.

CONCLUSION

Although specific reference may be made in this text to the use of lithographic apparatus in the manufacture of ICs, it should be understood that the lithographic apparatuses described herein can have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself can be patterned and materials added on top of it can also be patterned, or can remain without patterning.

The examples disclosed herein are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

The breadth and scope of the present disclosure should not be limited by any of the above-described example aspects or embodiments, but should be defined only in accordance with the following claims and their equivalents.

The invention claimed is:

1. A substrate table comprising:
a core body comprising:
    a plurality of burls configured to support an object, wherein the plurality of burls comprises:
        a first burl disposed in a first region of the core body; and
        a second burl disposed in a second region of the core body, wherein a length of the second burl is greater than a length of the first burl and wherein a stiffness of the second burl is less than a stiffness of the first burl; and
    a plurality of trenches, wherein the plurality of trenches comprises:
        a first trench surrounding the first burl; and
        a second trench surrounding the second burl, wherein a depth of the first trench is less than a depth of the second trench,
    wherein each burl of the plurality of burls is surrounded by a respective trench of the plurality of trenches.

2. The substrate table of claim 1, wherein:
at least a portion of the core body is formed of siliconized silicon carbide (SiSiC) or silicon carbide (SiC);
at least a portion of the plurality of burls are formed of diamond-like carbon (DLC), aluminum nitride (AMN), silicon nitride (SiN), or chromium nitride (CrN); and/or
at least one burl of the plurality of burls has a stiffness of less than about 10 meganewtons per meter ($10^7$ Nm$^{-1}$).

3. The substrate table of claim 1, wherein:
the first burl has:
    a first taper angle towards a top of the first burl; and
    a second taper angle towards a bottom of the first burl; and/or
the core body is further configured to connect to an electrostatic sheet comprising a plurality of apertures configured to receive the plurality of burls of the core body such that the plurality of burls of the core body line up with the plurality of apertures of the electrostatic sheet.

4. An apparatus comprising:
a vacuum sheet comprising:
    a plurality of vacuum connections; and
    a plurality of recesses configured to receive a plurality of burls of a core body,
    wherein the vacuum sheet is configured to mount the core body to an electrostatic sheet comprising a plurality of apertures configured to receive the plurality of burls of the core body, and
    wherein the plurality of recesses of the vacuum sheet are configured to line up with the plurality of apertures of the electrostatic sheet.

5. The apparatus of claim 4, wherein at least a portion of the vacuum sheet is formed of fused silica and/or wherein a stiffness of the vacuum sheet is less than a stiffness of the core body.

6. The apparatus of claim 4, wherein the vacuum sheet is configured to vacuum clamp the electrostatic sheet to the vacuum sheet in response to an application of a vacuum to the plurality of vacuum connections of the vacuum sheet.

7. The apparatus of claim 4, wherein:
a stiffness of the vacuum sheet is less than a stiffness of the core body;
the stiffness of the vacuum sheet is greater than a stiffness of the electrostatic sheet, and/or
the vacuum sheet comprises a coating disposed on at least a portion of a surface of the vacuum sheet facing the electrostatic sheet.

8. The apparatus of claim 4, wherein:
the vacuum sheet comprises an electrode layer comprising one or more electrodes; and
the vacuum sheet is configured to electrostatically clamp the electrostatic sheet to the vacuum sheet in response to an application of one or more voltages to one or more of the one or more electrodes in the electrode layer of the vacuum sheet.

9. A system comprising:
a core body comprising a plurality of burls configure to support an object;
a vacuum assembly comprising a compliant layer, wherein the compliant layer comprises:
    a plurality of burls configured to support a vacuum sheet; and
    a plurality of vacuum connections; and
an electrostatic sheet,
wherein the electrostatic sheet and the vacuum sheet are located between the core body and the compliant layer.

10. The system of claim 9, wherein:
the plurality of burls of the compliant layer comprises:
    a first subset of burls disposed in a first region of the compliant layer; and
    a second subset of burls disposed in a second region of the compliant layer, wherein a first inter-burl spacing of the first subset of burls is less than a second inter-burl spacing of the second subset of burls.

11. The system of claim 9, wherein:
the plurality of burls of the compliant layer are a first plurality of burls; and
a first pattern of the first plurality of burls corresponds to a second pattern of a second plurality of burls disposed on the core body configured to attach to the vacuum sheet.

12. The system of claim 9, wherein:
the plurality of vacuum connections is a first plurality of vacuum connections;
the vacuum assembly further comprises a manifold;
the manifold comprises a second plurality of vacuum connections; and
the second plurality of vacuum connections are configured to line up with the first plurality of vacuum connections.

13. The system of claim 12, wherein:
the compliant layer further comprises a first atmospheric pressure connection;
the manifold further comprises a second atmospheric pressure connection; and
the second atmospheric pressure connection is configured to line up with the first atmospheric pressure connection.

14. The apparatus of claim 9, wherein:
at least a portion of the vacuum sheet is formed of fused silica, and/or a stiffness of the vacuum sheet is less than a stiffness of the core body.

15. The apparatus of claim 9, wherein the vacuum sheet is configured to vacuum clamp the electrostatic sheet to the vacuum sheet in response to an application of a vacuum to the plurality of vacuum connections of the vacuum sheet.

16. The apparatus of claim 9, wherein:

a stiffness of the vacuum sheet is less than a stiffness of the core body;

the stiffness of the vacuum sheet is greater than a stiffness of the electrostatic sheet, and/or the vacuum sheet comprises a coating disposed on at least a portion of a surface of the vacuum sheet facing the electrostatic sheet.

17. The apparatus of claim 9, wherein:

the vacuum sheet comprises an electrode layer comprising one or more electrodes; and the vacuum sheet is configured to electrostatically clamp the electrostatic sheet to the vacuum sheet in response to an application of one or more voltages to one or more of the one or more electrodes in the electrode layer of the vacuum sheet.

\* \* \* \* \*